United States Patent
Takyu et al.

(10) Patent No.: US 6,777,313 B2
(45) Date of Patent: Aug. 17, 2004

(54) SEMICONDUCTOR DEVICE MANUFACTURING METHOD FOR REINFORCING CHIP BY USE OF SEAL MEMBER AT PICKUP TIME

(75) Inventors: Shinya Takyu, Kitakatsushika-gun (JP); Mika Kiritani, Kawasaki (JP); Tetsuya Kurosawa, Yokohama (JP); Terunari Takano, Higashiusuki-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 10/187,629

(22) Filed: Jul. 3, 2002

(65) Prior Publication Data

US 2003/0017663 A1 Jan. 23, 2003

(30) Foreign Application Priority Data

Jul. 4, 2001 (JP) ......................................... 2001-203647

(51) Int. Cl.⁷ .......................... H01L 21/46; H01L 21/78; H01L 21/301
(52) U.S. Cl. ........................................ 438/464; 438/613
(58) Field of Search ............................ 438/107, 460, 438/464, 611, 612, 613

(56) References Cited

U.S. PATENT DOCUMENTS

| 5,888,883 | A | | 3/1999 | Sasaki et al. |
| 6,063,646 | A | * | 5/2000 | Okuno et al. |
| 6,184,109 | B1 | | 2/2001 | Sasaki et al. |
| 6,294,439 | B1 | | 9/2001 | Sasaki et al. |
| 6,353,267 | B1 | * | 3/2002 | Ohuchi et al. |

FOREIGN PATENT DOCUMENTS

| JP | 7-161764 | 6/1995 |
| JP | 11-40520 | 2/1999 |
| JP | 2000-294519 | 10/2000 |
| JP | 2000-294522 | 10/2000 |

* cited by examiner

Primary Examiner—Phuc T. Dang
(74) Attorney, Agent, or Firm—Finnegan, Henderson, Farabow, Garrett & Dunner, L.L.P.

(57) ABSTRACT

Bumps electrically connected to elements are formed on the main surface of a wafer on which the elements are formed and grooves with depths which do not reach the back surface of the wafer are formed in the wafer on the main surface side thereof along dicing lines or chip dividing lines of the wafer. The bump forming surface of the wafer is coated with a seal member and a back side grinding process for the wafer is performed to make the wafer thin, and at the same time, divide the wafer into individual chips. One of the chips which are discretely divided by performing the back side grinding process is picked up, the bumps of the picked-up chip are bonded and mounted to and on a base board, and at the same time, the seal member is melted for sealing.

30 Claims, 50 Drawing Sheets

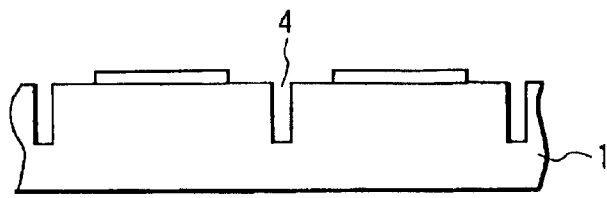
FIG. 17A
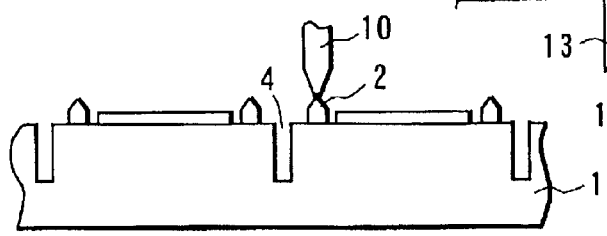
FIG. 17B
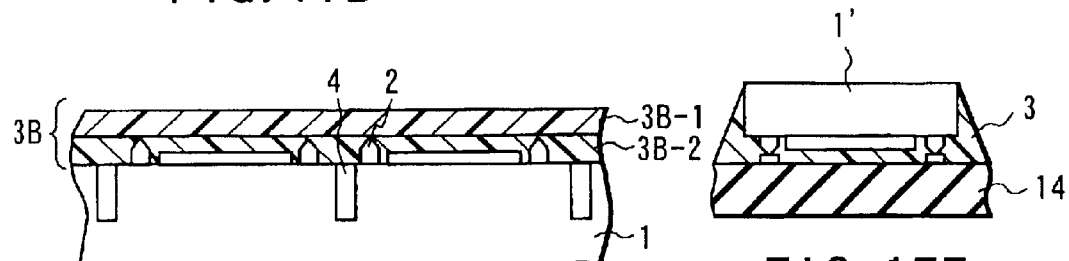
FIG. 17C
FIG. 17E
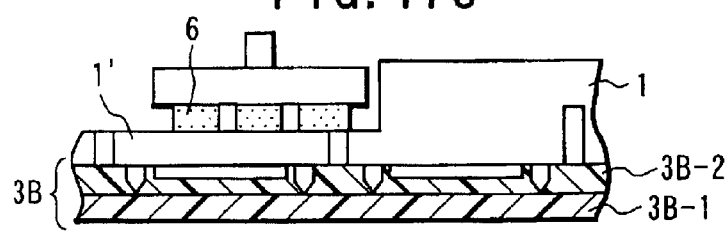
FIG. 17D
FIG. 17F
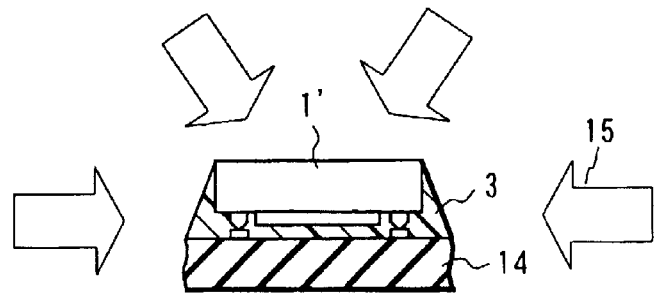
FIG. 17G

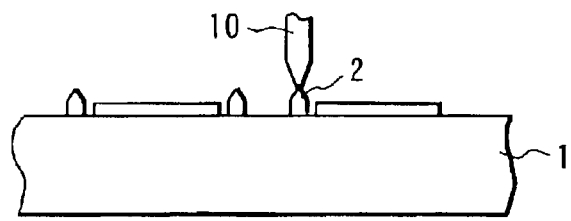
FIG. 19A
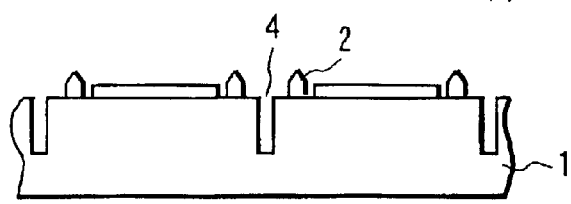
FIG. 19B
FIG. 19C
FIG. 19D
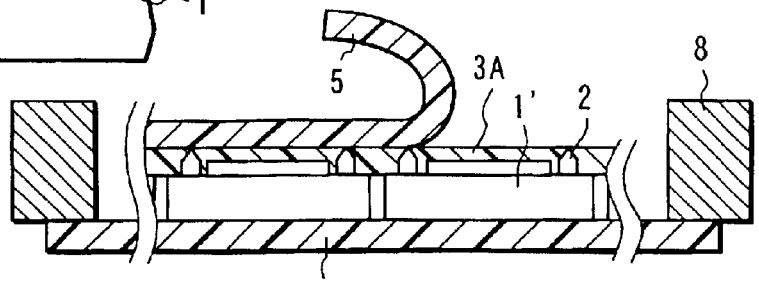
FIG. 19F
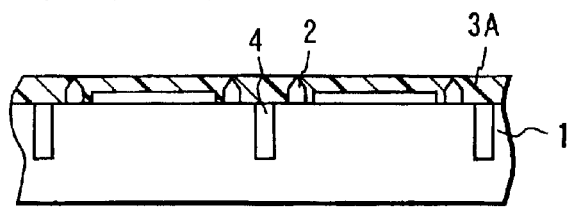
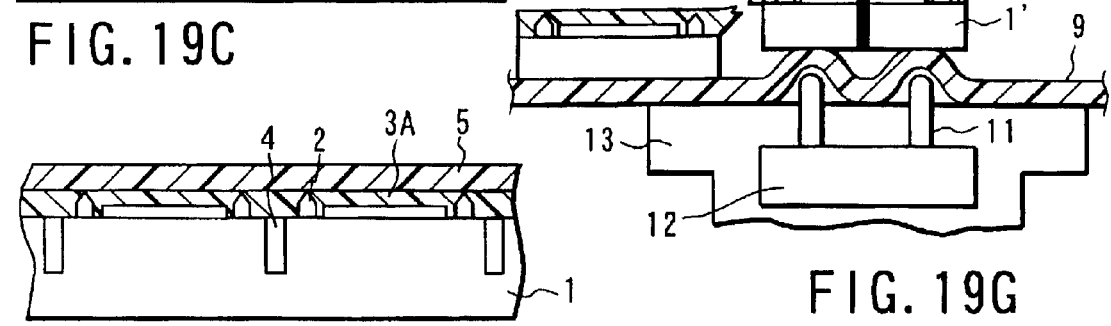
FIG. 19G
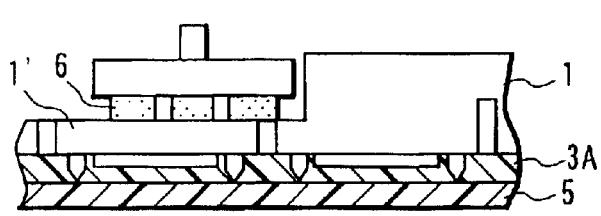
FIG. 19E
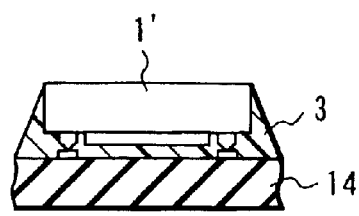
FIG. 19H

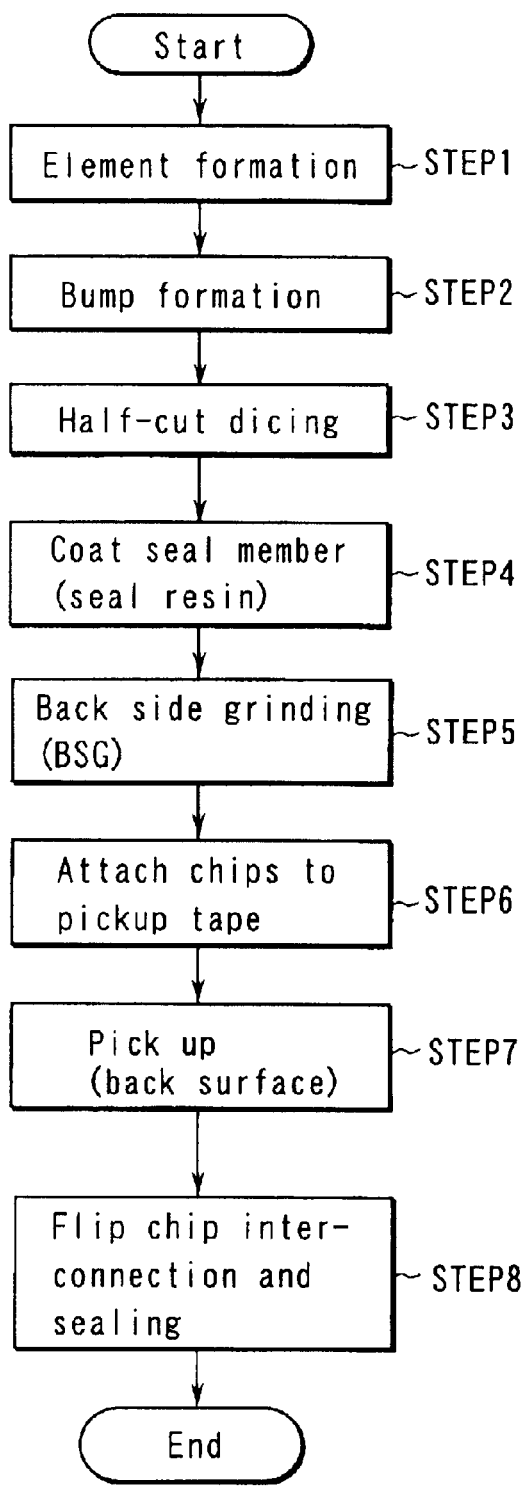
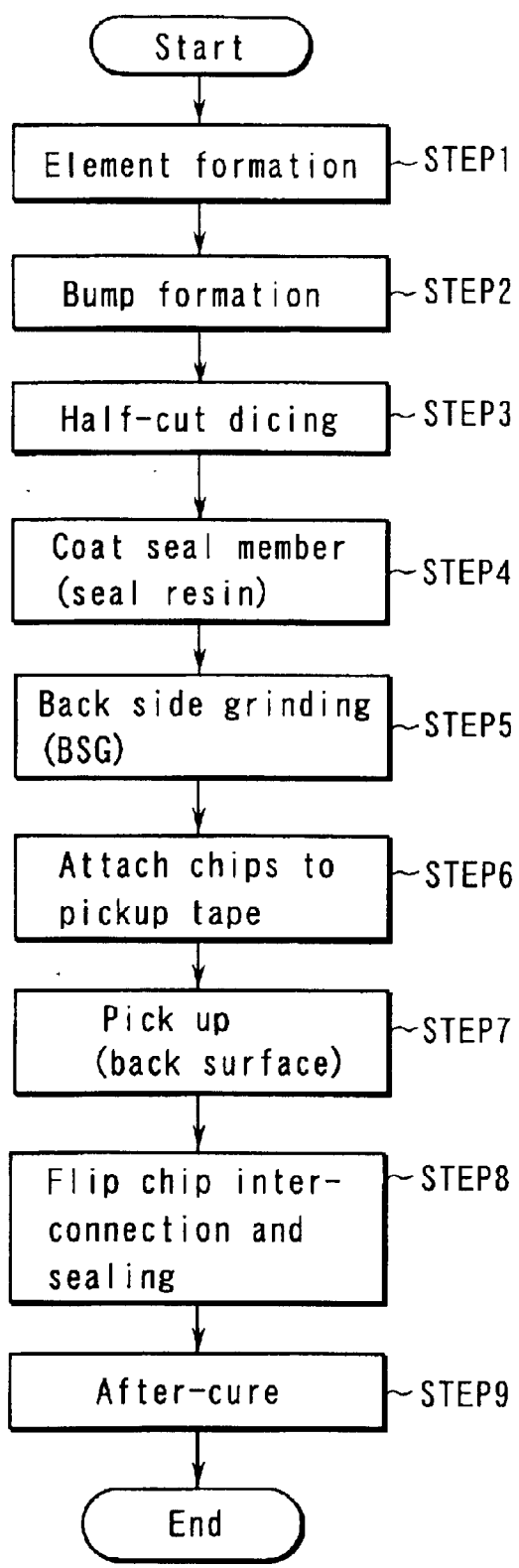
FIG. 24
FIG. 26

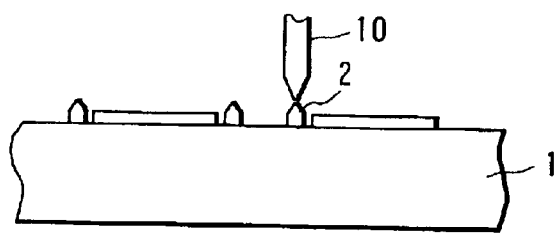
FIG. 35A
FIG. 35B
FIG. 35C
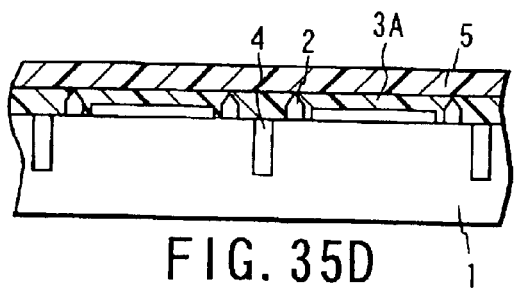
FIG. 35D
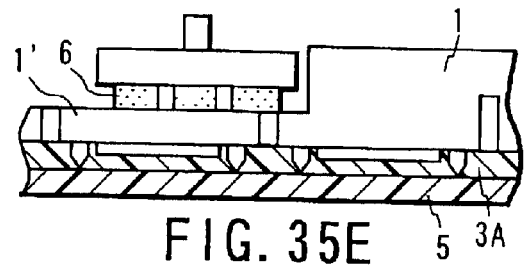
FIG. 35E
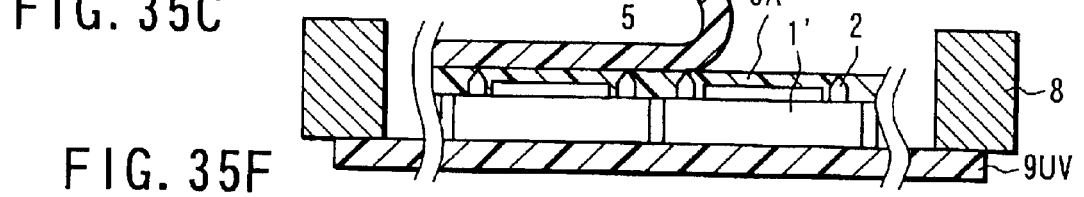
FIG. 35F
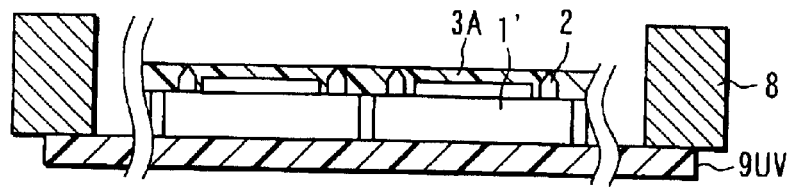
FIG. 35G
UV application
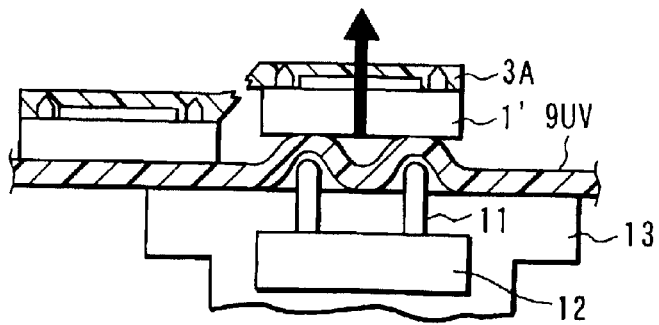
FIG. 35H
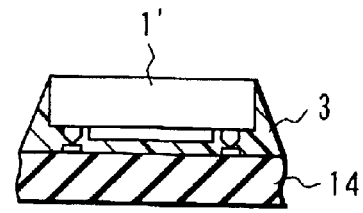
FIG. 35I UV application

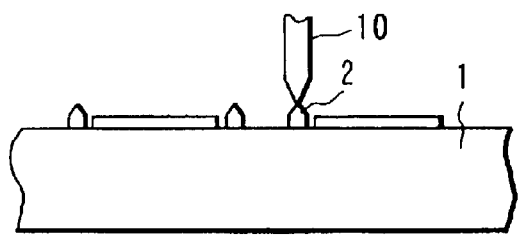
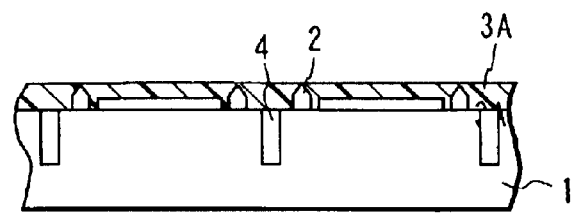
FIG. 39A    FIG. 39C
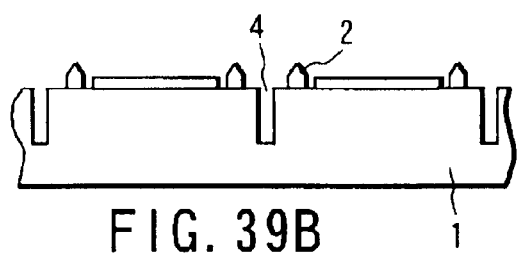
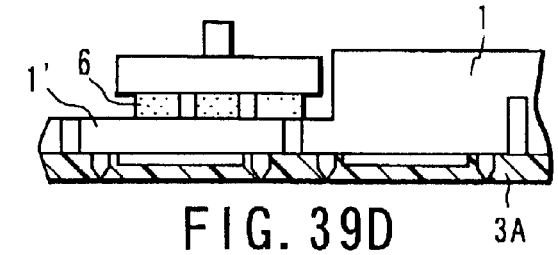
FIG. 39B    FIG. 39D
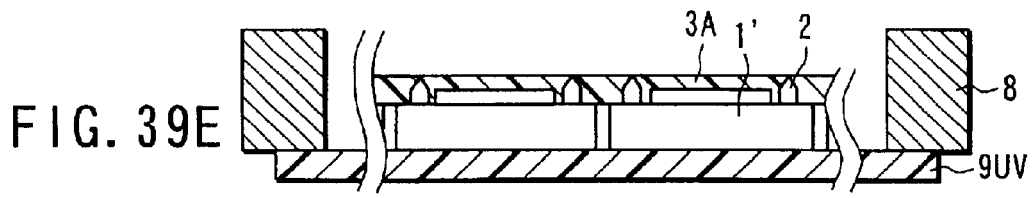
FIG. 39E
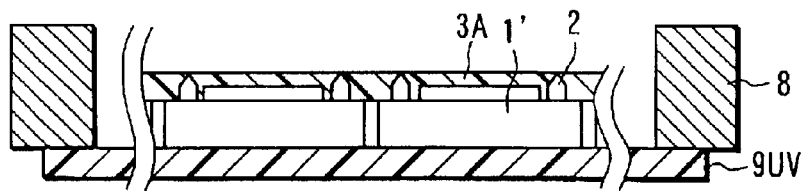
FIG. 39F
16 — UV application
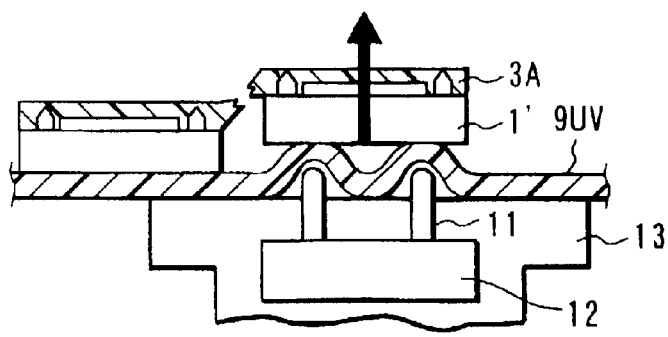
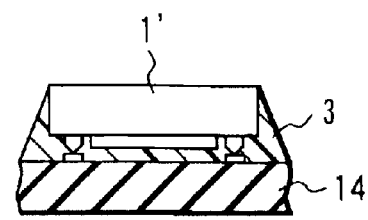
FIG. 39G    FIG. 39H

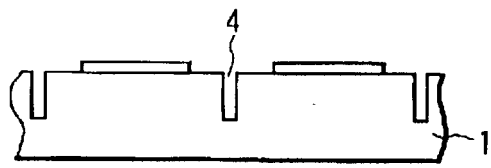
FIG. 45A
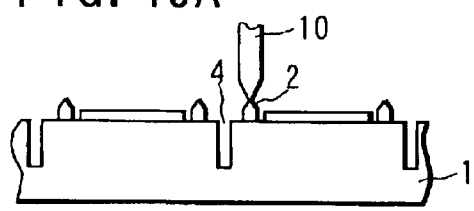
FIG. 45B
FIG. 45C
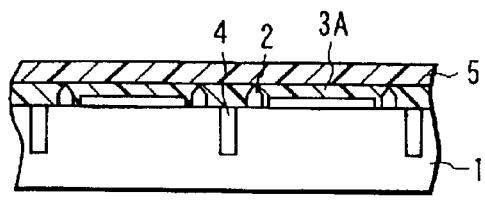
FIG. 45D
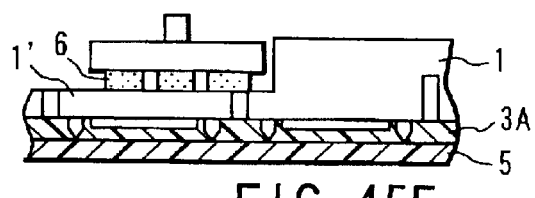
FIG. 45E
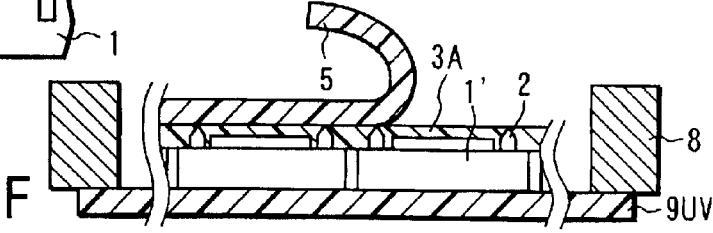
FIG. 45F
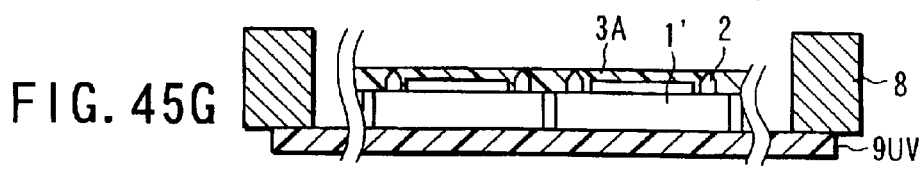
FIG. 45G
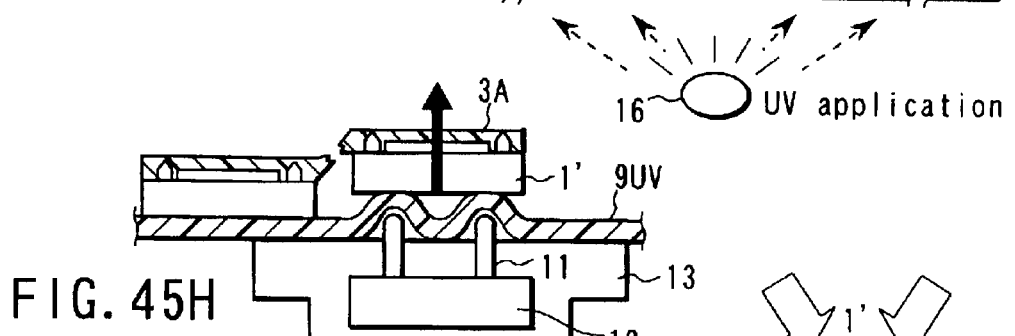
FIG. 45H
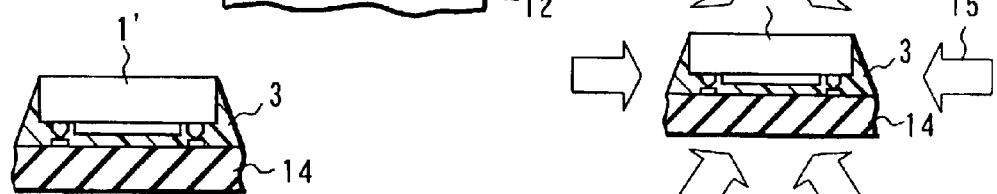
FIG. 45I
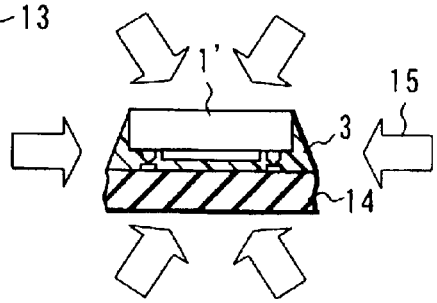
FIG. 45J 16 UV application 16 UV application

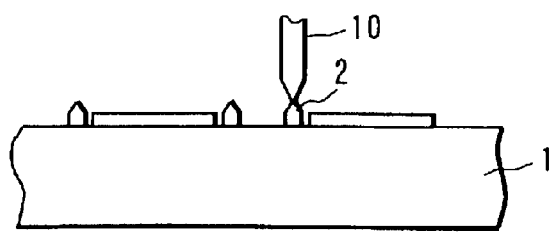
FIG. 53A
FIG. 53B
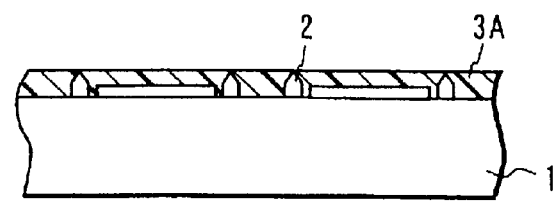
FIG. 53C
FIG. 53D
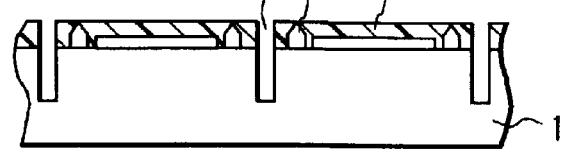
FIG. 53E
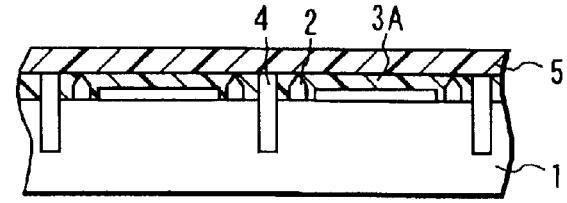
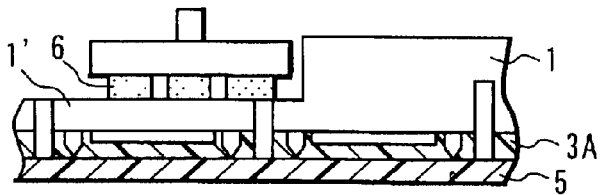
FIG. 53F
FIG. 53G
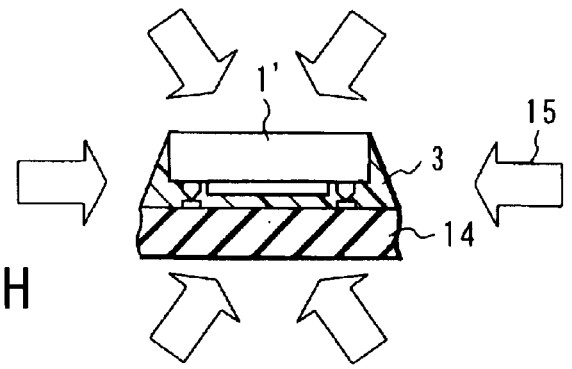
FIG. 53H

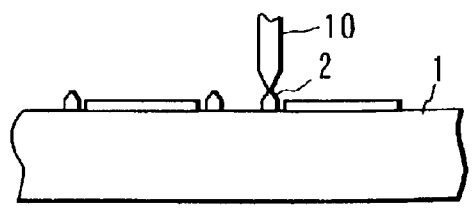
FIG. 57A
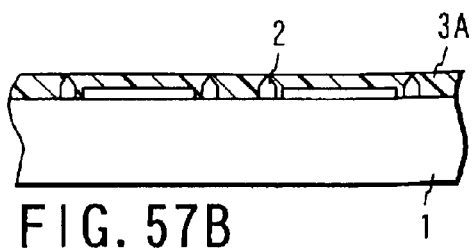
FIG. 57B
FIG. 57C
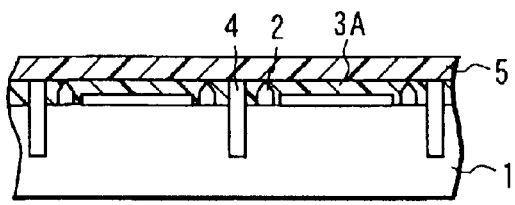
FIG. 57D
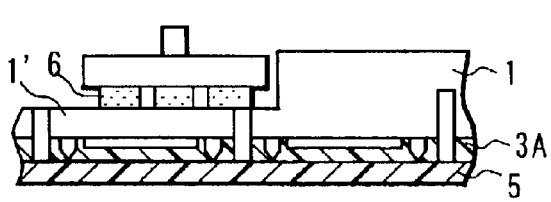
FIG. 57E
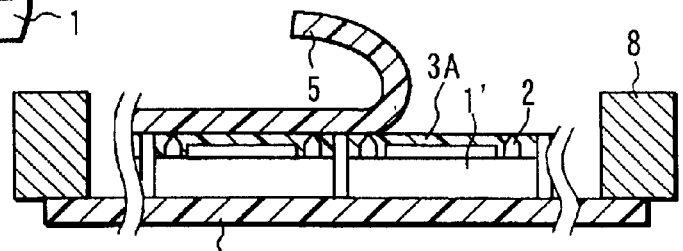
FIG. 57F
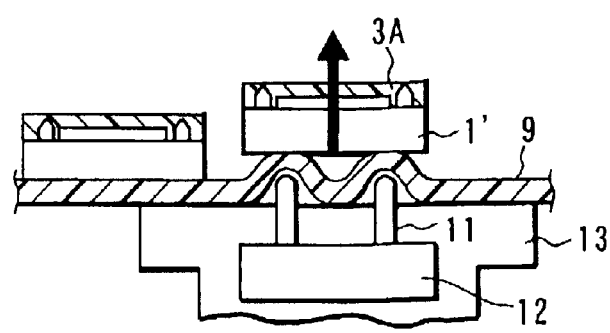
FIG. 57G
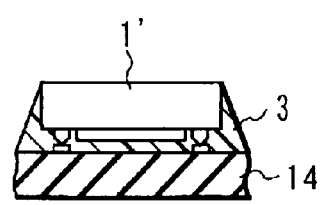
FIG. 57H
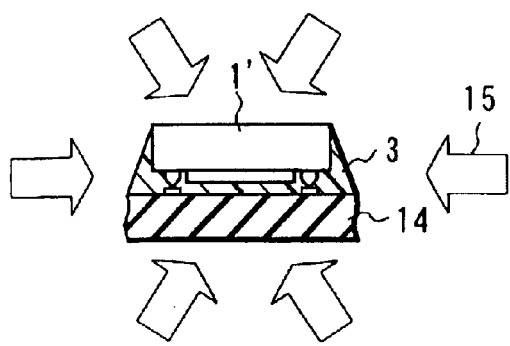
FIG. 57I

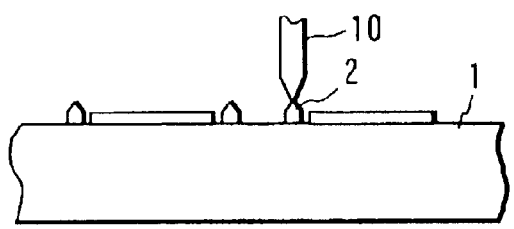
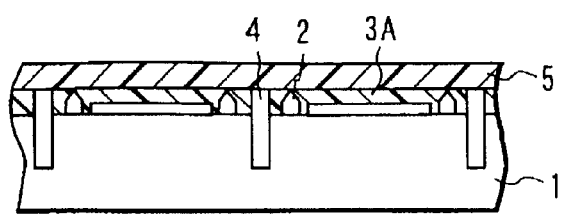
FIG. 59A  FIG. 59D
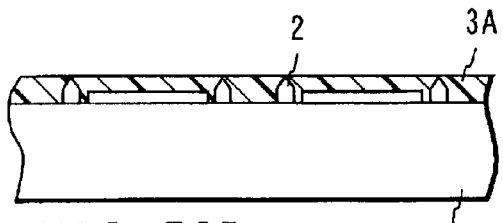
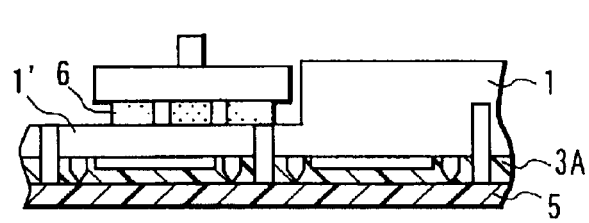
FIG. 59B  FIG. 59E
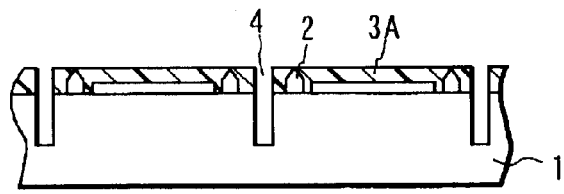
FIG. 59C
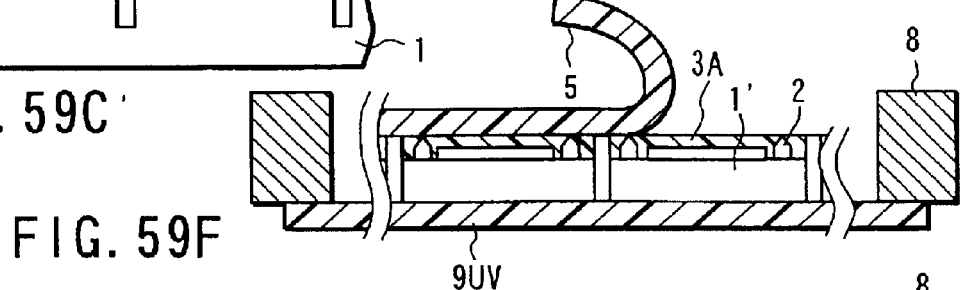
FIG. 59F
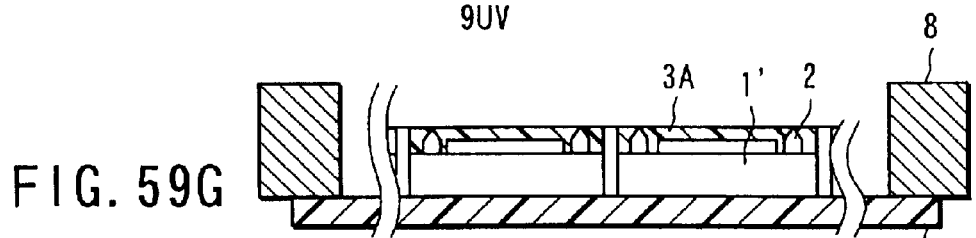
FIG. 59G
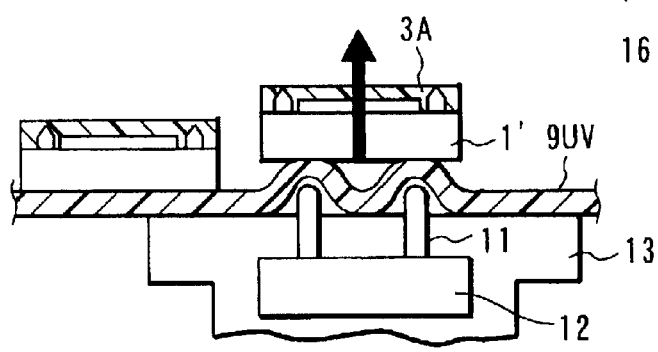
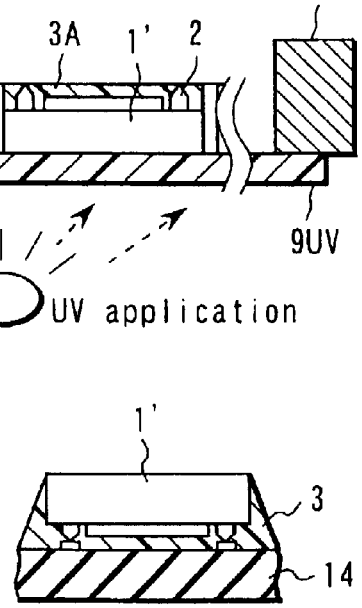
FIG. 59H  FIG. 59I

SEMICONDUCTOR DEVICE MANUFACTURING METHOD FOR REINFORCING CHIP BY USE OF SEAL MEMBER AT PICKUP TIME

CROSS-REFERENCE TO RELATED APPLICATIONS

This application is based upon and claims the benefit of priority from the prior Japanese Patent Application No. 2001-203647, filed Jul. 4, 2001, the entire contents of which are incorporated herein by reference.

BACKGROUND OF THE INVENTION

1. Field of the Invention

This invention relates to a semiconductor device manufacturing method and more particularly to a step of dividing a wafer on which elements have been formed into discrete chips, picking up and mounting each chip.

2. Description of the Related Art

Conventionally, a semiconductor device is formed by a manufacturing process as shown in the flowchart shown in FIG. 1, for example. First, elements are formed on a semiconductor substrate (wafer) by use of a known manufacturing process (STEP1). Then, bumps which are electrically connected to the elements are formed on the main surface of the wafer having the elements formed thereon (STEP2). A back side grinding tape (BSG tape) is attached to the back surface of the wafer (STEP3) and a back side grinding process is performed to make the wafer thin (STEP4). After this, a dicing tape is attached to the element forming surface of the wafer which is made thin (STEP5) and the wafer is diced (full-cut dicing) from the back surface side thereof by use of a diamond blade or laser blade and divided into a discrete form (STEP6). Next, the back surface of one of the chips obtained by dividing the wafer in a discrete from is picked up by use of a suction tool which is called a collet (STEP7), seal resin is attached to a base board, then the chip is attached to the base board having the seal resin attached thereto (STEP8) and the flip chip interconnection process and sealing process are performed to mount the chip (STEP9).

However, in the above manufacturing method, the following problems (a) to (c) occur.

(a) Since the back side grinding process is performed after the bumps are formed, the wafer may be broken with the bump as the starting point and the manufacturing yield is lowered. Therefore, it becomes essential to limit the height of the bump and if a chip using high bumps such as ball bumps or stud bumps is used, the wafer cannot be made thin.

(b) Since it is necessary to perform the two steps of attaching the seal resin to the base board and attaching the chip to the base board (with the seal resin), the positional deviation of the attachment will become large.

(c) In order to avoid the above positional deviation, it is necessary to make the size of the seal resin larger than the chip size. However, if the size of the seal resin is made larger than the chip size, extra seal resin lying in the peripheral portion of the chip creeps on the back surface of the chip at the time of flip chip interconnection in some cases. In order to suppress the above phenomenon, it is necessary to cover the back surface of the chip with a Teflon sheet or the like at the time of flip chip interconnection, raising the manufacturing cost.

In order to solve the above problem (a), as shown in the flowchart of FIG. 2, a manufacturing method in which bumps are formed (STEP7: formation of stud bumps) after the wafer is divided into discrete chips (STEPS: full-cut dicing and STEP6: pickup) is proposed. In this case, however, since it is necessary to form the stud bumps for each chip, the manufacturing process is complicated in comparison with a manufacturing method in which the bumps are formed in the wafer state and a rise in the manufacturing cost cannot be avoided.

As described above, the conventional semiconductor device manufacturing method has the problem that when the back surface thereof is ground, the wafer tends to break at the position of the bump, which lowers manufacturing yield.

Further, if a chip using the high bumps such as the ball bumps or stud bumps is used, there occurs a problem that the wafer cannot be made thin.

The two steps of attaching the seal resin to the base board and attaching the chip to the base board (with the seal resin) are required and there occurs a problem that the mounting accuracy will be lowered due to the positional deviation of the attachment.

In addition, if an attempt is made to prevent the seal resin from creeping on the back surface of the chip, there occurs a problem that a Teflon sheet or the like is required and the manufacturing cost becomes high.

Further, the manufacturing method in which bumps are formed after the wafer is divided into discrete chips has a problem that the manufacturing process becomes complicated and the manufacturing cost is raised.

BRIEF SUMMARY OF THE INVENTION

According to an aspect of the present invention, there is provided a semiconductor device manufacturing method comprising forming bumps electrically connected to elements on a main surface of a wafer on which the elements are formed, forming grooves with depths which do not reach the back surface of the wafer in the wafer on the main surface side thereof along dicing lines or chip dividing lines of the wafer, coating a bump forming surface side of the wafer with a seal member, performing a back side grinding process for the wafer to make the wafer thin, and at the same time, divide the wafer into individual chips, picking up one of the chips which are discretely divided by performing the back side grinding process, and heating and melting the bumps of the picked-up chip to bond and mount the chip to and on a base board, and at the same time, melting the seal member for sealing.

According to another aspect of the present invention, there is provided a semiconductor device manufacturing method comprising forming grooves with depths which do not reach a back surface of a wafer on which elements are formed in the wafer on a main surface side thereof along dicing lines or chip dividing lines of the wafer, forming bumps electrically connected to the elements on a main surface of the wafer, coating a bump forming surface side of the wafer with a seal member, performing a back side grinding process for the wafer to make the wafer thin, and at the same time, divide the wafer into individual chips, picking up one of the chips which are discretely divided by performing the back side grinding process, and heating and melting the bumps of the picked-up chip to bond and mount the chip to and on a base board, and at the same time, melting the seal member for sealing.

According to still another aspect of the present invention, there is provided a semiconductor device manufacturing method comprising forming bumps electrically connected to elements on a main surface of a wafer on which the elements are formed, coating a bump forming surface side of the wafer with a seal member, cutting the seal member and forming grooves with depths which do not reach the back surface of the wafer in the wafer along dicing lines or chip dividing lines thereof, performing a back side grinding process for the wafer to make the wafer thin, and at the same time, divide the wafer into individual chips, picking up one of the chips which are discretely divided by performing the back side grinding process, and heating and melting the bumps of the picked-up chip to bond and mount the chip to and on a base board, and at the same time, melting the seal member for sealing.

BRIEF DESCRIPTION OF THE SEVERAL VIEWS OF THE DRAWING

FIGS. 17A to 17G are cross sectional views sequentially showing the manufacturing steps, for illustrating a semiconductor device manufacturing method according to an eighth embodiment of this invention, FIGS. 19A to 19H are cross sectional views sequentially showing the manufacturing steps, for illustrating a semiconductor device manufacturing method according to a ninth embodiment of this invention, FIG. 24 is a flowchart for illustrating a semiconductor device manufacturing method according to the eleventh embodiment of this invention, FIG. 26 is a flowchart for illustrating a semiconductor device manufacturing method according to the twelfth embodiment of this invention, FIGS. 35A to 35I are cross sectional views sequentially showing the manufacturing steps, for illustrating a semiconductor device manufacturing method according to a seventeenth embodiment of this invention, FIGS. 39A to 39H are cross sectional views sequentially showing the manufacturing steps, for illustrating a semiconductor device manufacturing method according to a nineteenth embodiment of this invention, FIGS. 45A to 45J are cross sectional views sequentially showing the manufacturing steps, for illustrating a semiconductor device manufacturing method according to a twenty-second embodiment of this invention, FIGS. 53A to 53H are cross sectional views sequentially showing the manufacturing steps, for illustrating a semiconductor device manufacturing method according to a twenty-sixth embodiment of this invention, FIGS. 57A to 57I are cross sectional views sequentially showing the manufacturing steps, for illustrating a semiconductor device manufacturing method according to a twenty-eighth embodiment of this invention, FIGS. 59A to 59I are cross sectional views sequentially showing the manufacturing steps, for illustrating a semiconductor device manufacturing method according to a twenty-ninth embodiment of this invention.

DETAILED DESCRIPTION OF THE INVENTION

[First Embodiment]

Figure 1:
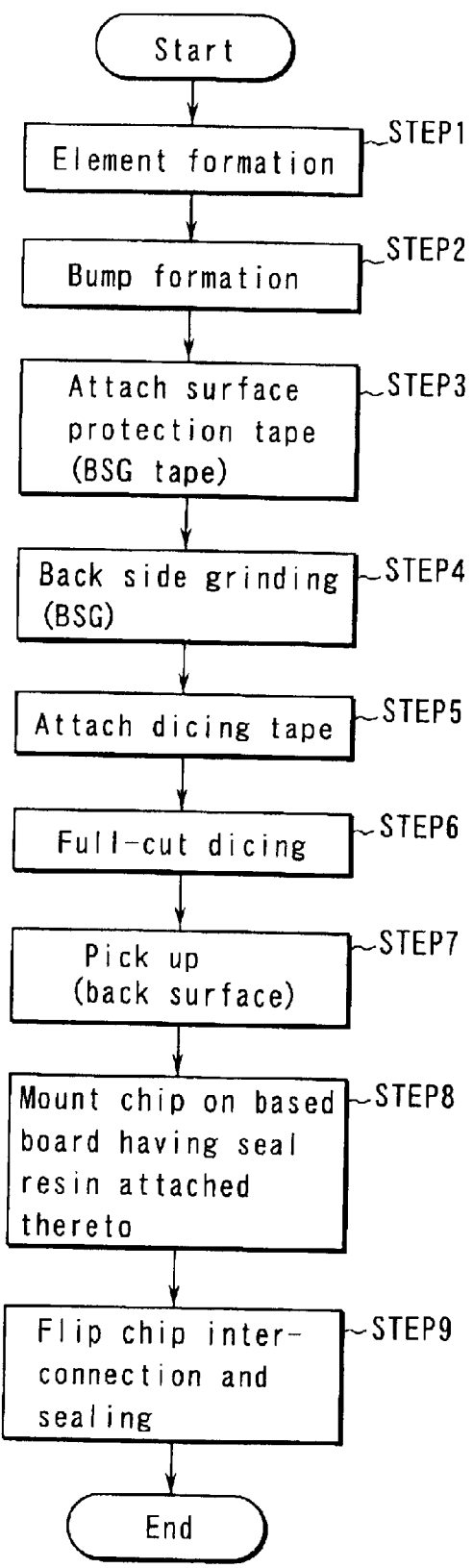
FIG. 1 is a flowchart for illustrating a conventional semiconductor device manufacturing method.
Figure 2:
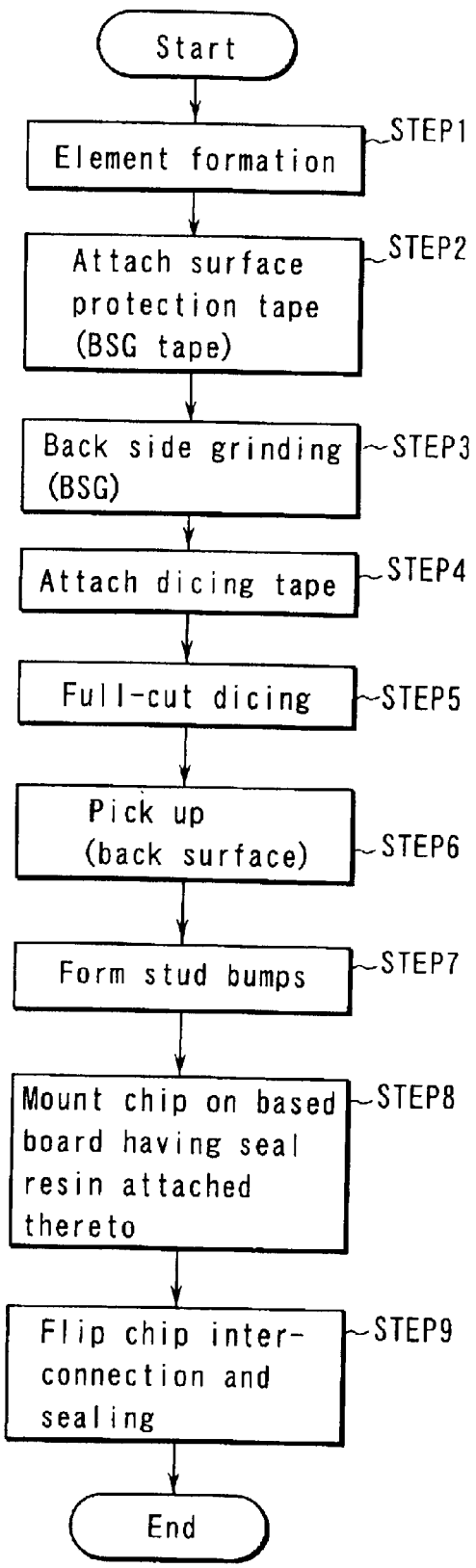
FIG. 2 is a flowchart for illustrating another conventional semiconductor device manufacturing method.
Figure 3A:
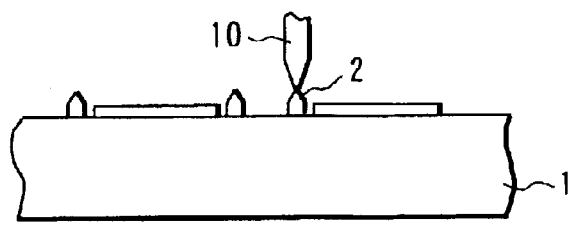
FIGS. 3A to 3G are cross sectional views sequentially showing the manufacturing steps, for illustrating a semiconductor device manufacturing method according to a first embodiment of this invention.
Figure 3B:
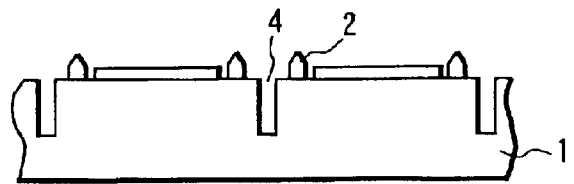
Figure 3C:
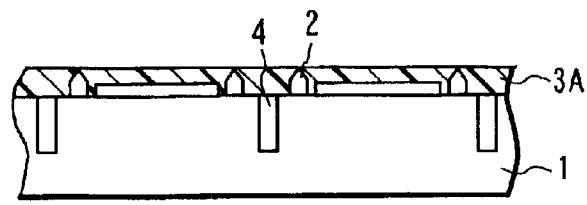
Figure 3D:
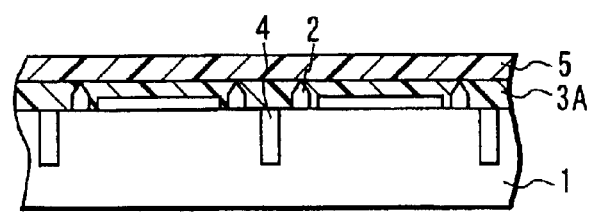
Figure 3E:
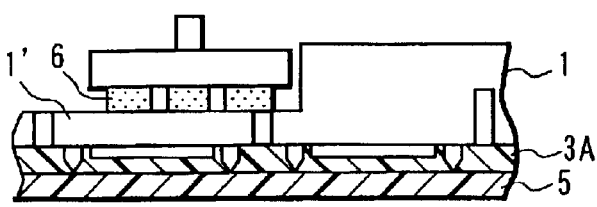
Figure 3F:
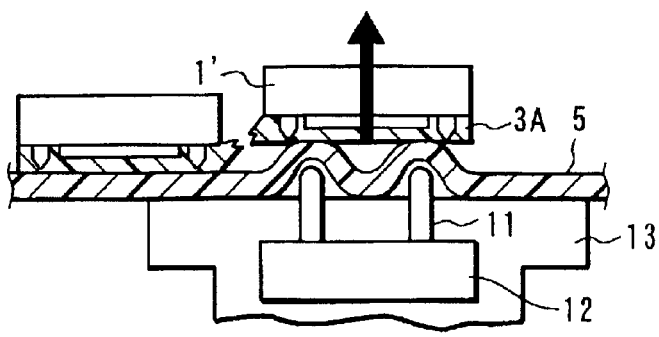
Figure 3G:
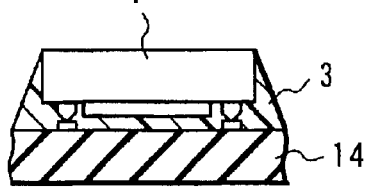
Figure 4:
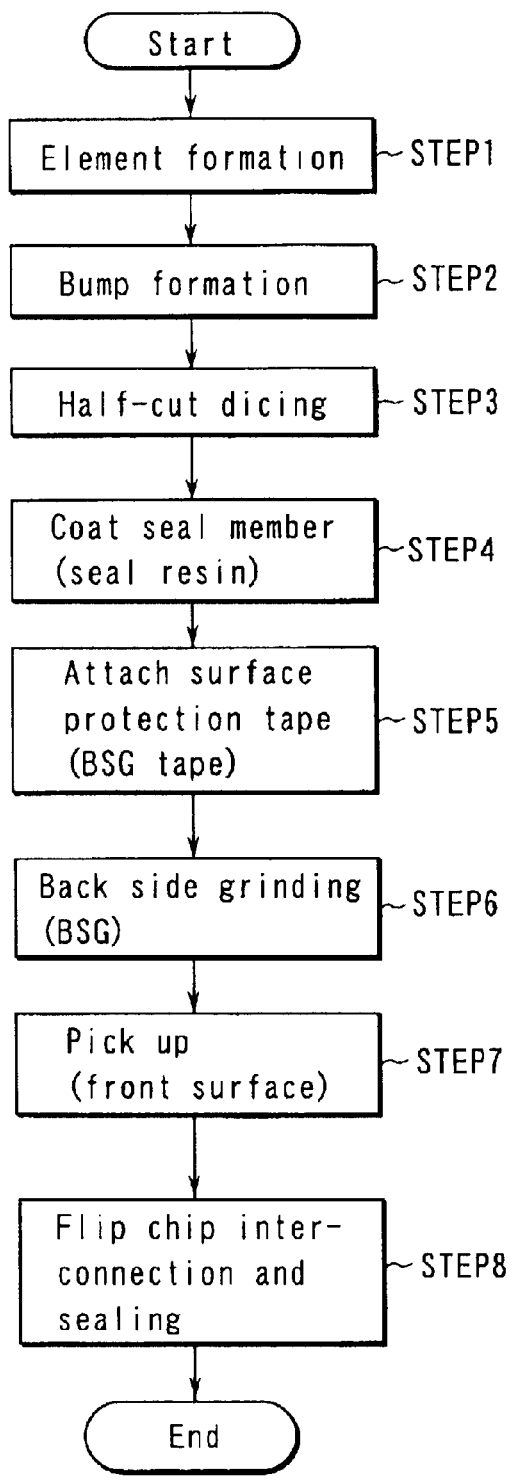
FIG. 4 is a flowchart for illustrating a semiconductor device manufacturing method according to the first embodiment of this invention.

FIGS. 3A to 3G and FIG. 4 illustrate a semiconductor device manufacturing method according to a twenty-ninth embodiment of this invention, FIGS. 3A to 3G being cross sectional views which sequentially show the manufacturing steps and FIG. 4 being a flowchart for illustrating the semiconductor device manufacturing method.

First, various elements are formed on a semiconductor substrate (wafer) by a known process (STEP1).

Next, as shown in FIG. 3A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 3B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Next, as shown in FIG. 3C, the element forming surface side of the wafer 1 is coated with a seal member 3A by, for example, spin-coating liquid resin such as epoxy-series resin or silica-containing resin so as to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 3D, a surface protection tape (BSG tape) 5 is attached to the seal member 3A (STEP5) and, as shown in FIG. 3E, a back side grinding process (STEP6) of the wafer 1 is performed by use of a grinder 6 to make the wafer 1 thin, and at the same time, divide the wafer into discrete chips 1' (dicing before grinding).

After the end of grinding, the discretely divided chips 1' are mounted on a fixed table of a pickup device and the fixed table is moved in an XY direction so as to set a pickup tool to correspond to one of the chips 1' to be picked up. Then, as shown in FIG. 3F, a vacuum is drawn on the inside of a backup holder 13 of the pickup device to attract and fix the surface protection tape 5 to and on the upper surface of the backup holder 13. In this state, a pin holder 12 having thrust pins 11 mounted thereon is raised so as to cause the thrust pins 11 to project from the upper surface of the backup holder 13. As a result, the chip 1' is pushed up from the seal member 3A side in a direction indicated by an arrow with the surface protection tape 5 disposed between the thrust pins and the seal member so that the corner portions of the chip 1' will be separated from the surface protection tape 5. Then, the chip 1' is picked up by attracting and separating the back surface side of the chip 1' by use of a suction tool which is called a collet (STEP7). At this time, the seal member 3A is pulled off and cut off at a portion corresponding to the groove 4.

After this, as shown in FIG. 3G, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the operation of mounting the chip 1' on the base board 14 and the resin-sealing operation are performed at the same time (STEP8).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. Conventionally, if high bumps such as ball bumps or stud bumps are used, a difference in level due to projections of the bumps cannot be compensated for by use of the surface protection tape 5 used for back side grinding and there is a possibility that the wafer 1 is broken. However, if the seal member is formed by spin-coating liquid resin, a difference in level due to projections of the bumps 2 can be compensated for irrespective of the height of the bumps and high bumps such as ball bumps or stud bumps can be used. Also, when sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion thereof corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Second Embodiment]

Figure 6:
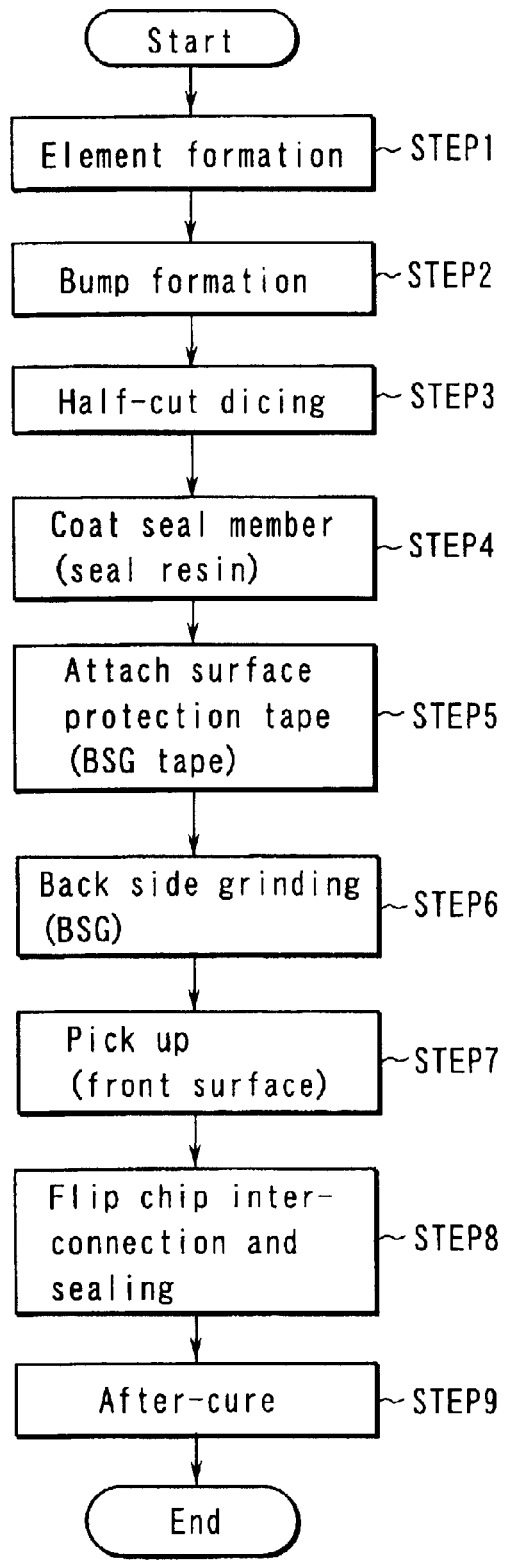
FIG. 6 is a flowchart for illustrating a semiconductor device manufacturing method according to the second embodiment of this invention.

FIGS. 5A to 5H and FIG. 6 illustrate a semiconductor device manufacturing method according to a second embodiment of this invention, FIGS. 5A to 5H being cross sectional views which sequentially show the manufacturing steps and FIG. 6 being a flowchart thereof.

Figure 5A:
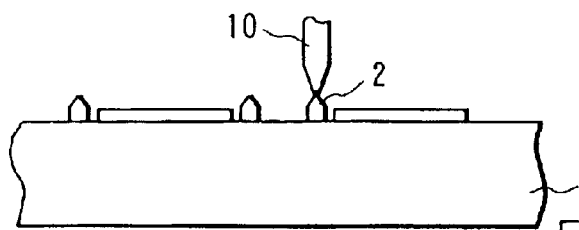
FIGS. 5A to 5H are cross sectional views sequentially showing the manufacturing steps, for illustrating a semiconductor device manufacturing method according to a second embodiment of this invention.
Figure 5F:
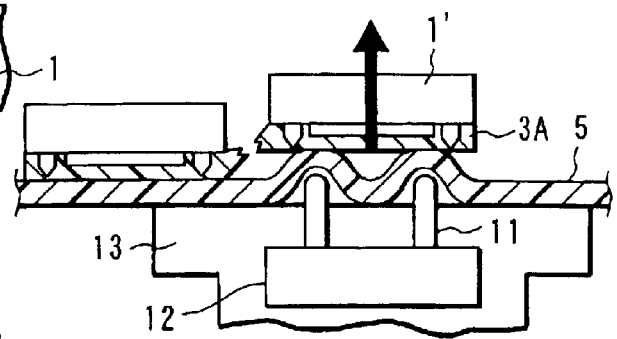
Figure 5B:
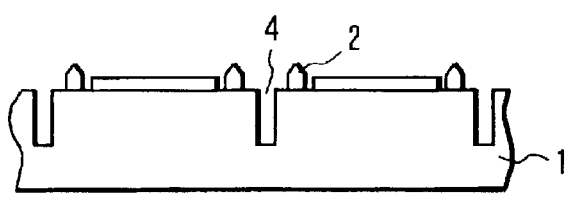
Figure 5C:
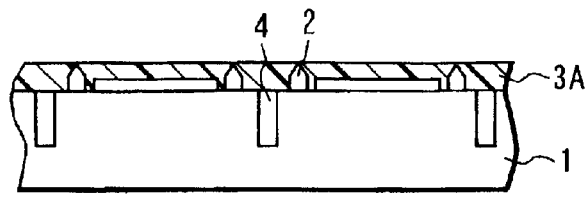
Figure 5G:
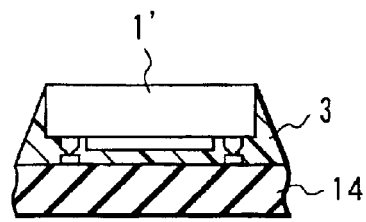
Figure 5D:
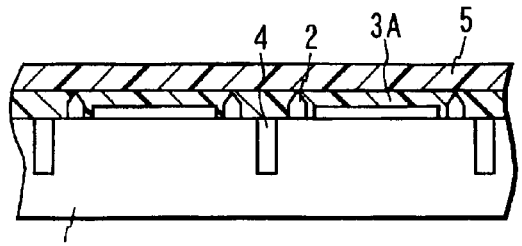
Figure 5H:
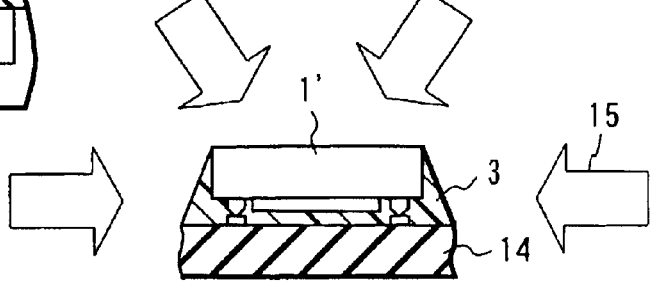
Figure 5E:
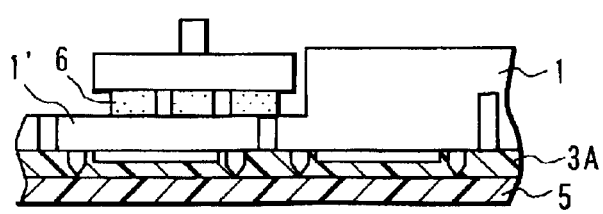

The second embodiment is similar to the first embodiment except that an after-cure step (indicated by an arrow 15) is performed to cure the seal resin 3 (STEP9) as shown in FIG. 5H after the operation of mounting the chip 1' on the board 14 and the resin-sealing operation are simultaneously performed in the step (STEP8) shown in FIG. 5G.

Since the other steps are the same as those of the first embodiment, the same symbols are attached to like portions and the detail explanation thereof is omitted.

With the above manufacturing method, substantially the same operation and effect as those of the first embodiment can be attained.

[Third Embodiment]

Figure 7A:
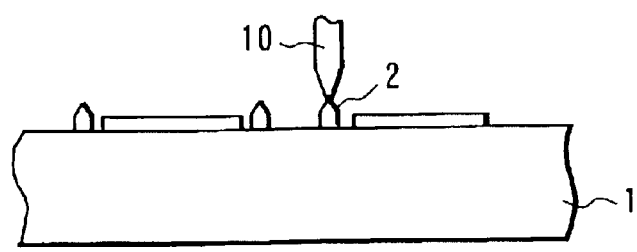
FIGS. 7A to 7F are cross sectional views sequentially showing the manufacturing steps, for illustrating a semiconductor device manufacturing method according to a third embodiment of this invention.
Figure 7B:
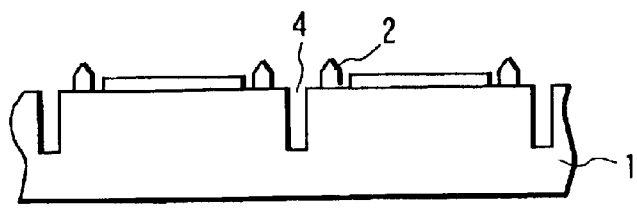
Figure 7C:
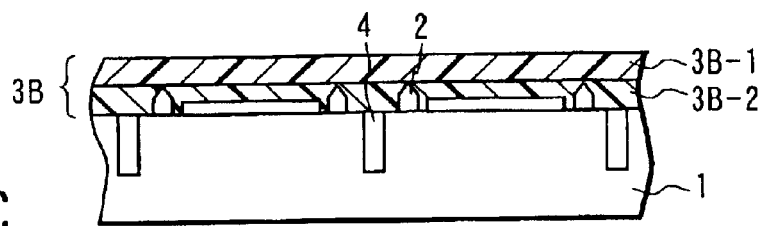
Figure 7D:
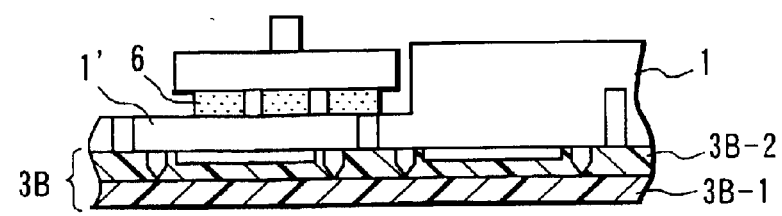
Figure 7E:
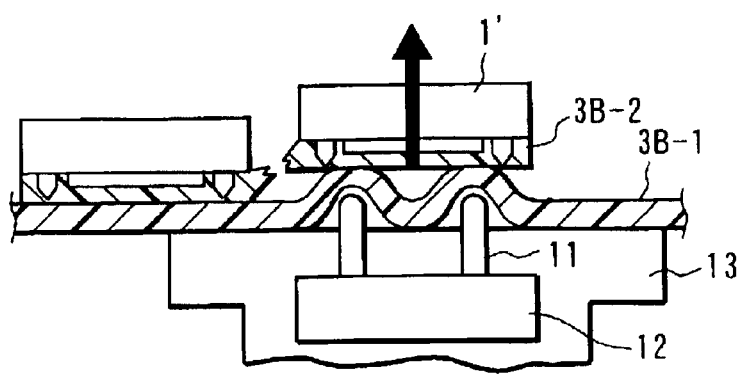
Figure 7F:
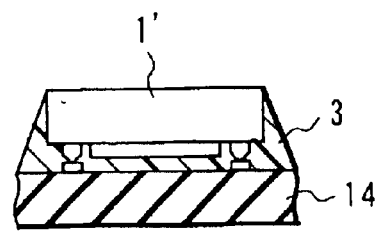
Figure 8:
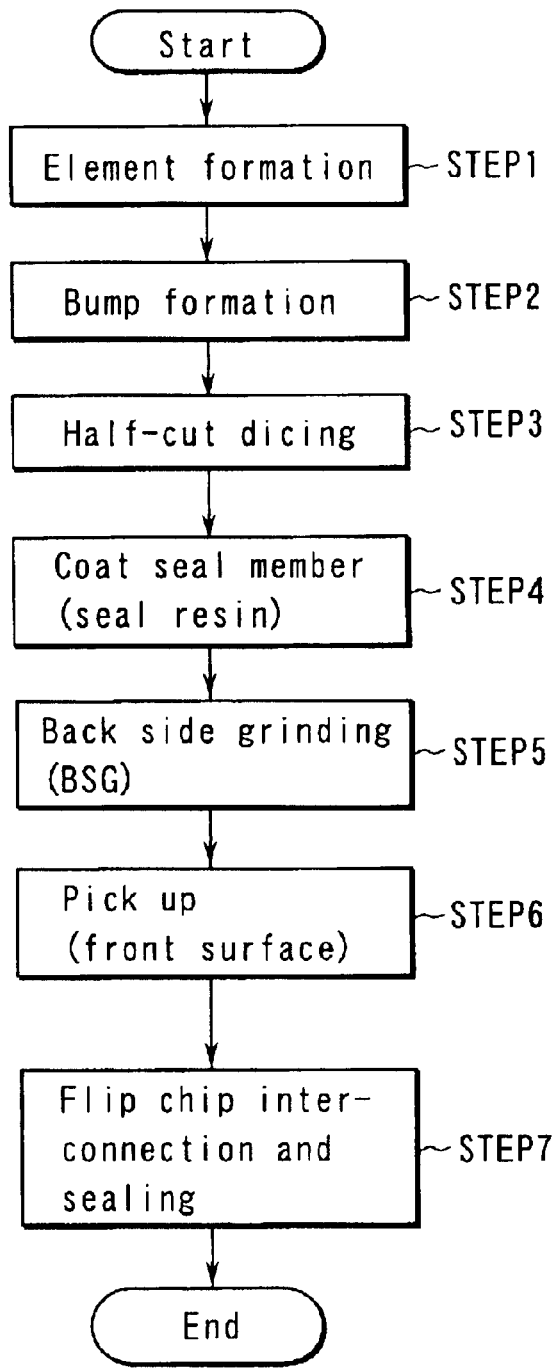
FIG. 8 is a flowchart for illustrating a semiconductor device manufacturing method according to the third embodiment of this invention.

FIGS. 7A to 7F and FIG. 8 illustrate a semiconductor device manufacturing method according to a third embodiment of this invention, FIGS. 7A to 7F being cross sectional views which sequentially show the manufacturing steps and FIG. 8 being a flowchart thereof.

First, various elements are formed on a semiconductor substrate (wafer) by a known process (STEP1).

Next, as shown in FIG. 7A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 7B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Next, as shown in FIG. 7C, the element forming surface side of the wafer 1 is coated with a seal member 3B by attaching sheet-form resin thereto so as to bury the bumps 2 therein (STEP4). For example, the seal member 3B is formed of a sheet-form base member 3B-1 and a seal resin layer 3B-2 formed of, for example, epoxy-series resin or silica-containing resin which is formed on the surface of the base member 3B-1 and the seal resin layer 3B-2 is adhered to the element forming surface of the wafer 1. It is preferable that the seal resin layer 3B-2 is melted at temperatures of approximately 100° C. to 130° C.

After this, as shown in FIG. 7D, a back side grinding process (STEP5) of the wafer 1 is performed by use of a grinder 6 to make the wafer 1 thin, and at the same time, divide the wafer into discrete chips 1' (dicing before grinding).

After the end of grinding, the discretely divided chips 1' are mounted on a fixed table of a pickup device and the fixed table is moved in an XY direction so as to set a pickup tool to correspond to one of the chips 1' to be picked up. Then, as shown in FIG. 7E, a pin holder 12 having thrust pins 11 mounted thereon is raised so as to cause the thrust pins 11 to project from the upper surface of a backup holder 13 while a vacuum is being drawn on the inside of the backup holder 13 of the pickup device. As a result, the chip 1' is pushed up from the seal member 3B side in a direction indicated by an arrow. Then, the chip 1' is picked up by attracting and separating the back surface side thereof by use of a suction tool which is called a collet (STEP6). At this time, the seal resin layer 3B-2 is separated from the base member 3B-1 and left behind on the element forming surface of the chip 1'.

After this, as shown in FIG. 7F, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal resin layer 3B-2 is melted to seal a gap area between the chip 1' and the base board 14 with the seal resin 3. Thus, the resin-sealing and mounting operations by flip chip interconnection are performed at the same time (STEP7).

With the above manufacturing method, since the main surface of the wafer 1 is coated with the seal member 3B after formation of the bumps 2, portions other than the bumps 2 are buried in the seal member 3B and apparent projections of the bumps 2 are eliminated. Therefore, occurrence of breakage of the wafer 1 at the time of back side grinding can be suppressed and a lowering in the manufacturing yield can be suppressed.

Further, since the pickup operation is performed with the chip 1' and the seal resin layer 3B-2 integrally combined, the seal resin layer 3B-2 acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal resin layer 3B-2 when the picked-up chip 1' is mounted on the base board 14 by flip chip interconnection, the manufacturing process can be simplified and the manufacturing cost can be lowered.

In addition, since the seal resin layer 3B-2 formed on the element forming surface of the wafer 1 is cut off along a portion corresponding to the groove 4 at the pickup time, the size of the seal resin layer 3B-2 becomes approximately equal to the chip size and the positional deviation between the chip 1' and the seal resin layer 3B-2 can be made small. As a result, it becomes possible to suppress the seal member from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Fourth Embodiment]

Figure 10:
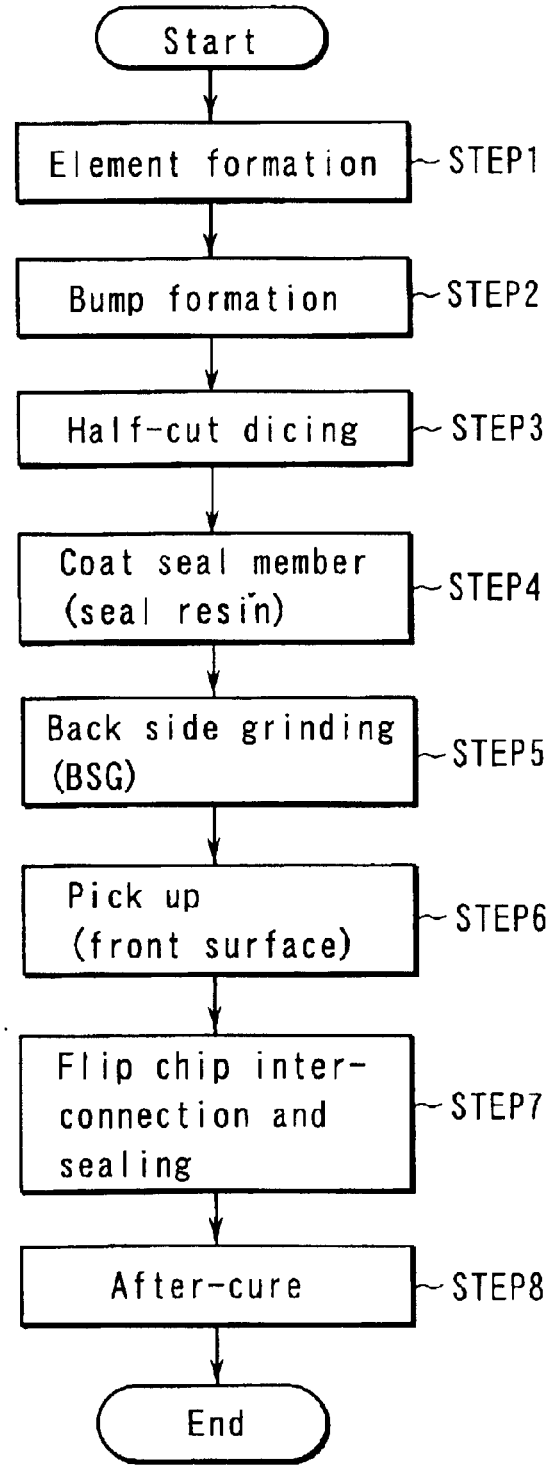
FIG. 10 is a flowchart for illustrating a semiconductor device manufacturing method according to the fourth embodiment of this invention.

FIGS. 9A to 9G and FIG. 10 illustrate a semiconductor device manufacturing method according to a fourth embodiment of this invention, FIGS. 9A to 9G being cross sectional views which sequentially show the manufacturing steps and FIG. 10 being a flowchart thereof.

Figure 9A:
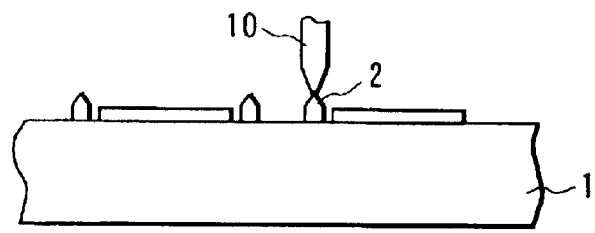
FIGS. 9A to 9G are cross sectional views sequentially showing the manufacturing steps, for illustrating a semiconductor device manufacturing method according to a fourth embodiment of this invention.
Figure 9B:
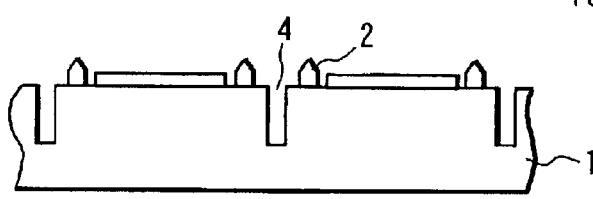
Figure 9C:
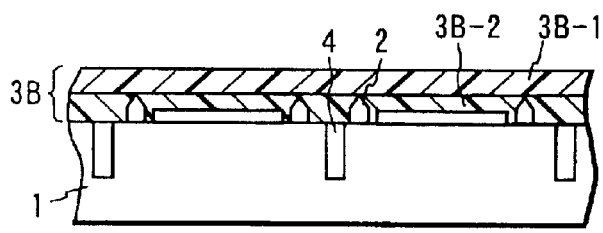
Figure 9E:
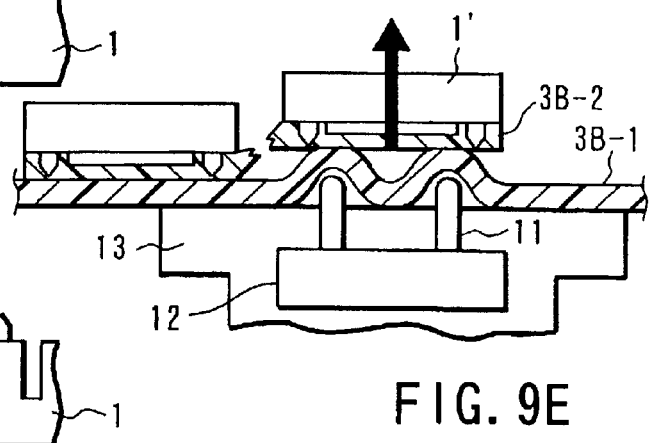
Figure 9F:
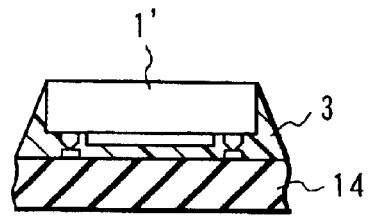
Figure 9G:
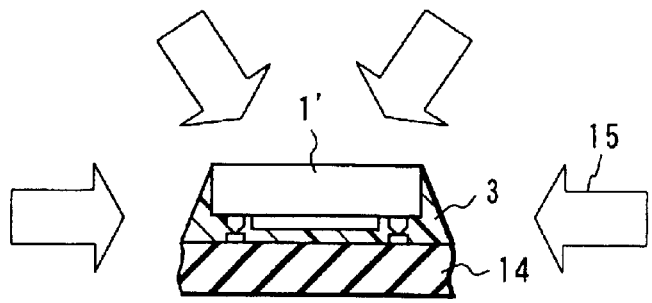
Figure 9D:
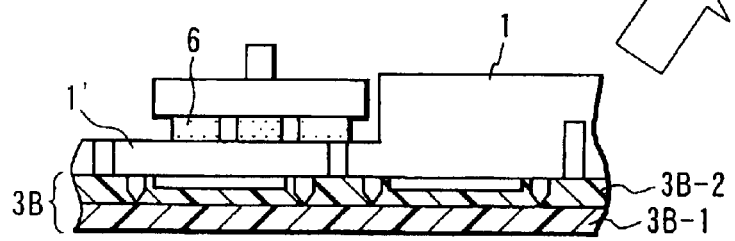

The fourth embodiment is similar to the third embodiment except that an after-cure step (indicated by an arrow 15) is performed to cure the seal resin 3 (STEP8) as shown in FIG. 9G after the operation of mounting the chip 1' on the base board 14 and the resin-sealing operation are simultaneously performed in the step (STEP7) shown in FIG. 9F.

Since the other steps are the same as those of the third embodiment, the same symbols are attached to like portions and the detail explanation thereof is omitted.

With the above manufacturing method, substantially the same operation and effect as those of the third embodiment can be attained.

[Fifth Embodiment]

Figure 11A:
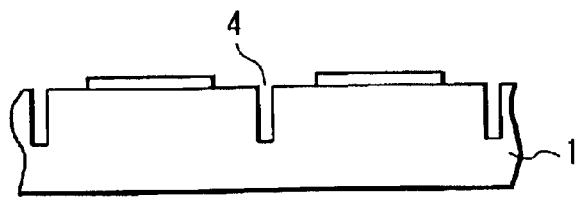
FIGS. 11A to 11G are cross sectional views sequentially showing the manufacturing steps, for illustrating a semiconductor device manufacturing method according to a fifth embodiment of this invention.
Figure 11B:
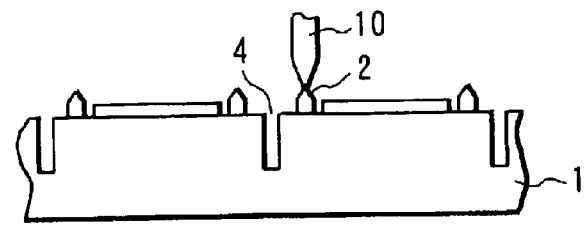
Figure 11C:
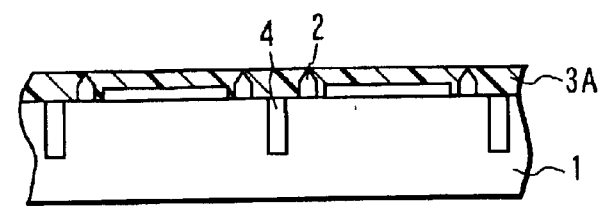
Figure 11D:
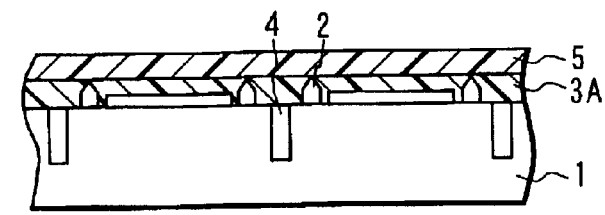
Figure 11E:
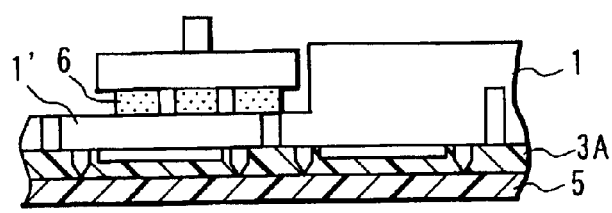
Figure 11F:
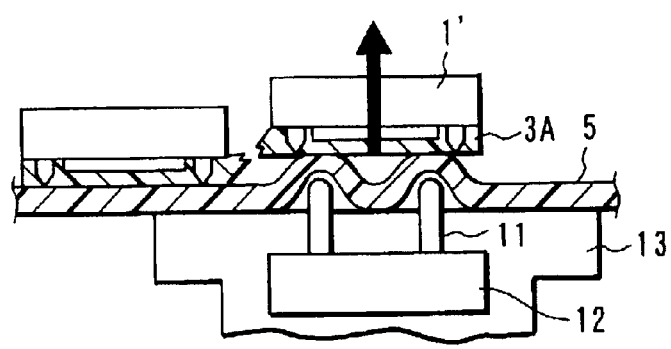
Figure 11G:
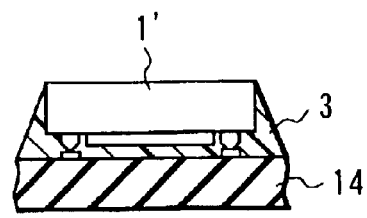
Figure 12:
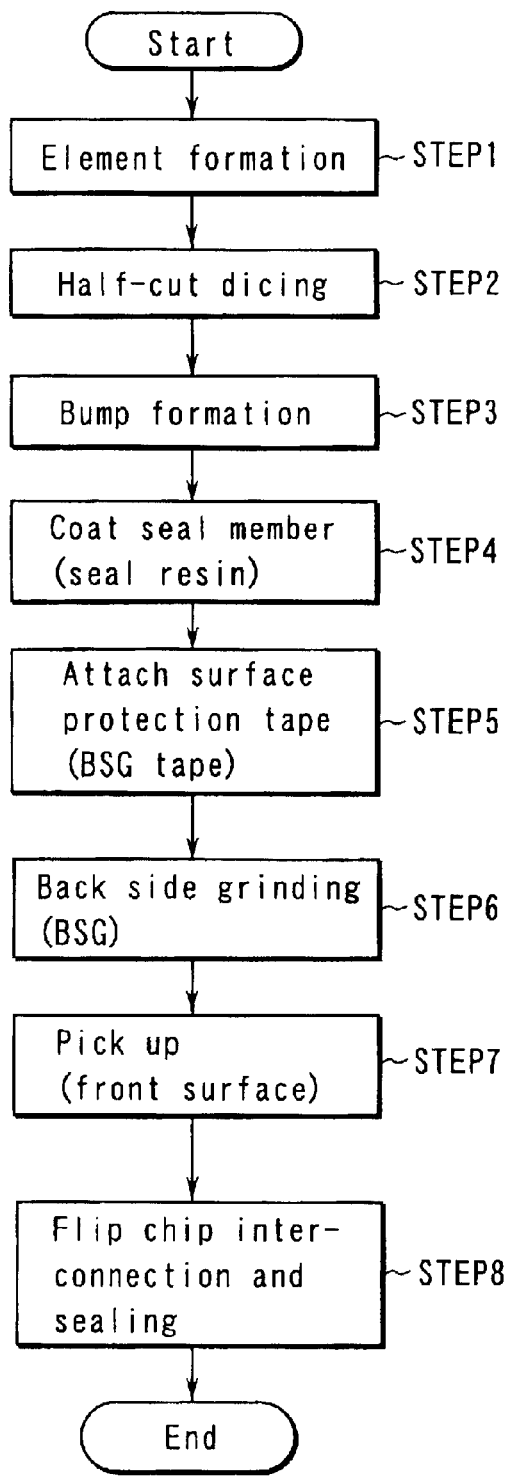
FIG. 12 is a flowchart for illustrating a semiconductor device manufacturing method according to the fifth embodiment of this invention.

FIGS. 11A to 11G and FIG. 12 illustrate a semiconductor device manufacturing method according to a fifth embodiment of this invention, FIGS. 11A to 11G being cross sectional views sequentially showing the manufacturing steps and FIG. 12 being a flowchart thereof.

First, various elements are formed on a semiconductor substrate (wafer) by a known process (STEP1).

Next, as shown in FIG. 11A, grooves 4 with depths which do not reach the back surface of a wafer 1 are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 11B, bumps 2 are formed on the main surface of the wafer 1 on which the elements have been formed (STEP3). In this example, a case wherein stud bumps are formed is explained as an example and the bumps 2 which are electrically connected to the elements by use of capillaries 10 are formed.

Next, as shown in FIG. 11C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 11D, a surface protection tape (BSG tape) 5 is attached to the seal member 3A on the element forming surface side of the wafer 1 (STEP5) and, as shown in FIG. 11E, a back side grinding process (STEP6) of the wafer 1 is performed by use of a grinder 6 to make the wafer 1 thin, and at the same time, divide the wafer into discrete chips 1' (dicing before grinding).

After the end of grinding, the discretely divided chips 1' are mounted on a fixed table of a pickup device and the fixed table is moved in an XY direction so as to set a pickup tool to correspond to one of the chips 1' to be picked up. Then, as shown in FIG. 11F, a vacuum is drawn on the inside of a backup holder 13 of the pickup device to attract and fix the surface protection tape 5 to and on the upper surface of the backup holder 13. In this state, a pin holder 12 having thrust pins 11 mounted thereon is raised so as to cause the thrust pins 11 to project from the upper surface of the backup holder 13. As a result, the chip 1' is pushed up from the seal member 3A side in a direction indicated by an arrow with the surface protection tape 5 disposed between the thrust pins and the seal member so that the corner portions of the chip 1' will be separated from the surface protection tape 5. Then, the chip 1' is picked up by attracting and separating the back surface side of the chip 1' by use of a suction tool which is called a collet (STEP7). At this time, the seal member 3A is pulled off and cut off at a portion corresponding to the groove 4.

After this, as shown in FIG. 11G, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal or fill a gap area between the chip 1' and the base board 14 with the seal resin 3. Thus, the resin-sealing and mounting operations by flip chip interconnection are performed at the same time (STEP8).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Further, when sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Sixth Embodiment]

Figure 14:
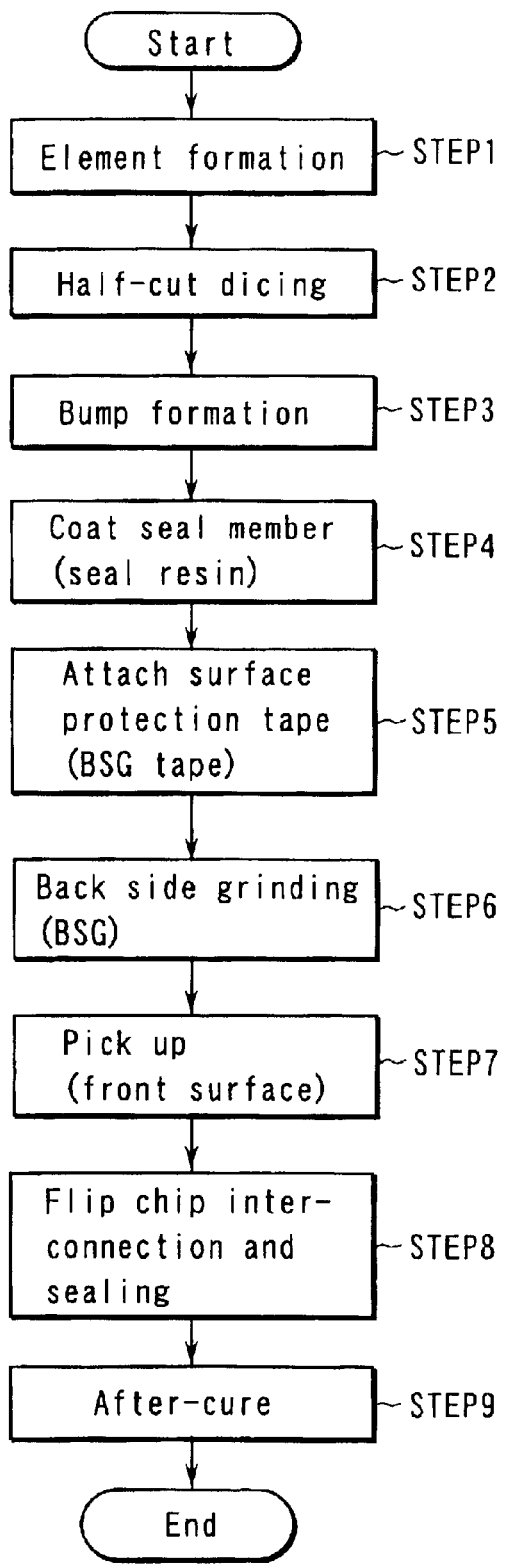
FIG. 14 is a flowchart for illustrating a semiconductor device manufacturing method according to the sixth embodiment of this invention.

FIGS. 13A to 13H and FIG. 14 illustrate a semiconductor device manufacturing method according to a sixth embodiment of this invention, FIGS. 13A to 13H being cross sectional views which sequentially show the manufacturing steps and FIG. 14 being a flowchart thereof.

Figure 13A:
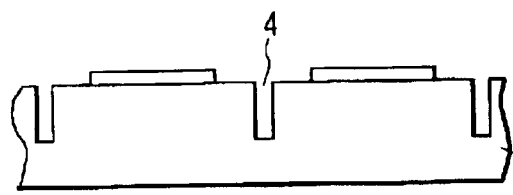
FIGS. 13A to 13H are cross sectional views sequentially showing the manufacturing steps, for illustrating a semiconductor device manufacturing method according to a sixth embodiment of this invention.
Figure 13B:
Figure 13C:
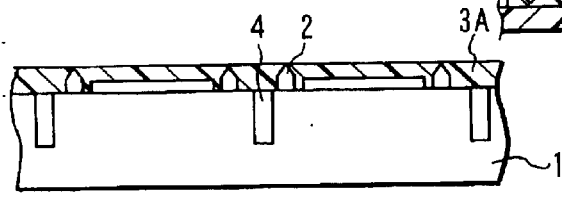
Figure 13D:
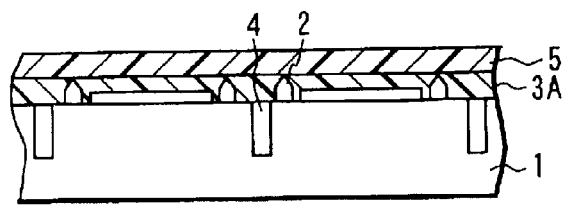
Figure 13E:
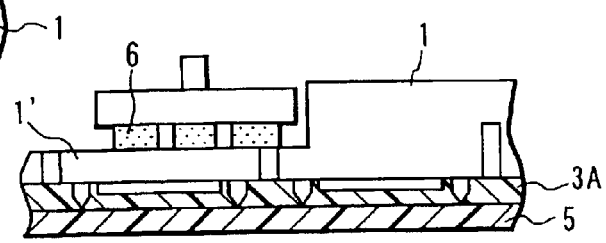
Figure 13F:
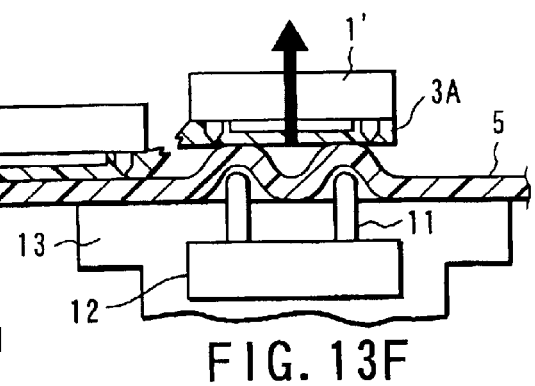
Figure 13G:
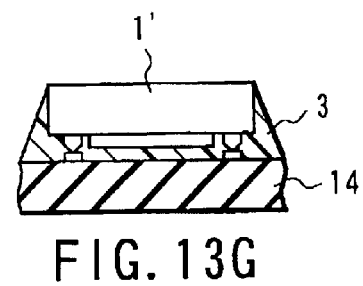
Figure 13H:
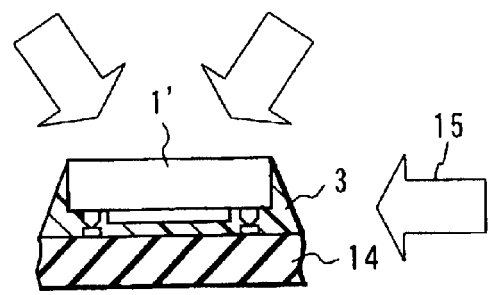

The sixth embodiment is similar to the fifth embodiment except that an after-cure step (indicated by an arrow 15) is performed to cure the seal resin 3 (STEP9) as shown in FIG. 13H after the operation of mounting the chip 1' on the base board 14 and the resin-sealing operation are simultaneously performed in the step (STEP8) shown in FIG. 13G.

Since the other steps are the same as those of the fifth embodiment, the same symbols are attached to like portions and the detail explanation thereof is omitted.

With the above manufacturing method, substantially the same operation and effect as those of the fifth embodiment can be attained.

[Seventh Embodiment]

Figure 15A:
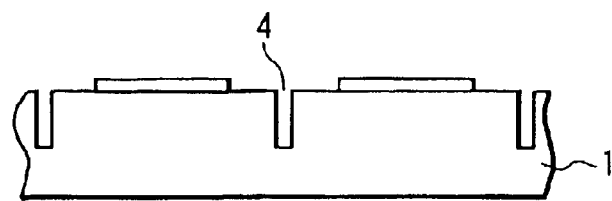
FIGS. 15A to 15F are cross sectional views sequentially showing the manufacturing steps, for illustrating a semiconductor device manufacturing method according to a seventh embodiment of this invention.
Figure 15B:
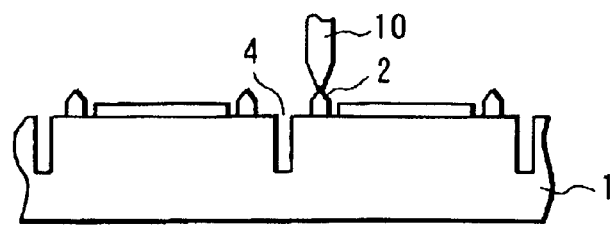
Figure 15C:
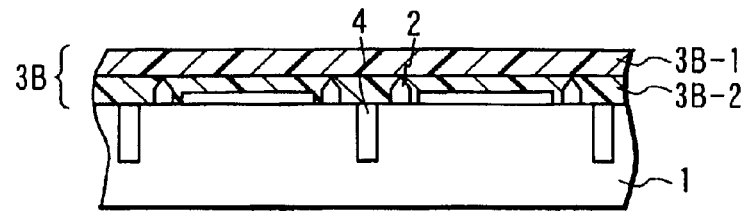
Figure 15D:
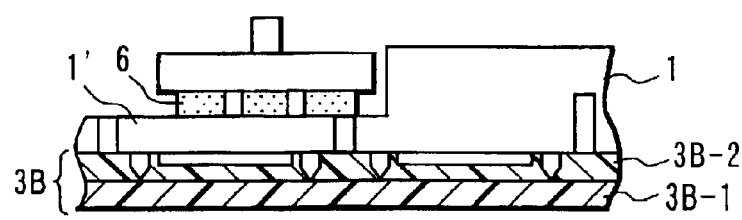
Figure 15E:
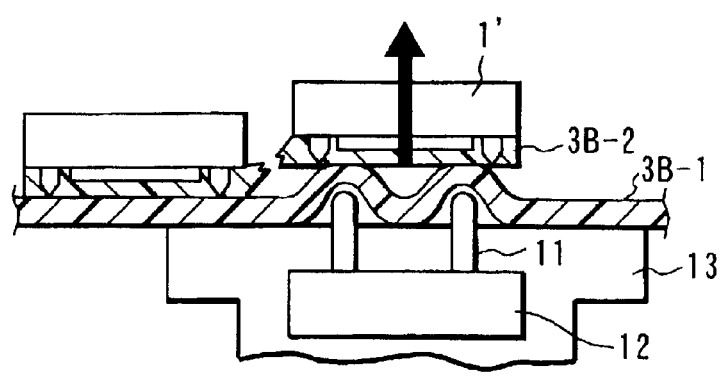
Figure 15F:
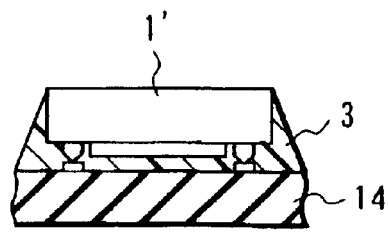
Figure 16:
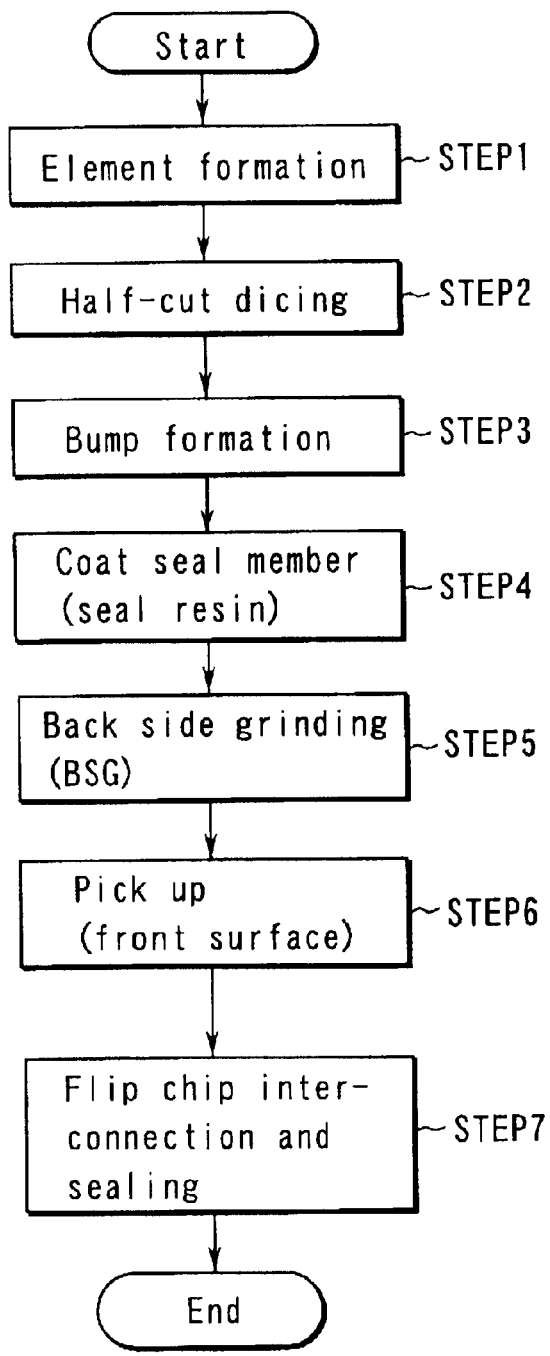
FIG. 16 is a flowchart for illustrating a semiconductor device manufacturing method according to the seventh embodiment of this invention.

FIGS. 15A to 15F and FIG. 16 illustrate a semiconductor device manufacturing method according to a seventh embodiment of this invention, FIGS. 15A to 15F being cross sectional views which sequentially show the manufacturing steps and FIG. 16 being a flowchart thereof.

First, various elements are formed on a semiconductor substrate (wafer) by a known process (STEP1).

Next, as shown in FIG. 15A, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 15B, bumps 2 are formed on the main surface portion of the wafer 1 on and in which the elements and grooves 4 have been formed (STEP3). In this example, a case wherein stud bumps are formed is explained as an example and the bumps 2 which are electrically connected to the elements by use of capillaries 10 are formed.

Next, as shown in FIG. 15C, the element forming surface side of the wafer 1 is coated with a seal member 3B by attaching sheet-form resin thereto so as to bury the bumps 2 therein (STEP4). The seal member 3B is formed of a sheet-form base member 3B-1 and a seal resin layer 3B-2 formed of, for example, epoxy-series resin or silica-containing resin which is formed on the surface of the base member 3B-1 and the seal resin layer 3B-2 is adhered to the element forming surface of the wafer 1. It is preferable that the seal resin layer 3B-2 is melted at temperatures of approximately 100° C. to 130° C.

After this, as shown in FIG. 15D, a back side grinding process (STEP5) of the wafer 1 is performed by use of a grinder 6 to make the wafer 1 thin, and at the same time, divide the wafer into discrete chips 1' (dicing before grinding).

After the end of grinding, the discretely divided chips 1' are mounted on a fixed table of a pickup device and the fixed table is moved in an XY direction so as to set a pickup tool to correspond to one of the chips 1' to be picked up.

Then, as shown in FIG. 15E, a vacuum is drawn on the inside of a backup holder 13 of the pickup device to attract and fix the seal member 3B to and on the upper surface of the backup holder 13. In this state, a pin holder 12 having thrust pins 11 mounted thereon is raised so as to cause the thrust pins 11 to project from the upper surface of the backup holder 13. As a result, the chip 1' is pushed up from the seal member 3B side in a direction indicated by an arrow. Then, the chip 1' is picked up by attracting and separating the back surface side of the chip 1' by use of a suction tool which is called a collet (STEP6). At this time, the seal resin layer 3B-2 is separated from the base member 3B-1 and left behind on the element forming surface of the chip 1'.

After this, as shown in FIG. 15F, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal resin layer 3B-2 is melted to seal or fill a gap area between the chip 1' and the base board 14 with the seal resin 3. Thus, the resin-sealing and mounting operations by flip chip interconnection are performed at the same time (STEP7).

With the above manufacturing method, since the main surface of the wafer 1 is coated with the seal member 3B after formation of the bumps 2, portions other than the bumps 2 are buried in the seal member 3B and apparent projections of the bumps 2 are eliminated. Therefore, occurrence of breakage of the wafer 1 at the time of back side grinding can be suppressed and a lowering in the manufacturing yield can be suppressed.

Further, since the pickup operation is performed with the chip 1' and the seal resin layer 3B-2 integrally combined, the seal resin layer 3B-2 acts as a reinforcing member for the chip 1'. As a result, it becomes possible to significantly suppress occurrence of breakage of the chip 1' which may be caused when the thin chip 1' is picked up.

Since the mounting and sealing operations can be simultaneously performed by melting the seal resin layer 3B-2 when the picked-up chip 1' is mounted on the base board 14 by flip chip interconnection, the manufacturing process can be simplified and the manufacturing cost can be lowered.

In addition, since the seal resin layer 3B-2 formed on the element forming surface of the wafer 1 is cut off along a portion thereof corresponding to the groove 4 at the pickup time, the size of the seal resin layer 3B-2 becomes approximately equal to the chip size and the positional deviation between the chip 1'and the seal member can be made small. As a result, it becomes possible to suppress the seal member from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Eighth Embodiment]

Figure 18:
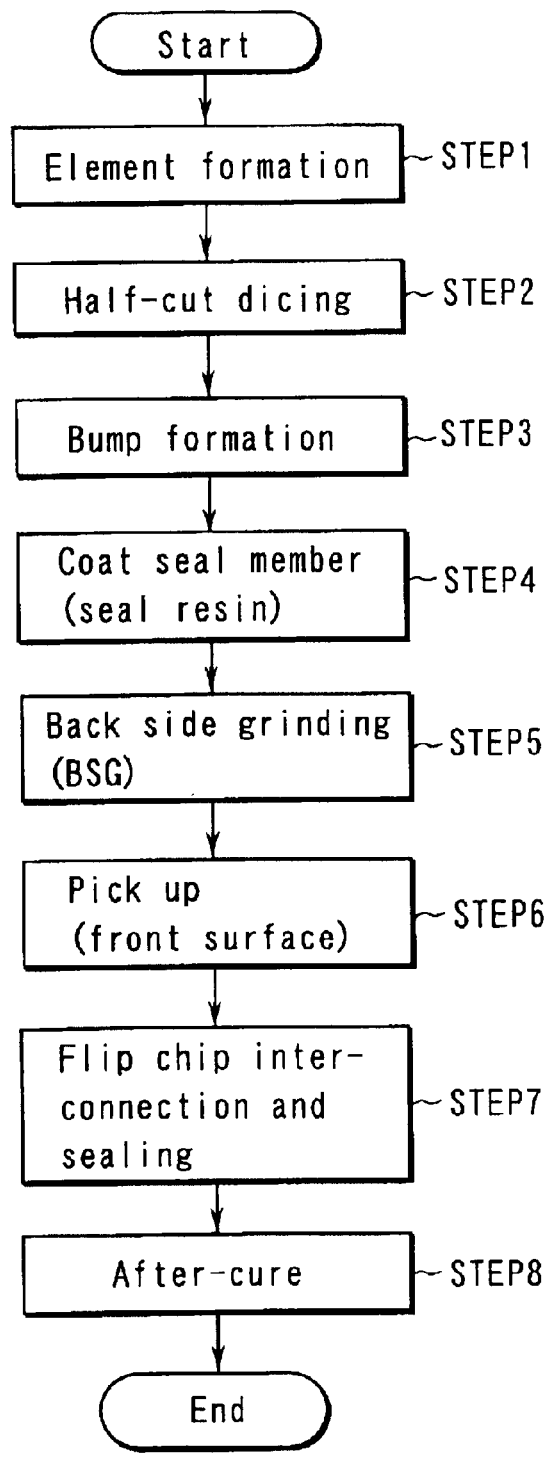
FIG. 18 is a flowchart for illustrating a semiconductor device manufacturing method according to the eighth embodiment of this invention.

FIGS. 17A to 17G and FIG. 18 illustrate a semiconductor device manufacturing method according to an eighth embodiment of this invention, FIGS. 17A to 17G being cross sectional views which sequentially show the manufacturing steps and FIG. 18 being a flowchart thereof.

The eighth embodiment is similar to the seventh embodiment except that an after-cure step (indicated by an arrow 15) is performed to cure the seal resin 3 (STEP8) as shown in FIG. 17G after the operation of mounting the chip 1' on the base board 14 and the resin-sealing operation are simultaneously performed in the step (STEP7) shown in FIG. 17F.

Since the other steps are the same as those of the seventh embodiment, the same symbols are attached to like portions and the detailed explanation thereof is omitted.

With the above manufacturing method, substantially the same operation and effect as those of the seventh embodiment can be attained.

[Ninth Embodiment]

Figure 20:
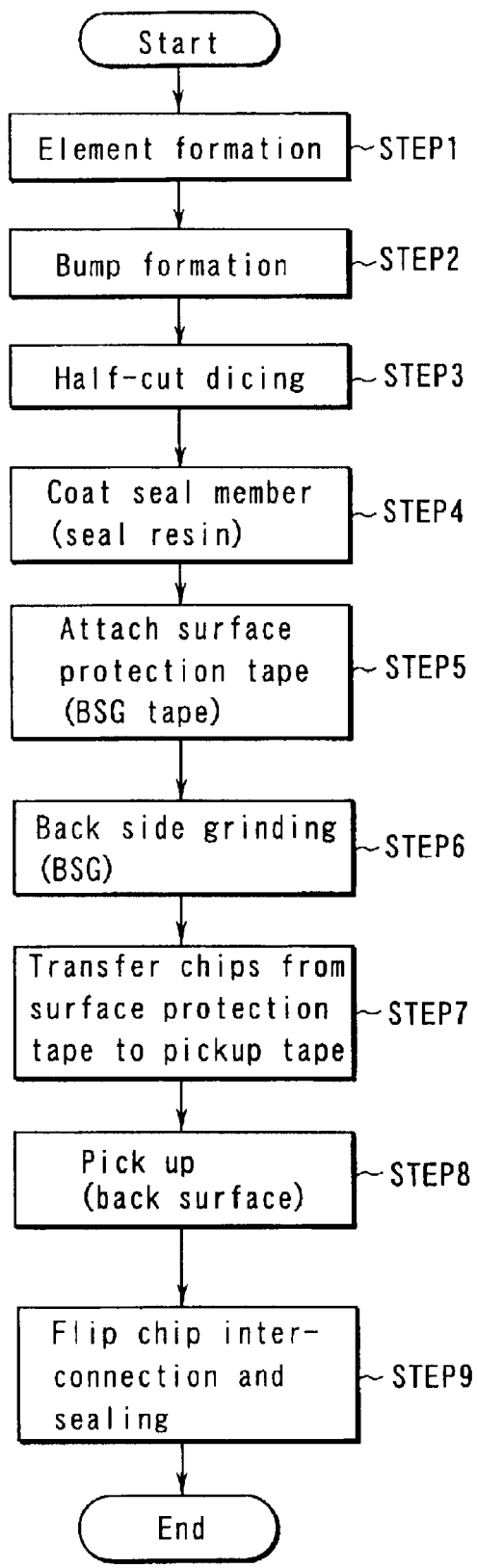
FIG. 20 is a flowchart for illustrating a semiconductor device manufacturing method according to the ninth embodiment of this invention.

FIGS. 19A to 19H and FIG. 20 illustrate a semiconductor device manufacturing method according to a ninth embodiment of this invention, FIGS. 19A to 19H being cross sectional views which sequentially show the manufacturing steps and FIG. 20 being a flowchart thereof.

First, various elements are formed on a semiconductor substrate (wafer) by a known process (STEP1).

Next, as shown in FIG. 19A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 19B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Next, as shown in FIG. 19C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 19D, a surface protection tape (BSG tape) 5 is attached to the seal member 3A formed on the element forming surface of the wafer 1 (STEP5) and, as shown in FIG. 19E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 19F, the surface protection tape 5 is separated after the back surfaces of the chips 1' which are divided into the discrete form in the above step are positioned with respect to and adhered to a pickup tape 9 mounted on a flat ring (wafer ring) 8. As a result, the individual chips 1 are transferred from the surface protection tape 5 to the pickup tape 9 (STEP7).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example. Then, as shown in FIG. 19G, a vacuum is drawn on the inside of a backup holder 13 of the pickup device to attract and fix the pickup tape 9 to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9 disposed between the thrust pins and the chip so that the corner portions of the chip 1' will be separated from the pickup tape 9. Then, the chip 1' is picked up by attracting and separating the element forming surface side of the chip 1' by use of a suction tool called a collet (STEP8). At this time, the seal member 3A is pulled off and cut off at a portion corresponding to the groove 4.

After this, as shown in FIG. 19H, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP9).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. On the other hand, when sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Tenth Embodiment]

Figure 22:
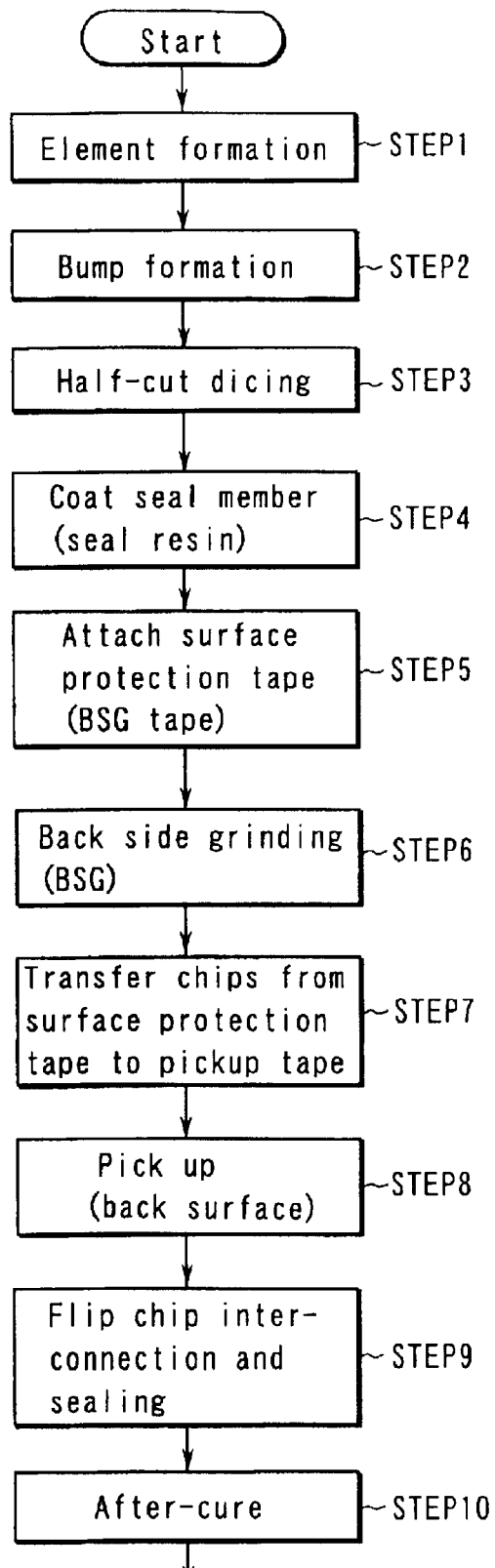
FIG. 22 is a flowchart for illustrating a semiconductor device manufacturing method according to the tenth embodiment of this invention.

FIGS. 21A to 21I and FIG. 22 illustrate a semiconductor device manufacturing method according to a tenth embodiment of this invention, FIGS. 21A to 21I being cross sectional views which sequentially show the manufacturing steps and FIG. 22 being a flowchart thereof.

Figures 21A, 21G:
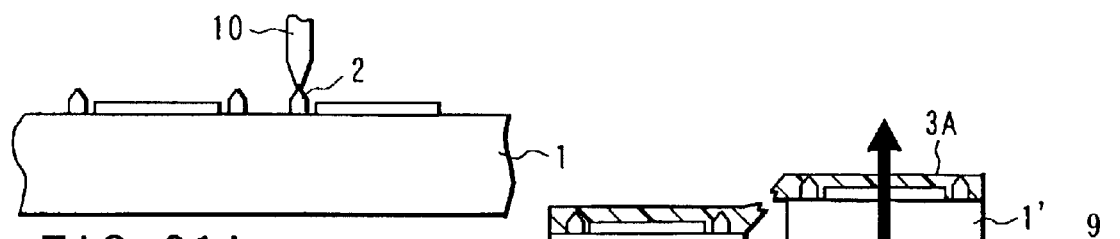
FIGS. 21A to 21I are cross sectional views sequentially showing the manufacturing steps, for illustrating a semiconductor device manufacturing method according to a tenth embodiment of this invention.
Figures 21B, 21H:
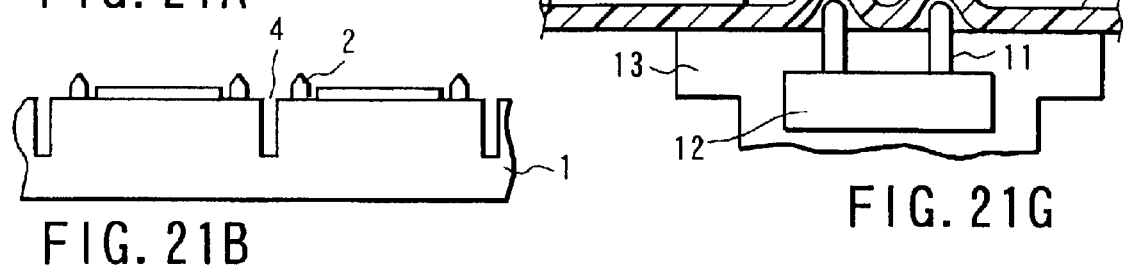
Figures 21C, 21I:
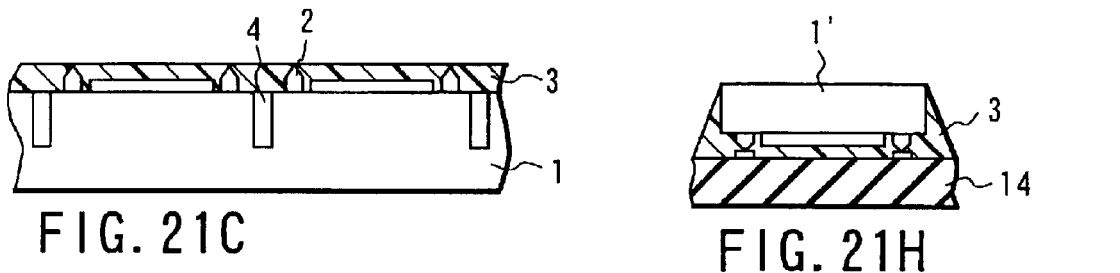
Figure 21D:
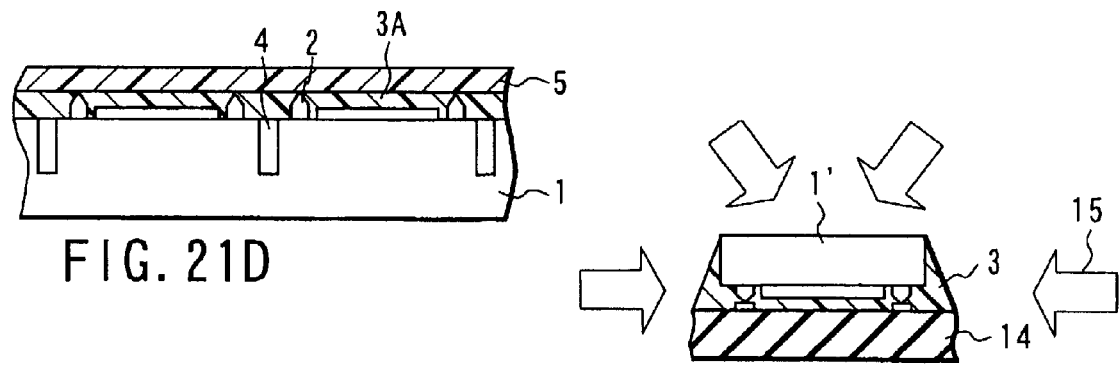
Figure 21E:
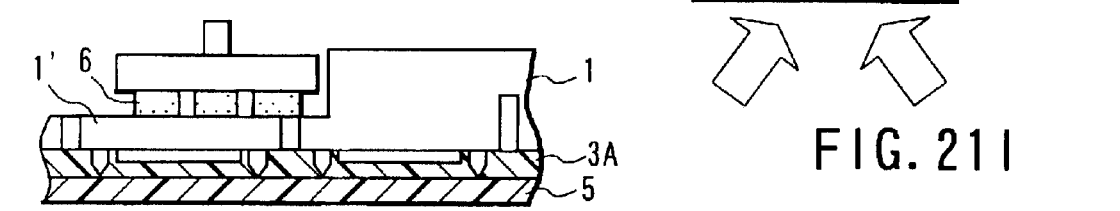
Figure 21F:
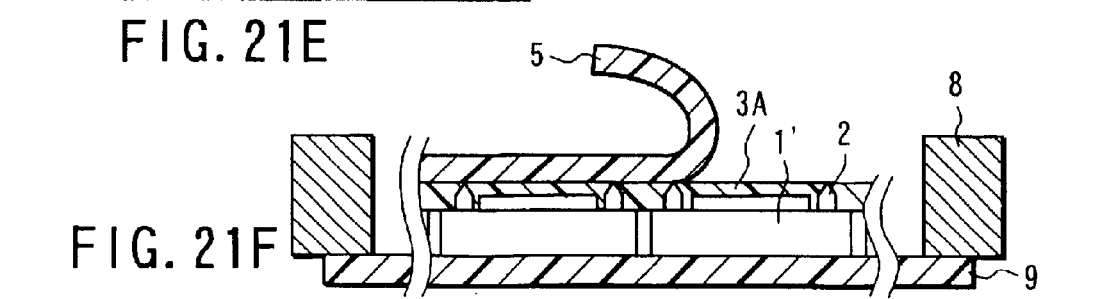

The tenth embodiment is similar to the ninth embodiment except that an after-cure step (indicated by an arrow 15) is performed to cure the seal resin 3 (STEP10) as shown in FIG. 21I after the operation of mounting the chip 1' on the base board 14 and the resin-sealing operation are simultaneously performed in the step (STEP9) shown in FIG. 21H.

Since the other steps are the same as those of the ninth embodiment, the same symbols are attached to like portions and the detailed explanation thereof is omitted.

With the above manufacturing method, substantially the same operation and effect as those of the ninth embodiment can be attained.

[Eleventh Embodiment]

FIGS. 23A to 23G and FIG. 24 illustrate a semiconductor device manufacturing method according to an eleventh embodiment of this invention, FIGS. 23A to 23G being cross sectional views which sequentially show the manufacturing steps and FIG. 24 being a flowchart thereof.

First, various elements are formed on a semiconductor substrate (wafer) by a known process (STEP1).

Figure 23A:
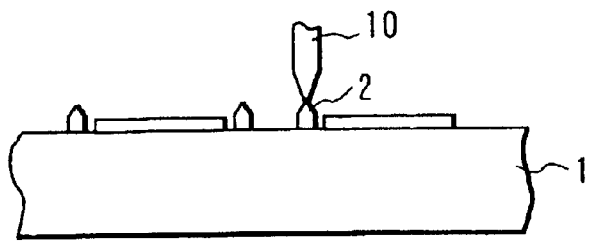
FIGS. 23A to 23G are cross sectional views sequentially showing the manufacturing steps, for illustrating a semiconductor device manufacturing method according to an eleventh embodiment of this invention.

Next, as shown in FIG. 23A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

Figure 23B:
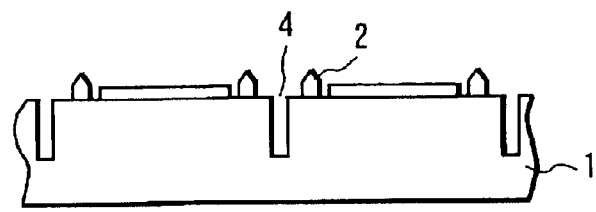

After this, as shown in FIG. 23B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Figure 23C:
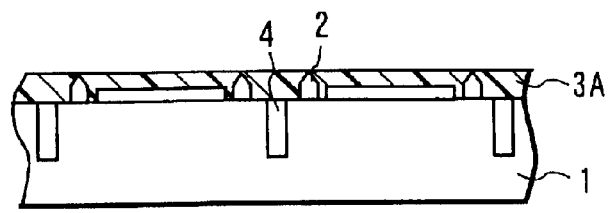

Next, as shown in FIG. 23C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

Figure 23D:
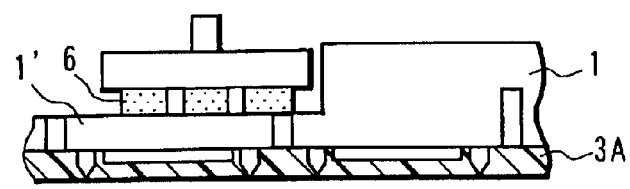

After this, as shown in FIG. 23D, a back side grinding process (STEP5) of the wafer 1 is performed by use of a grinder 6 to make the wafer 1 thin, and at the same time, divide the wafer into discrete chips 1' (dicing before grinding).

Figure 23E:
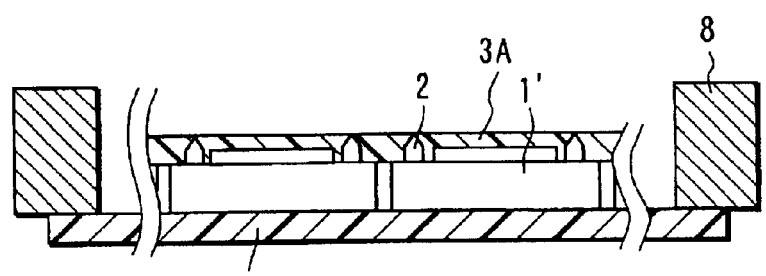

After the end of grinding, as shown in FIG. 23E, the back surfaces of the discretely divided chips 1' are positioned with respect to and adhered to a pickup tape 9 mounted on a flat ring 8 (STEP6).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Figure 23F:
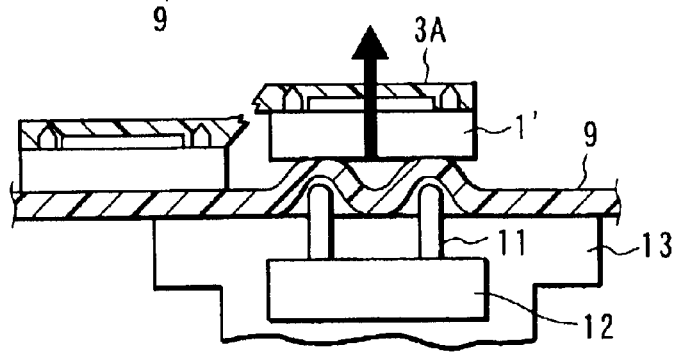

Then, as shown in FIG. 23F, a vacuum is drawn on the inside of a backup holder 13 of the pickup device to attract and fix the pickup tape 9 to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9 disposed between the thrust pins and the chip so that the corner portions of the chip 1' will be separated from the pickup tape 9. Then, the chip 1' is picked up by attracting and separating the element forming surface side of the chip 1' by use of a collet (STEP7). At this time, the seal member 3A is pulled off and cut off at a portion corresponding to the groove 4.

Figure 23G:
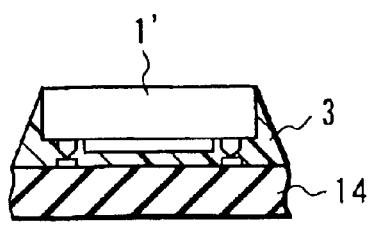

After this, as shown in FIG. 23G, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP8).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Twelfth Embodiment]

FIGS. 25A to 25H and FIG. 26 illustrate a semiconductor device manufacturing method according to a twelfth embodiment of this invention, FIGS. 25A to 25H being cross sectional views which sequentially show the manufacturing steps and FIG. 26 being a flowchart thereof.

Figure 25A:
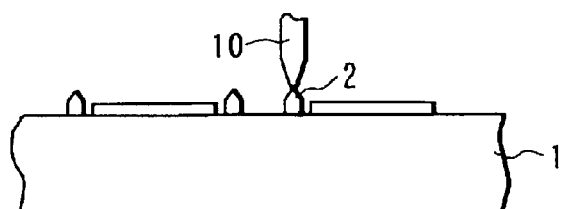
FIGS. 25A to 25H are cross sectional views sequentially showing the manufacturing steps, for illustrating a semiconductor device manufacturing method according to a twelfth embodiment of this invention.
Figure 25B:
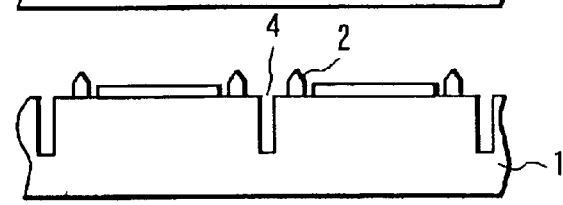
Figure 25C:
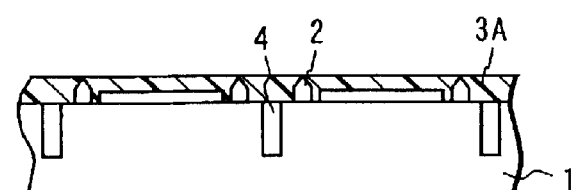
Figure 25D:
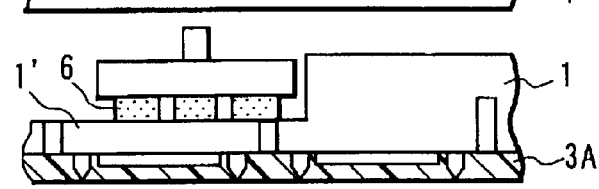
Figure 25E:
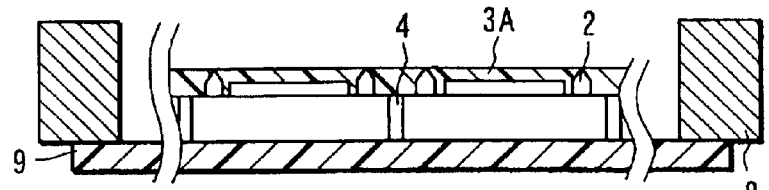
Figure 25F:
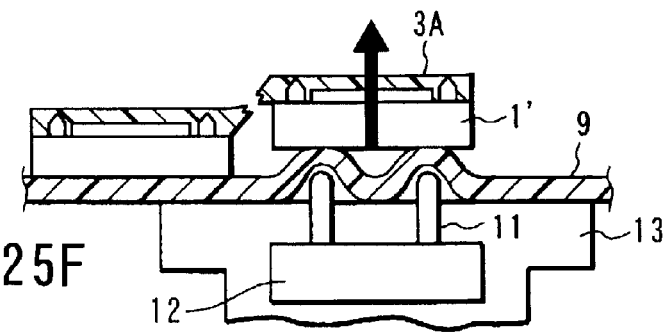
Figure 25G:
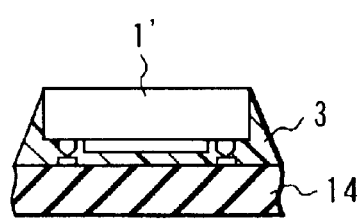
Figure 25H:
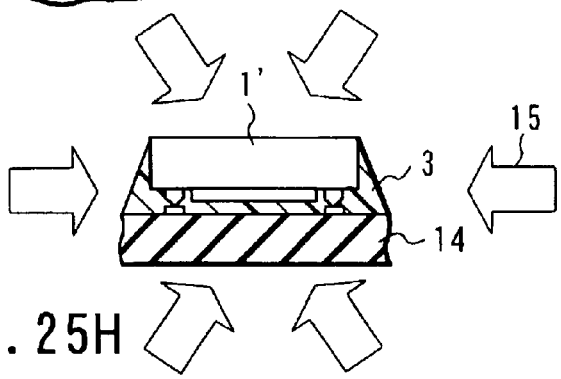

The twelfth embodiment is similar to the eleventh embodiment except that an after-cure step (indicated by an arrow 15) is performed to cure the seal resin 3 (STEP9) as shown in FIG. 25H after the operation of mounting the chip 1' on the base board 14 and the resin-sealing operation are simultaneously performed in the step (STEP8) shown in FIG. 25G.

Since the other steps are the same as those of the eleventh embodiment, the same symbols are attached to like portions and the detailed explanation thereof is omitted.

With the above manufacturing method, substantially the same operation and effect as those of the eleventh embodiment can be attained.

[Thirteenth Embodiment]

Figure 27A:
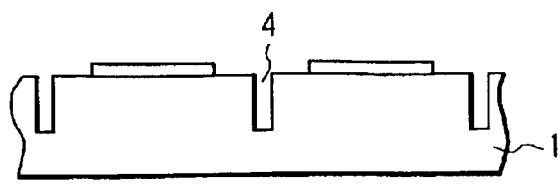
FIGS. 27A to 27H are cross sectional views sequentially showing the manufacturing steps, for illustrating a semiconductor device manufacturing method according to a thirteenth embodiment of this invention.
Figure 27B:
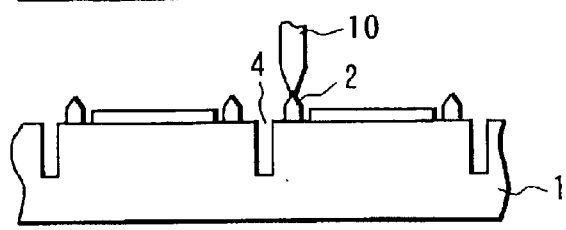
Figure 27C:
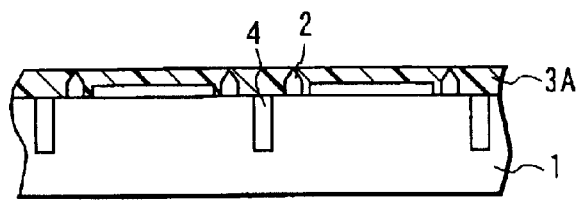
Figure 27D:
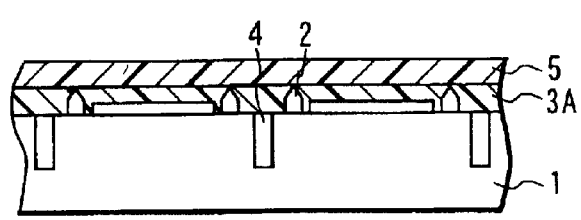
Figure 27E:
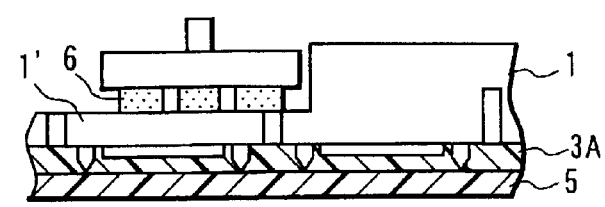
Figure 27F:
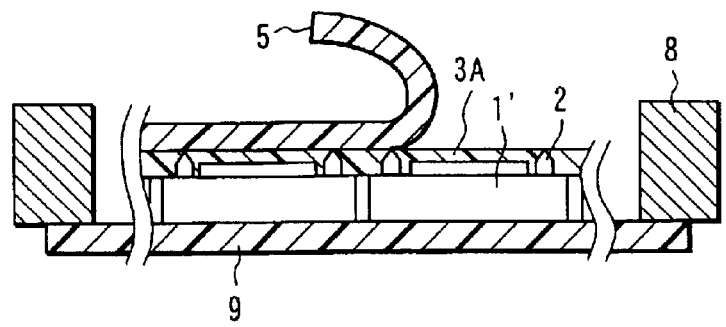
Figure 27G:
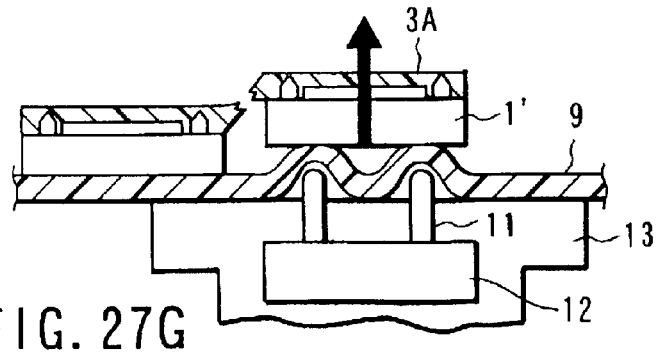
Figure 27H:
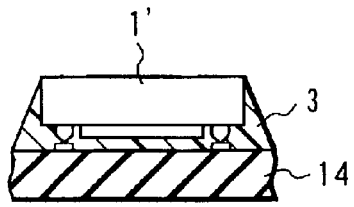
Figure 28:
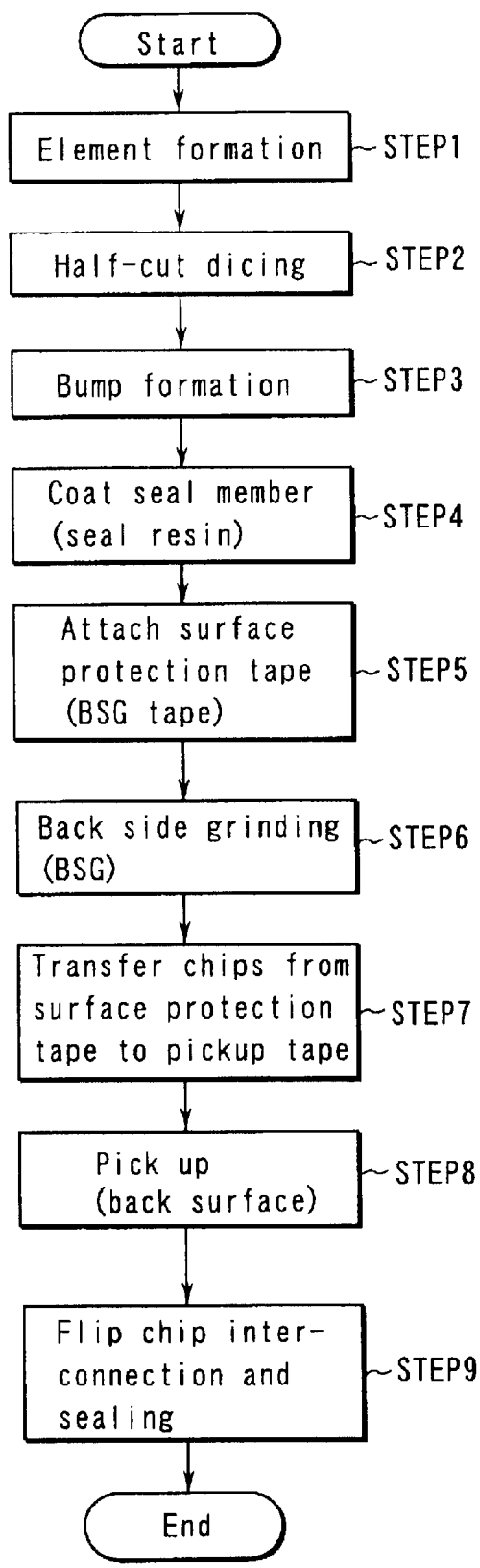
FIG. 28 is a flowchart for illustrating a semiconductor device manufacturing method according to the thirteenth embodiment of this invention.

FIGS. 27A to 27H and FIG. 28 illustrate a semiconductor device manufacturing method according to a thirteenth embodiment of this invention, FIGS. 27A to 27H being cross sectional views sequentially showing the manufacturing steps and FIG. 28 being a flowchart thereof.

First, various elements are formed on a semiconductor substrate (wafer) by a known process (STEP1).

Next, as shown in FIG. 27A, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 27B, bumps 2 are formed on the main surface portion of the wafer 1 on and in which the elements and grooves 4 have been formed (STEP3). In this example, a case wherein stud bumps are formed is explained as an example and the bumps 2 which are electrically connected to the elements by use of capillaries 10 are formed.

Next, as shown in FIG. 27C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 27D, a surface protection tape (BSG tape) 5 is attached to the seal member 3A (STEP5) and, as shown in FIG. 27E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 27F, the surface protection tape 5 is separated after the back surfaces of the chips 1' which are divided into the discrete form are positioned with respect to and adhered to a pickup tape 9 mounted on a flat ring 8. As a result, the individual chips 1 are transferred from the surface protection tape 5 to the pickup tape 9 (STEP7).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 27G, a vacuum is drawn on the inside of a backup holder 13 of the pickup device to attract and fix the pickup tape 9 to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9 disposed between the thrust pins and the chip so that the corner portions of the chip 1' will be separated from the pickup tape 9. Then, the chip 1' is picked up by attracting and separating the element forming surface side of the chip 1' by use of a suction tool which is called a collet (STEP8). At this time, the seal member 3A is pulled off and cut off at a portion corresponding to the groove 4.

After this, as shown in FIG. 27H, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP9).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Also, when sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Fourteenth Embodiment]

Figure 30:
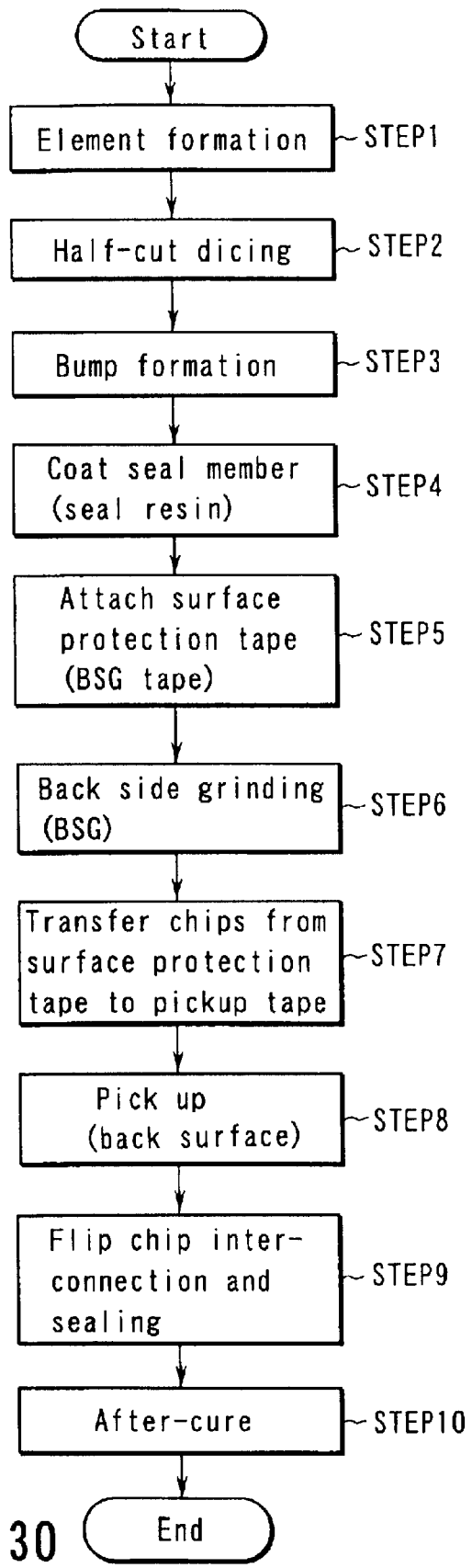
FIG. 30 is a flowchart for illustrating a semiconductor device manufacturing method according to the fourteenth embodiment of this invention.

FIGS. 29A to 29I and FIG. 30 illustrate a semiconductor device manufacturing method according to a fourteenth embodiment of this invention, FIGS. 29A to 29I being cross sectional views which sequentially show the manufacturing steps and FIG. 30 being a flowchart thereof.

Figure 29A:
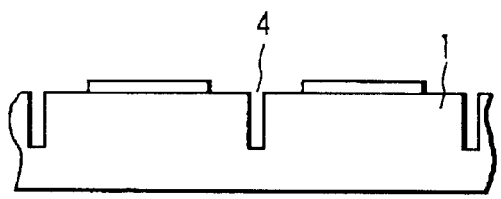
FIGS. 29A to 29I are cross sectional views sequentially showing the manufacturing steps, for illustrating a semiconductor device manufacturing method according to a fourteenth embodiment of this invention.
Figure 29D:
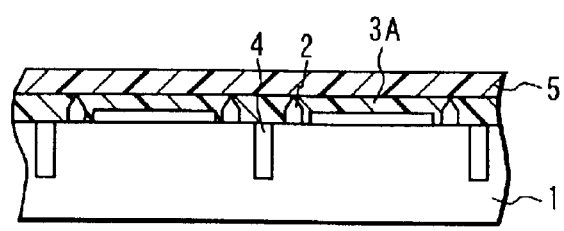
Figure 29B:
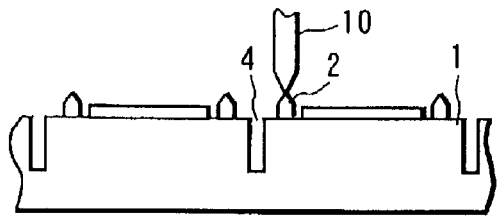
Figure 29E:
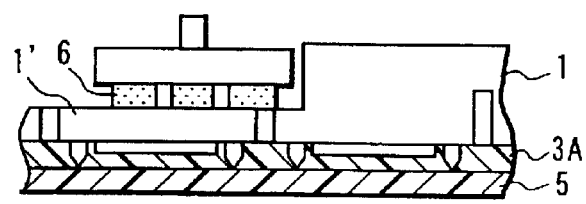
Figure 29C:
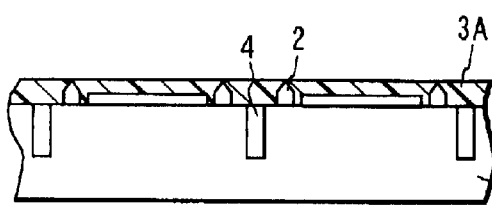
Figure 29F:
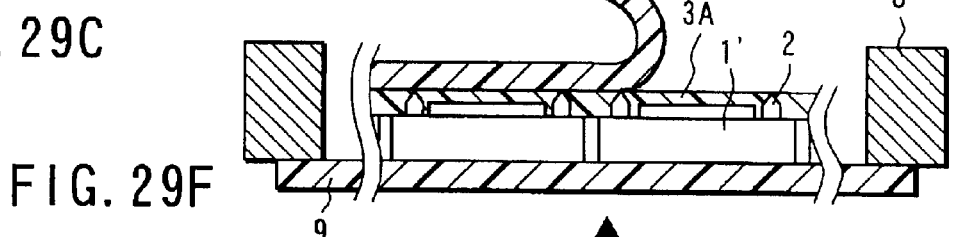
Figure 29G:
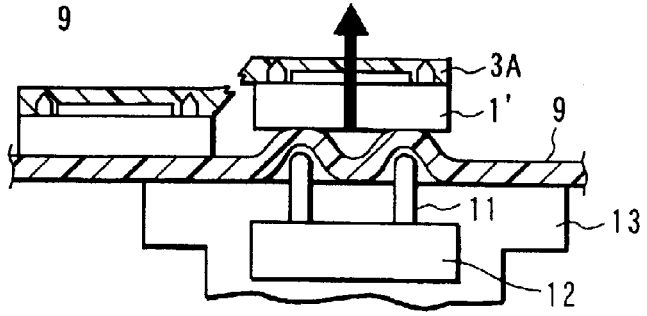
Figure 29H:
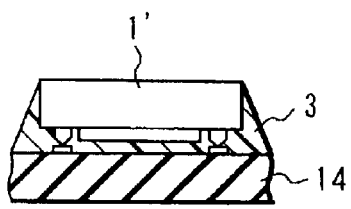
Figure 29I:
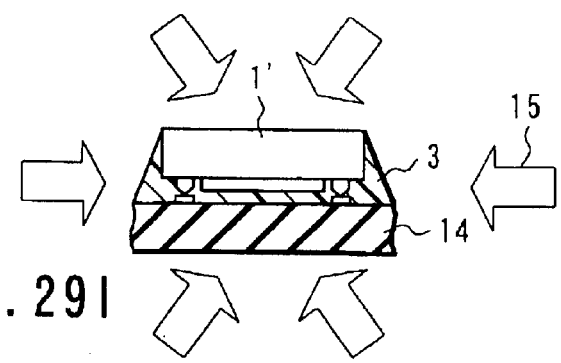

The fourteenth embodiment is similar to the thirteenth embodiment except that an after-cure step (indicated by an arrow 15) is performed to cure the seal resin 3 (STEP10) as shown in FIG. 29I after the operation of mounting the chip 1' on the base board 14 and the resin-sealing operation are simultaneously performed in the step (STEP9) shown in FIG. 29H.

Since the other steps are the same as those of the thirteenth embodiment, the same symbols are attached to like portions and the detailed explanation thereof is omitted.

With the above manufacturing method, substantially the same operation and effect as those of the thirteenth embodiment can be attained.

[Fifteenth Embodiment]

Figure 31A:
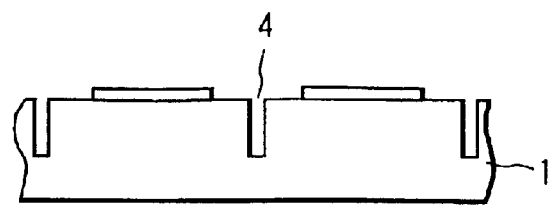
FIGS. 31A to 31G are cross sectional views sequentially showing the manufacturing steps, for illustrating a semiconductor device manufacturing method according to a fifteenth embodiment of this invention.
Figure 31B:
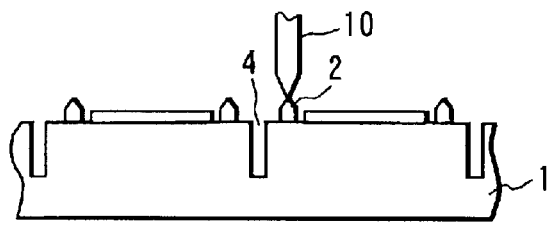
Figure 31C:
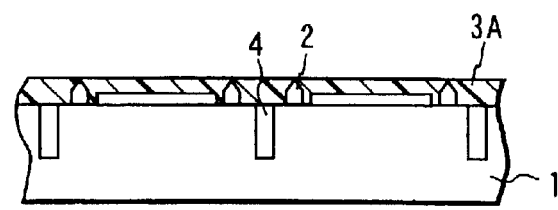
Figure 31D:
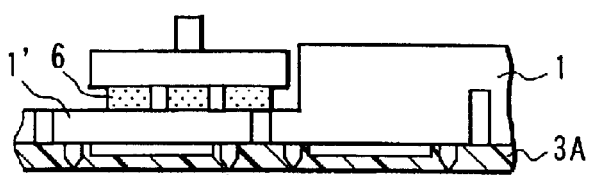
Figure 31E:
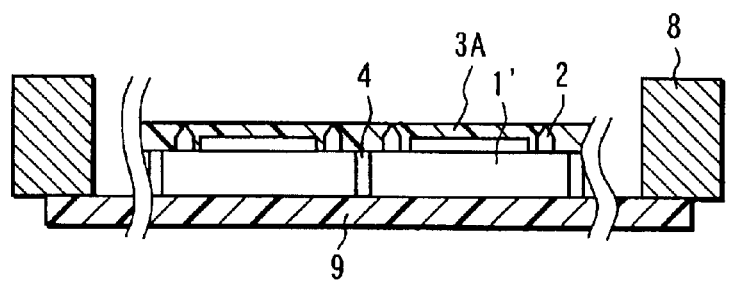
Figure 31F:
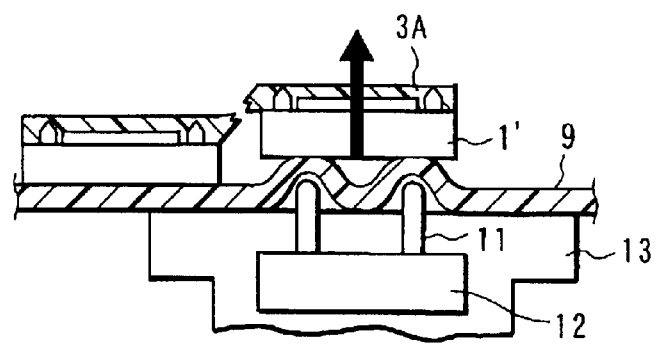
Figure 31G:
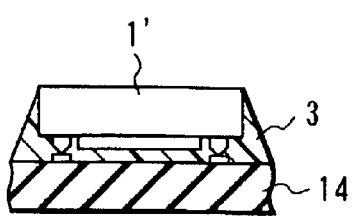
Figure 32:
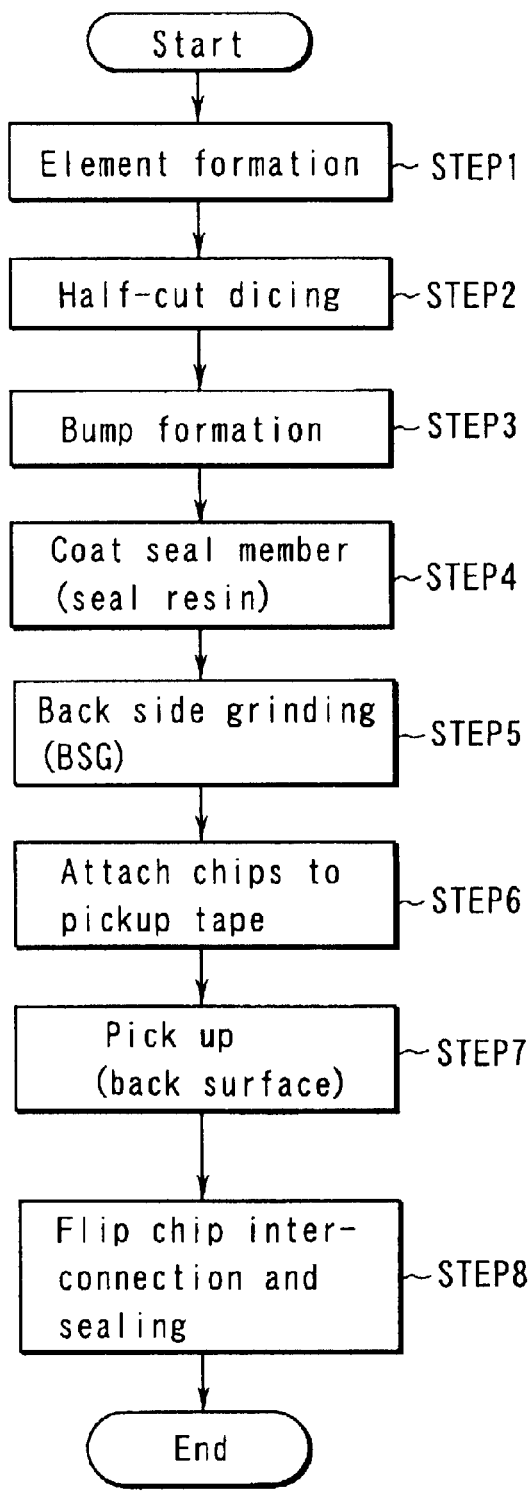
FIG. 32 is a flowchart for illustrating a semiconductor device manufacturing method according to the fifteenth embodiment of this invention.

FIGS. 31A to 31G and FIG. 32 illustrate a semiconductor device manufacturing method according to a fifteenth embodiment of this invention, FIGS. 31A to 31G being cross sectional views which sequentially show the manufacturing steps and FIG. 32 being a flowchart thereof.

First, various elements are formed on a semiconductor substrate (wafer) by a known process (STEP1).

Next, as shown in FIG. 31A, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 31B, bumps 2 are formed on the main surface portion of the wafer 1 on and in which the elements and grooves have been formed (STEP3). In this example, a case wherein stud bumps are formed is explained as an example and the bumps 2 which are electrically connected to the elements by use of capillaries 10 are formed.

Next, as shown in FIG. 31C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 31D, a back side grinding process (STEP5) of the wafer 1 is performed by use of a grinder 6 to make the wafer 1 thin, and at the same time, divide the wafer into discrete chips 1' (dicing before grinding).

After the end of grinding, as shown in FIG. 31E, the back surfaces of the discretely divided chips 1' are positioned with respect to and adhered to a pickup tape 9 mounted on a flat ring 8 (STEP6).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example. Then, as shown in FIG. 31F, a vacuum is drawn on the inside of a backup holder 13 of the pickup device to attract and fix the pickup tape 9 to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9 disposed between the thrust pins and the chip so that the corner portions of the chip 1' will be separated from the pickup tape 9. Then, the chip 1' is picked up by attracting and separating the element forming surface side of the chip 1' by use of a collet (STEP7). At this time, the seal member 3A is pulled and cut off at a portion corresponding to the groove 4.

After this, as shown in FIG. 31G, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP8).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Sixteenth Embodiment]

Figure 34:
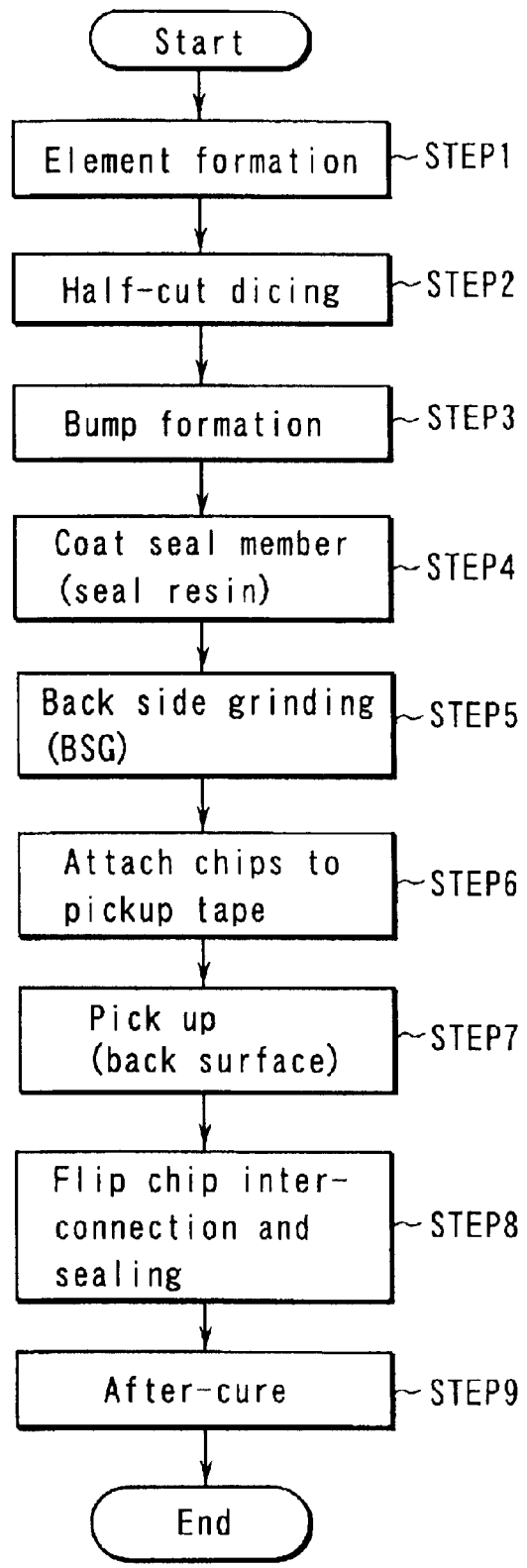
FIG. 34 is a flowchart for illustrating a semiconductor device manufacturing method according to the sixteenth embodiment of this invention.

FIGS. 33A to 33H and FIG. 34 illustrate a semiconductor device manufacturing method according to a sixteenth embodiment of this invention, FIGS. 33A to 33H being cross sectional views which sequentially show the manufacturing steps and FIG. 34 being a flowchart thereof.

Figure 33A:
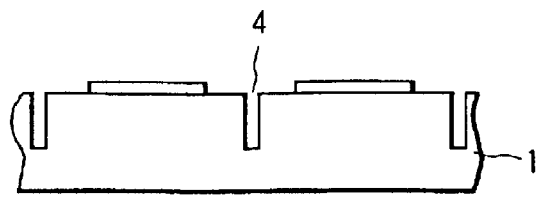
FIGS. 33A to 33H are cross sectional views sequentially showing the manufacturing steps, for illustrating a semiconductor device manufacturing method according to a sixteenth embodiment of this invention.
Figure 33B:
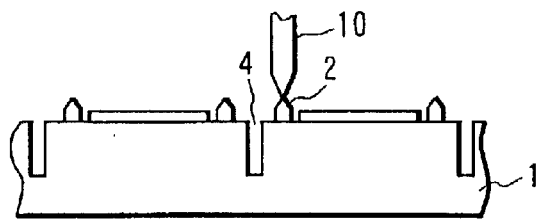
Figure 33C:
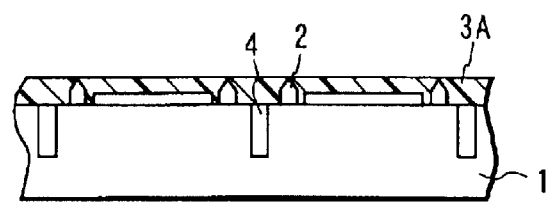
Figure 33D:
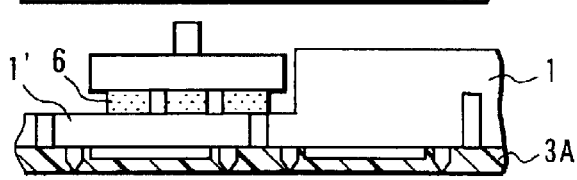
Figure 33E:
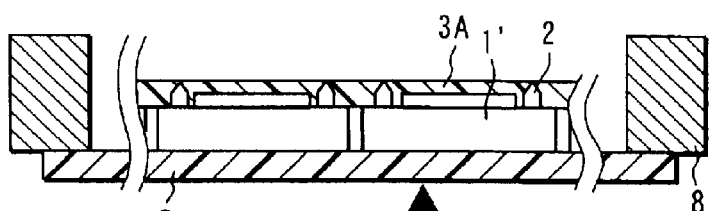
Figure 33F:
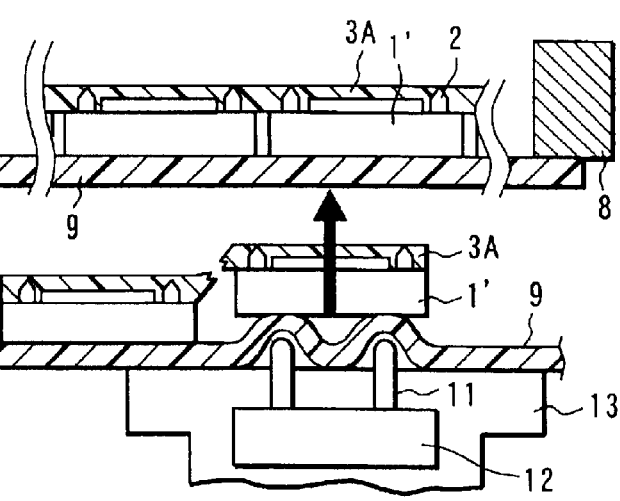
Figure 33G:
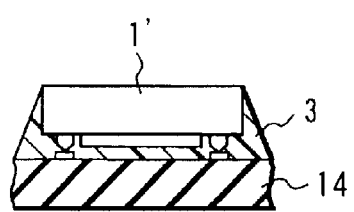
Figure 33H:
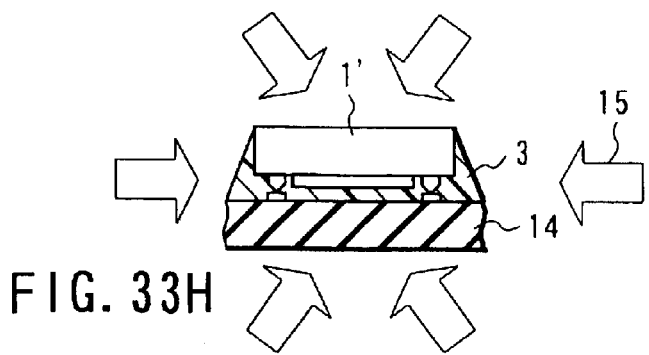

The sixteenth embodiment is similar to the fifteenth embodiment except that an after-cure step (indicated by an arrow 15) is performed to cure the seal resin 3 (STEP9) as shown in FIG. 3H after the operation of mounting the chip 1' on the base board 14 and the resin-sealing operation are simultaneously performed in the step (STEP8) shown in FIG. 33G.

Since the other steps are the same as those of the fifteenth embodiment, the same symbols are attached to like portions and the detail explanation thereof is omitted.

With the above manufacturing method, substantially the same operation and effect as those of the fifteenth embodiment can be attained.

[Seventeenth Embodiment]

Figure 36:
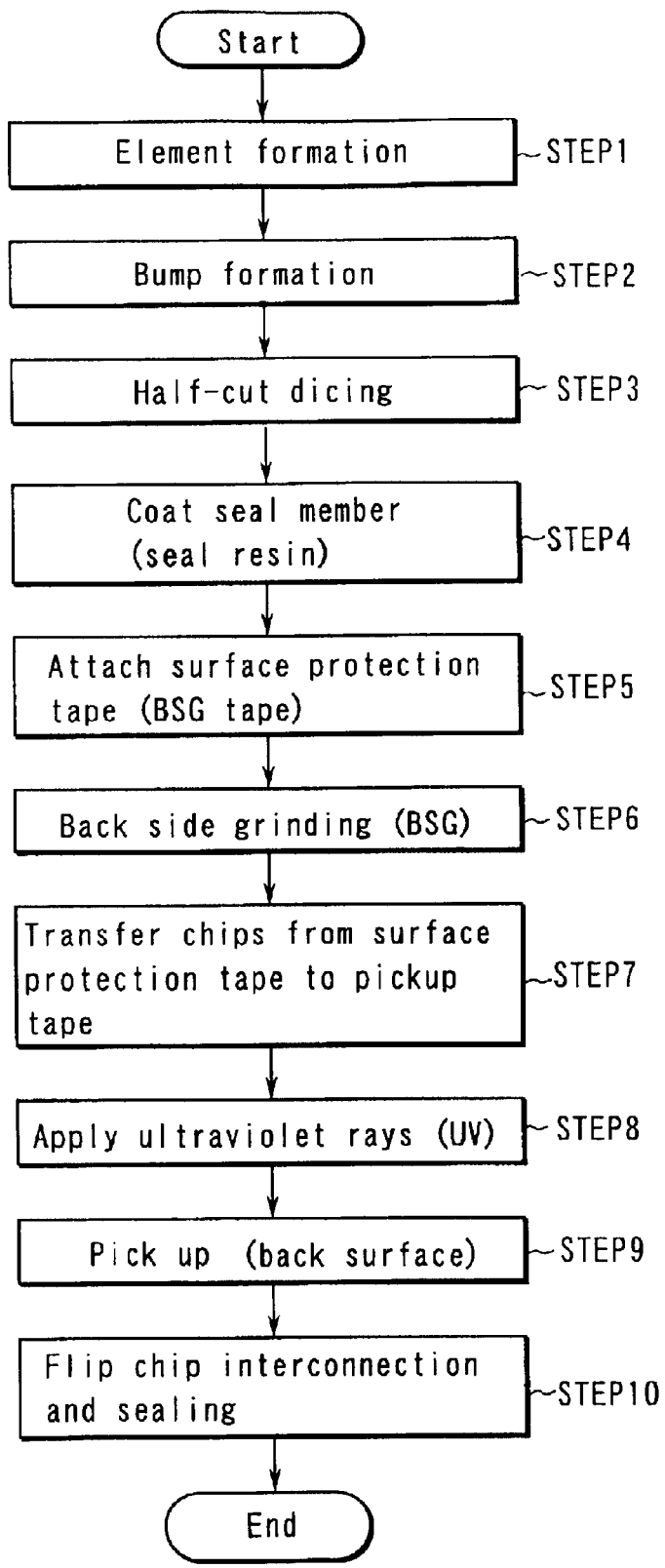
FIG. 36 is a flowchart for illustrating a semiconductor device manufacturing method according to the seventeenth embodiment of this invention.

FIGS. 35A to 35I and FIG. 36 illustrate a semiconductor device manufacturing method according to a seventeenth embodiment of this invention, FIGS. 35A to 35I being cross sectional views which sequentially show the manufacturing steps and FIG. 36 being a flowchart thereof.

First, various elements are formed on a semiconductor substrate (wafer) by a known process (STEP1).

Next, as shown in FIG. 35A, bumps 2 are formed on the main surface of the wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 35B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Next, as shown in FIG. 35C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 35D, a surface protection tape (BSG tape) 5 is attached to the seal member 3A (STEPS) and, as shown in FIG. 35E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 35F, the back surfaces of the discretely divided chips 1' are positioned with respect to and adhered to an ultraviolet (UV) curing pickup tape 9UV mounted on a flat ring 8 and then the surface protection tape 5 is separated. As a result, the individual chips 1 are transferred from the surface protection tape 5 to the pickup tape 9UV (STEP7).

After this, as shown in FIG. 35G, ultraviolet rays are applied from a light source 16 to the pickup tape 9UV to cure the same and lower the viscosity thereof (STEP8).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 35H, a vacuum is drawn on the inside of a backup holder 13 of the pickup device to attract and fix the pickup tape 9UV to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9UV disposed between the thrust pins and the chip so that the corner portions of the chip 1' will be separated from the pickup tape 9UV. Then, the chip 1' is picked up by attracting and separating the element forming surface side of the chip 1' by use of a collet (STEP9). At this time, the seal member 3A is pulled off and cut off at a portion corresponding to the groove 4.

After this, as shown in FIG. 35I, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP10).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. On the other hand, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

Further, since the viscosity of the pickup tape 9UV is lowered by applying ultraviolet rays thereto and curing the same, the pickup operation can be easily performed.

[Eighteenth Embodiment]

Figure 37A:
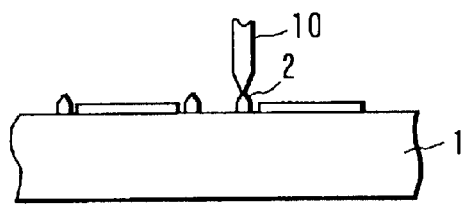
FIGS. 37A to 37J are cross sectional views sequentially showing the manufacturing steps, for illustrating a semiconductor device manufacturing method according to an eighteenth embodiment of this invention.
Figure 37D:
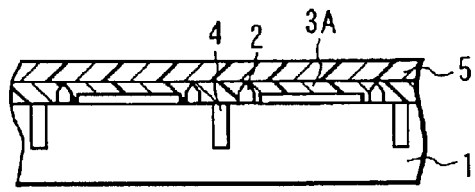
Figure 37B:
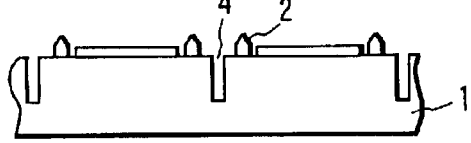
Figure 37E:
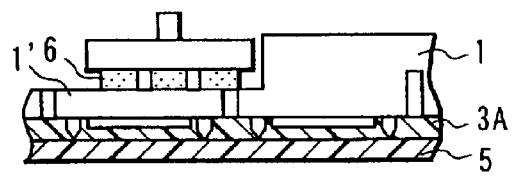
Figure 37C:
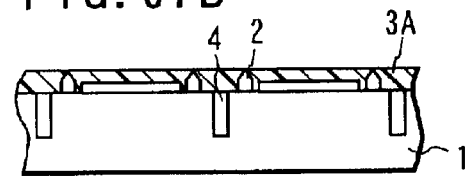
Figure 37F:
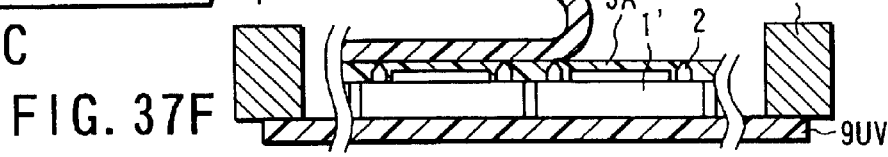
Figure 37G:
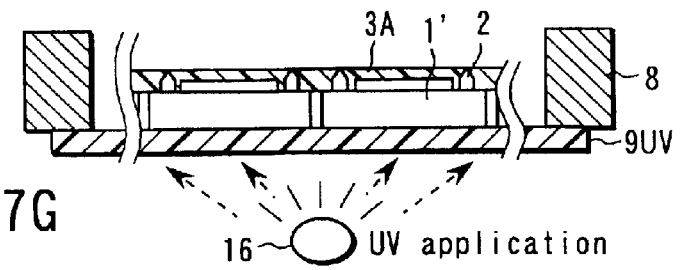
Figure 37H:
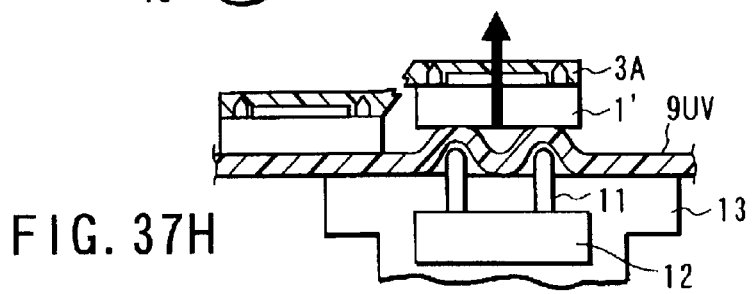
Figure 37I:
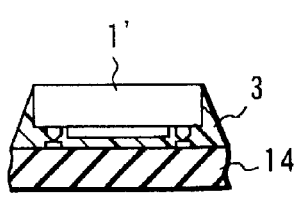
Figure 37J:
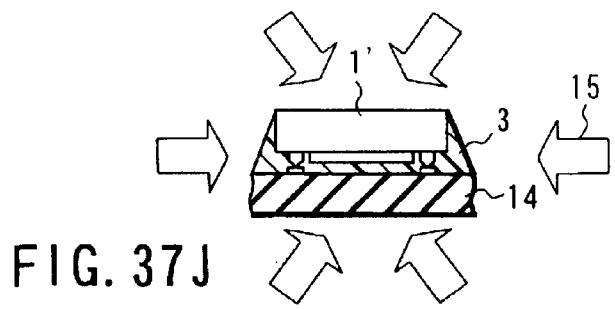
Figure 38:
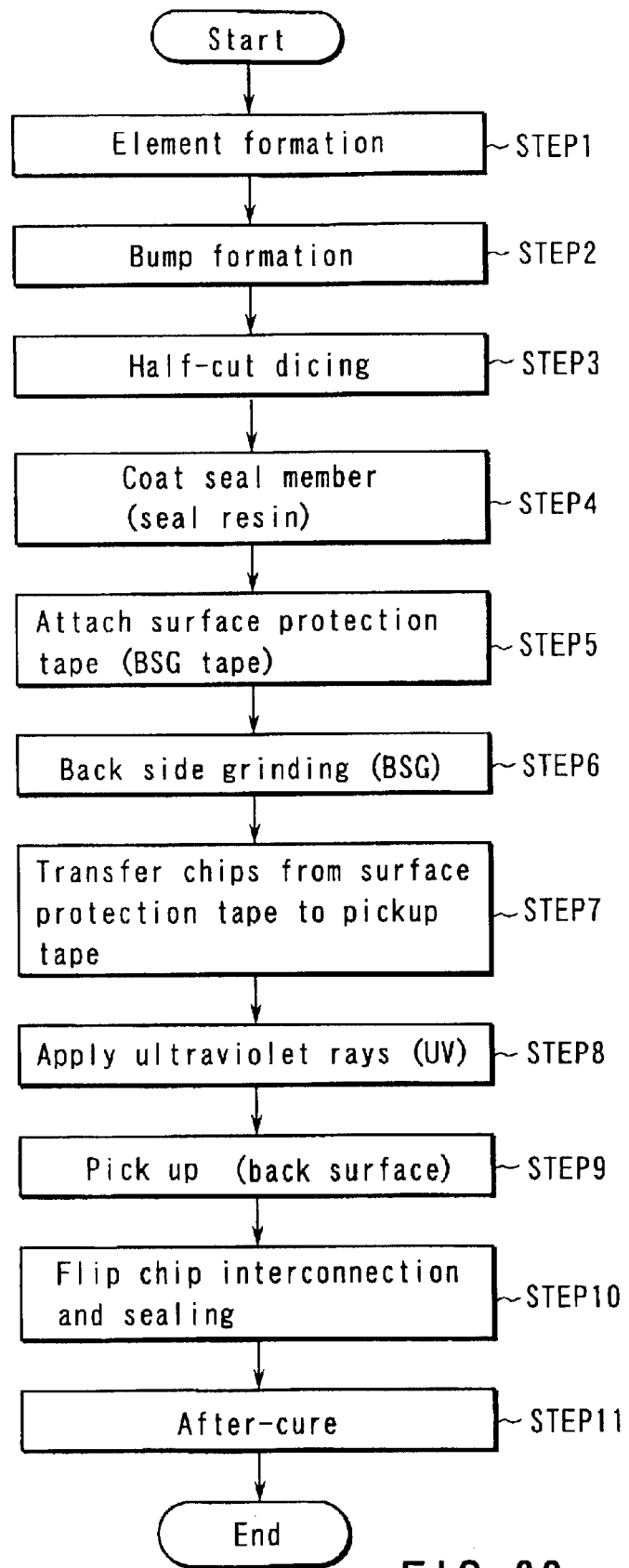
FIG. 38 is a flowchart for illustrating a semiconductor device manufacturing method according to the eighteenth embodiment of this invention.

FIGS. 37A to 37J and FIG. 38 illustrate a semiconductor device manufacturing method according to an eighteenth embodiment of this invention, FIGS. 37A to 37J being cross sectional views which sequentially show the manufacturing steps and FIG. 38 being a flowchart thereof.

The eighteenth embodiment is similar to the seventeenth embodiment except that an after-cure step (indicated by an arrow 15) is performed to cure the seal resin 3 (STEP11) as shown in FIG. 37J after the operation of mounting the chip 1' on the base board 14 and the resin-sealing operation are simultaneously performed in the step (STEP10) shown in FIG. 37I.

Since the other steps are the same as those of the seventeenth embodiment, the same symbols are attached to like portions and the detail explanation thereof is omitted.

With the above manufacturing method, substantially the same operation and effect as those of the seventeenth embodiment can be attained.

[Nineteenth Embodiment]

Figure 40:
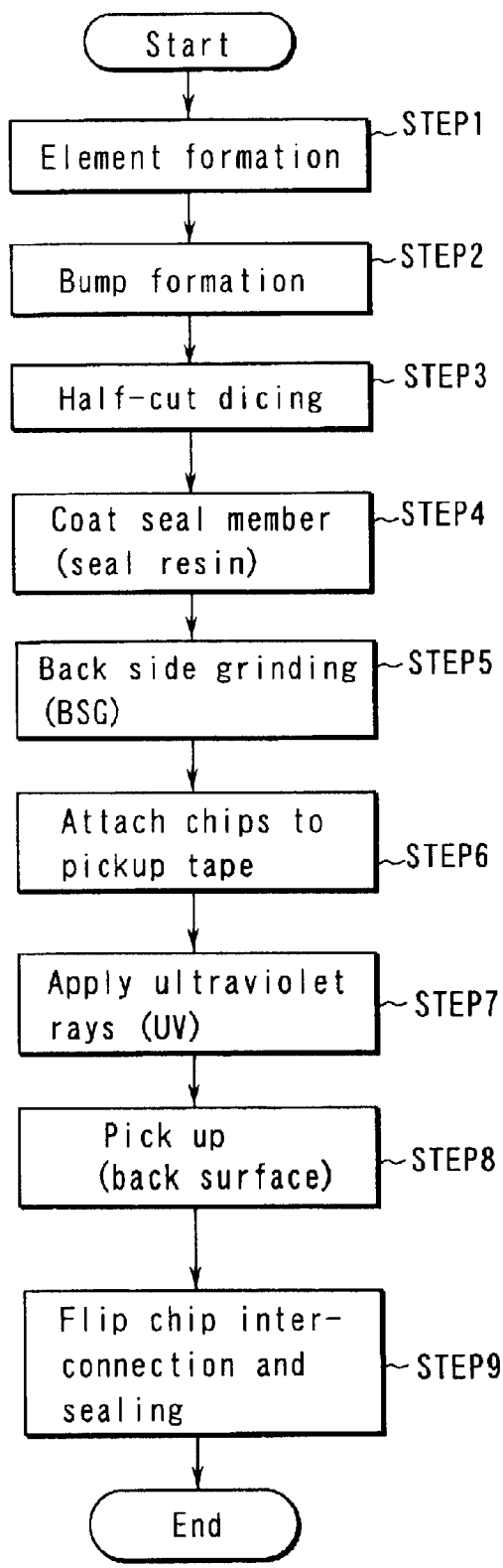
FIG. 40 is a flowchart for illustrating a semiconductor device manufacturing method according to the nineteenth embodiment of this invention.

FIGS. 39A to 39H and FIG. 40 illustrate a semiconductor device manufacturing method according to a nineteenth embodiment of this invention, FIGS. 39A to 39H being cross sectional views which sequentially show the manufacturing steps and FIG. 40 being a flowchart thereof.

First, various elements are formed on a semiconductor substrate (wafer) by a known process (STEP1).

Next, as shown in FIG. 39A, bumps 2 are formed on the main surface of the wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 39B, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP3).

Next, as shown in FIG. 39C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 39D, a back side grinding process (STEP5) of the wafer 1 is performed by use of a grinder 6 to make the wafer 1 thin, and at the same time, divide the wafer into discrete chips 1' (dicing before grinding).

After the end of grinding, as shown in FIG. 39E, the back surfaces of the discretely divided chips 1' are positioned with respect to and adhered to an ultraviolet (UV) curing pickup tape 9UV mounted on a flat ring 8. As a result, the individual chips 1 are transferred to the pickup tape 9Uv (STEP6).

After this, as shown in FIG. 39F, ultraviolet rays are applied (STEP7) to the pickup tape 9UV to cure the same and lower the viscosity thereof. Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 39G, a vacuum is drawn on the inside of a backup holder 13 of the pickup device to attract and fix the pickup tape 9UV to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9UV disposed between the thrust pins and the chip so that the corner portions of the chip 1' will be separated from the pickup tape 9UV. Then, the chip 1' is picked up by attracting and separating the element forming surface side of the chip 1' by use of a collet (STEP8). At this time, the seal member 3A is pulled off and cut off at a portion corresponding to the groove 4.

After this, as shown in FIG. 39H, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP9).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

Further, since the viscosity of the pickup tape 9UV is lowered by applying ultraviolet rays thereto and curing the same, the pickup operation can be easily performed.

[Twentieth Embodiment]

Figure 42:
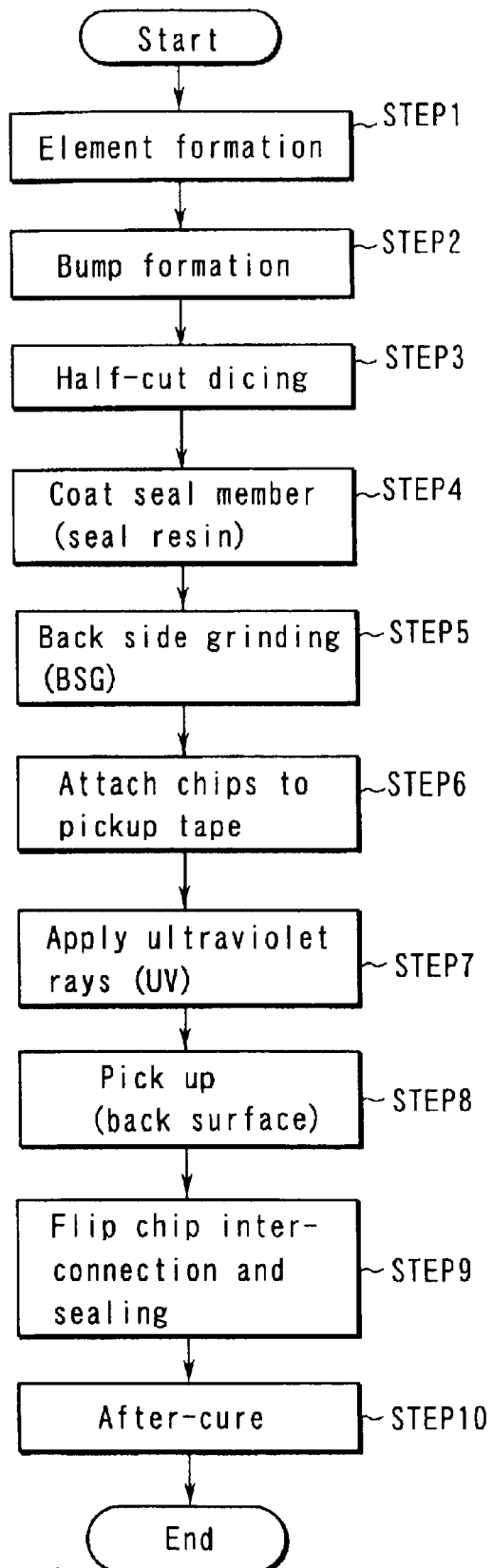
FIG. 42 is a flowchart for illustrating a semiconductor device manufacturing method according to the twentieth embodiment of this invention.

FIGS. 41A to 41I and FIG. 42 illustrate a semiconductor device manufacturing method according to a twentieth embodiment of this invention, FIGS. 41A to 41I being cross sectional views which sequentially show the manufacturing steps and FIG. 42 being a flowchart thereof.

Figure 41A:
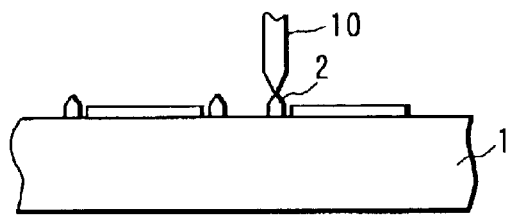
FIGS. 41A to 41I are cross sectional views sequentially showing the manufacturing steps, for illustrating a semiconductor device manufacturing method according to a twentieth embodiment of this invention.
Figure 41C:
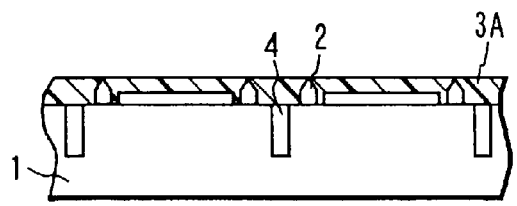
Figure 41B:
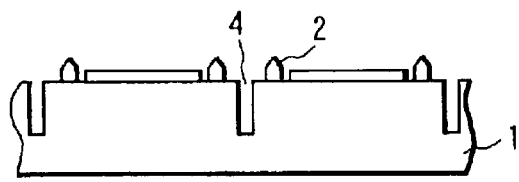
Figure 41D:
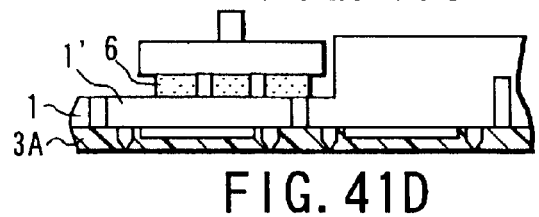
Figure 41E:
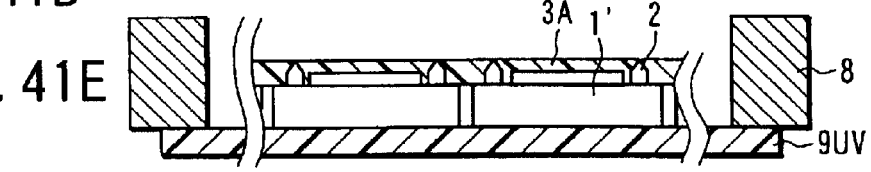
Figure 41F:
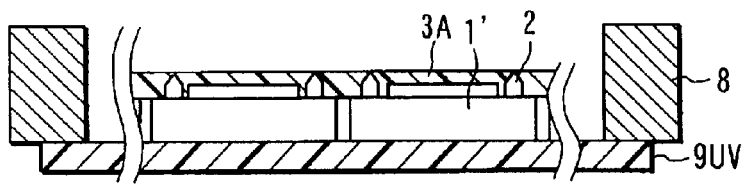
Figure 41G:
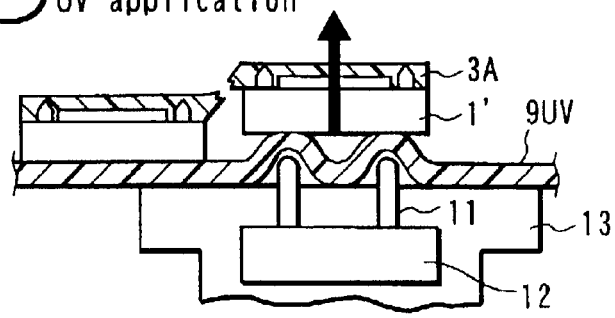
Figure 41I:
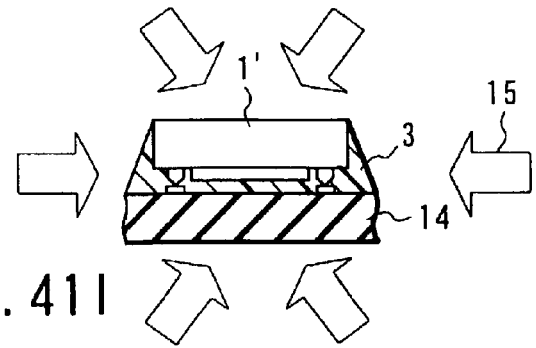
Figure 41H:
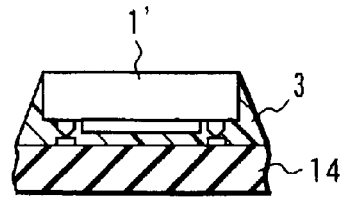

The twentieth embodiment is similar to the nineteenth embodiment except that an after-cure step (indicated by an arrow 15) is performed to cure the seal resin 3 (STEP10) as shown in FIG. 41I after the operation of mounting the chip 1' on the base board 14 and the resin-sealing operation are simultaneously performed in the step (STEP9) shown in FIG. 41H.

Since the other steps are the same as those of the nineteenth embodiment, the same symbols are attached to like portions and the detailed explanation thereof is omitted.

With the above manufacturing method, substantially the same operation and effect as those of the nineteenth embodiment can be attained.

[Twenty-first Embodiment]

Figure 43A:
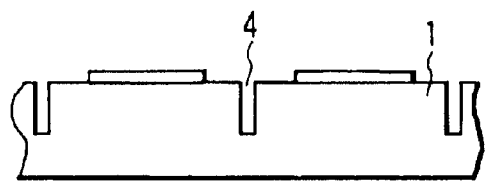
FIGS. 43A to 43I are cross sectional views sequentially showing the manufacturing steps, for illustrating a semiconductor device manufacturing method according to a twenty-first embodiment of this invention.
Figure 43D:
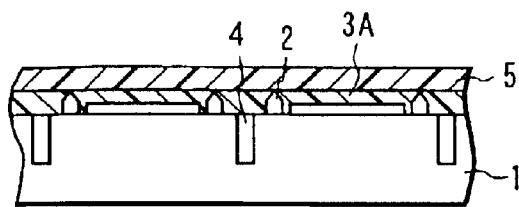
Figure 43B:
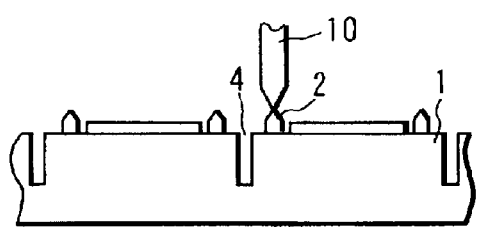
Figure 43E:
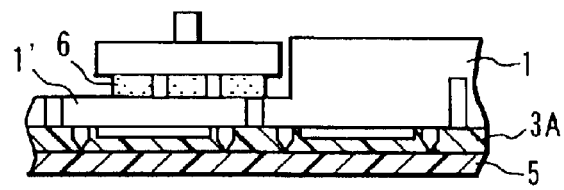
Figure 43C:
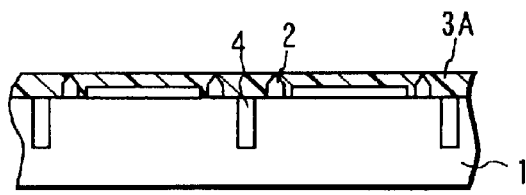
Figure 43F:
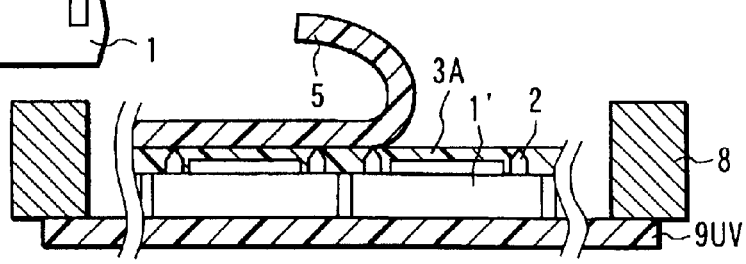
Figure 43G:
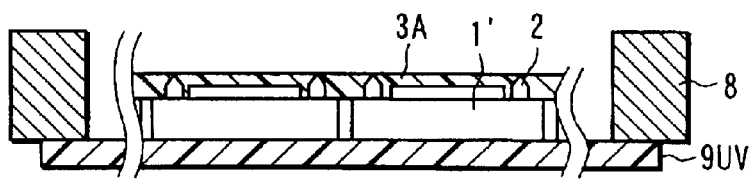
Figure 43H:
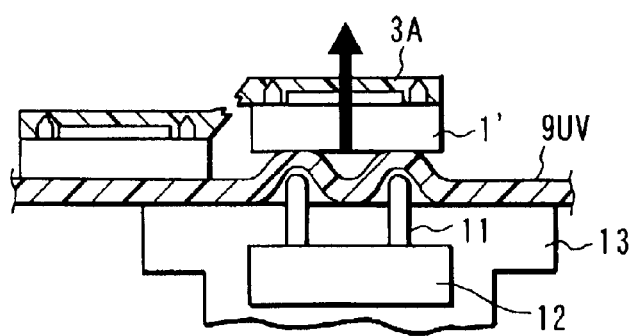
Figure 43I:
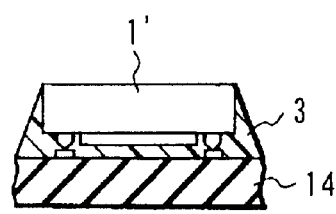
Figure 44:
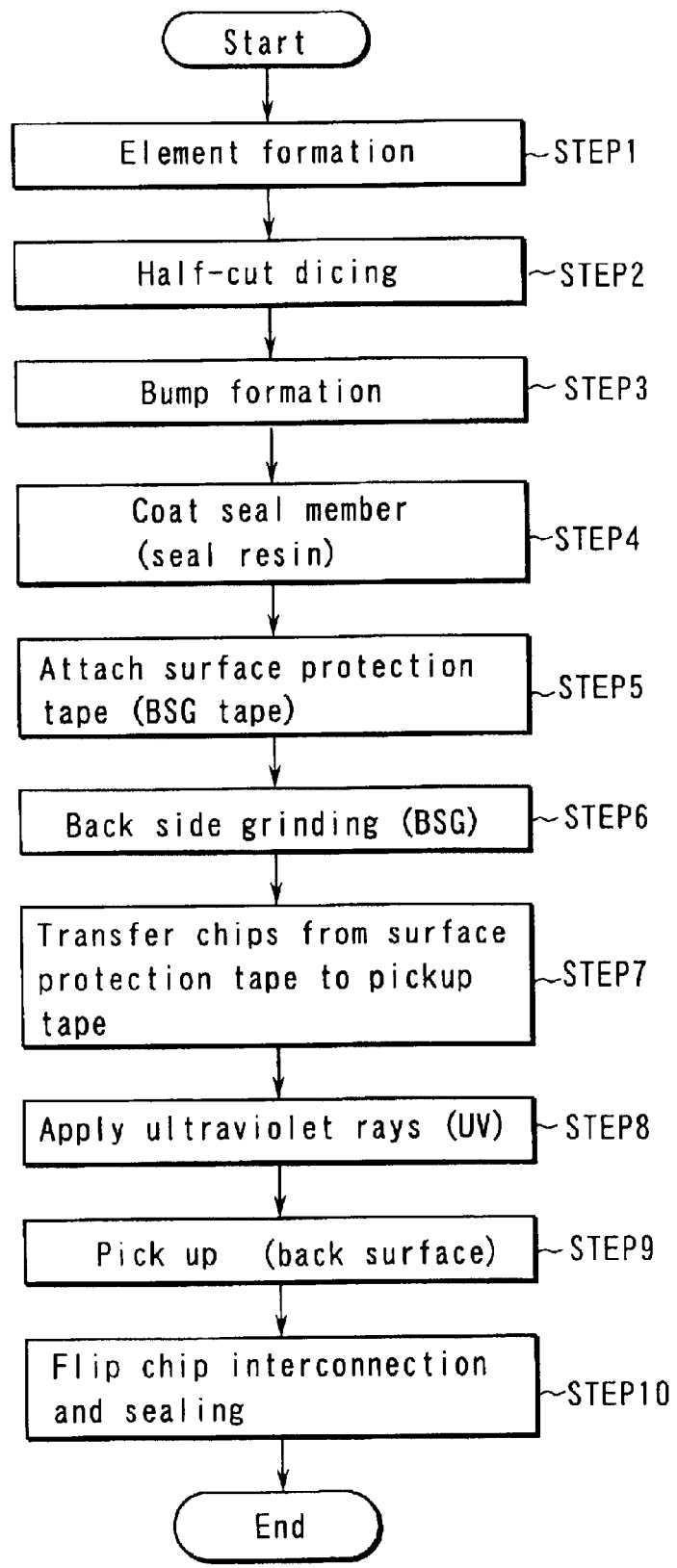
FIG. 44 is a flowchart for illustrating a semiconductor device manufacturing method according to the twenty-first embodiment of this invention.

FIGS. 43A to 43I and FIG. 44 illustrate a semiconductor device manufacturing method according to a twenty-first embodiment of this invention, FIGS. 43A to 43I being cross sectional views which sequentially show the manufacturing steps and FIG. 44 being a flowchart thereof.

First, various elements are formed on a semiconductor substrate (wafer) by a known process (STEP1).

Next, as shown in FIG. 43A, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 43B, bumps 2 are formed on the main surface portion of the wafer 1 on and in which the elements and grooves have been formed (STEP3). In this example, a case wherein stud bumps are formed is explained as an example and the bumps 2 which are electrically connected to the elements by use of capillaries 10 are formed.

Next, as shown in FIG. 43C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin.

After this, as shown in FIG. 43D, a surface protection tape (BSG tape) 5 is attached to the seal member 3A (STEP5) and, as shown in FIG. 43E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 43F, the back surfaces of the discretely divided chips 1' are positioned with respect to and adhered to an ultraviolet (UV) curing pickup tape 9UV mounted on a flat ring 8 and then the surface protection tape 5 is separated. As a result, the individual chips 1 are transferred from the surface protection tape 5 to the pickup tape 9UV (STEP7).

After this, as shown in FIG. 43G, ultraviolet rays are applied from a light source 16 to the pickup tape 9UV to cure the same and lower the viscosity thereof (STEP8).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 43H, a vacuum is drawn on the inside of a backup holder 13 of the pickup device to attract and fix the pickup tape 9UV to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9UV disposed between the thrust pins and the chip so that the corner portions of the chip 1' will be separated from the pickup tape 9UV. Then, the chip 1' is picked up by attracting and separating the element forming surface side of the chip 1' by use of a collet (STEP9). At this time, the seal member 3A is pulled off and cut off at a portion corresponding to the groove 4.

After this, as shown in FIG. 43I, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP10).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. On the other hand, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

Further, since the viscosity of the pickup tape 9UV is lowered by applying ultraviolet rays thereto and curing the same, the pickup operation can be easily performed.

[Twenty-second Embodiment]

Figure 46:
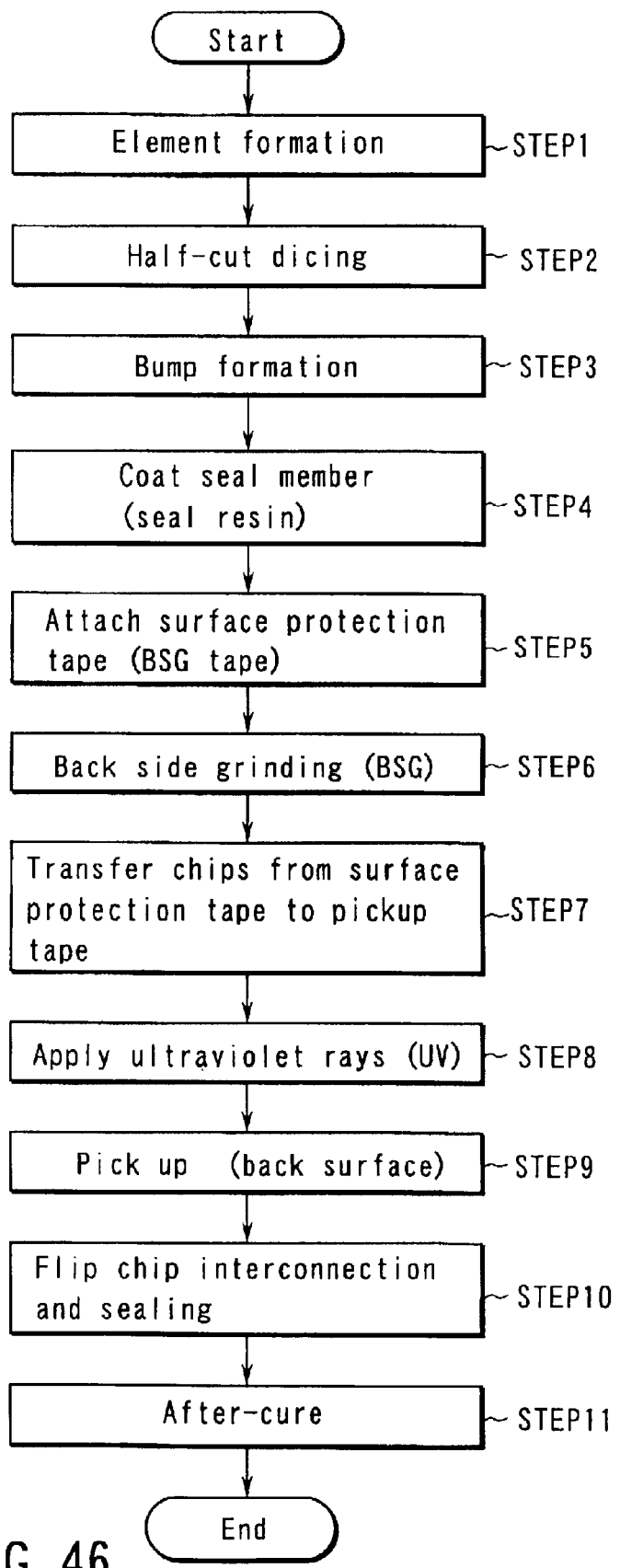
FIG. 46 is a flowchart for illustrating a semiconductor device manufacturing method according to the twenty-second embodiment of this invention.

FIGS. 45A to 45J and FIG. 46 illustrate a semiconductor device manufacturing method according to a twenty-second embodiment of this invention, FIGS. 45A to 45J being cross sectional views which sequentially show the manufacturing steps and FIG. 46 being a flowchart thereof.

The twenty-second embodiment is similar to the twenty-first embodiment except that an after-cure step (indicated by an arrow 15) is performed to cure the seal resin 3 (STEP11) as shown in FIG. 45J after the operation of mounting the chip 1' on the base board 14 and the resin-sealing operation are simultaneously performed in the step (STEP10) shown in FIG. 45I.

Since the other steps are the same as those of the twenty-first embodiment, the same symbols are attached to like portions and the detail explanation thereof is omitted.

With the above manufacturing method, substantially the same operation and effect as those of the twenty-first embodiment can be attained.

[Twenty-third Embodiment]

Figure 47A:
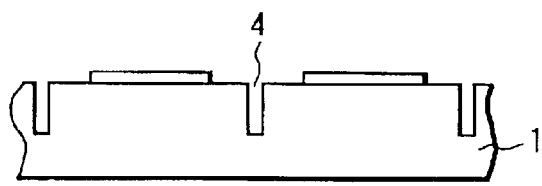
FIGS. 47A to 47H are cross sectional views sequentially showing the manufacturing steps, for illustrating a semiconductor device manufacturing method according to a twenty-third embodiment of this invention.
Figure 47C:
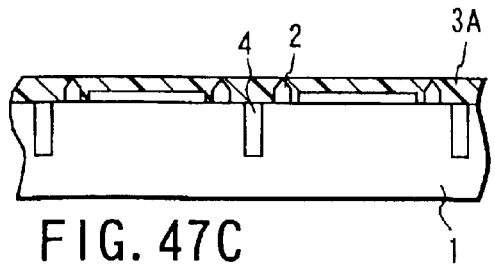
Figure 47B:
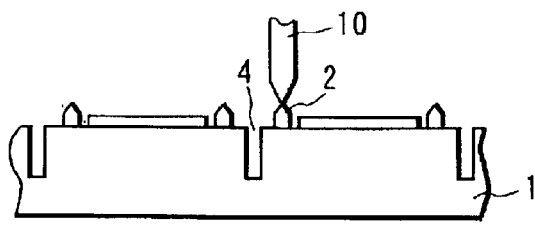
Figure 47D:
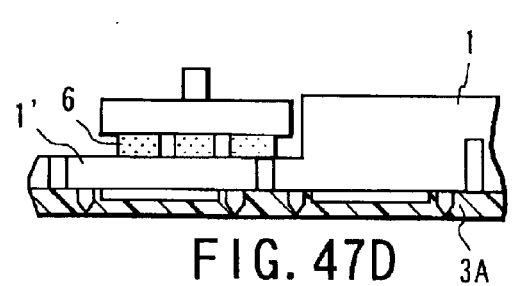
Figure 47E:
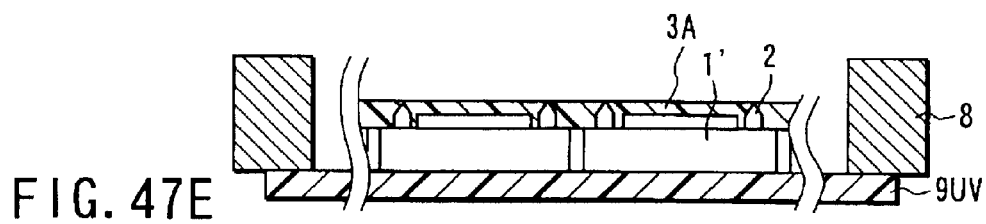
Figure 47F:
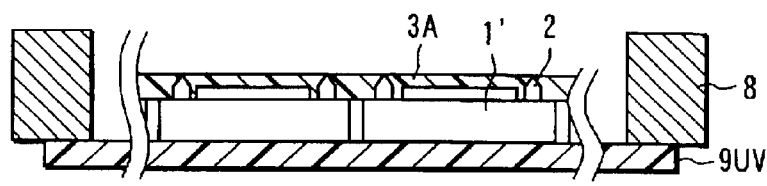
Figure 47G:
Figure 47G:
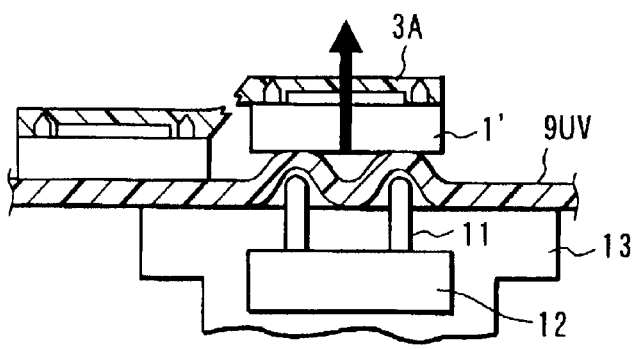
Figure 47H:
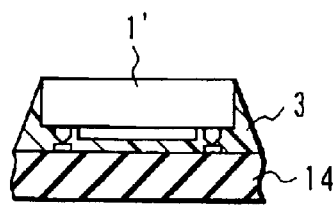
Figure 48:
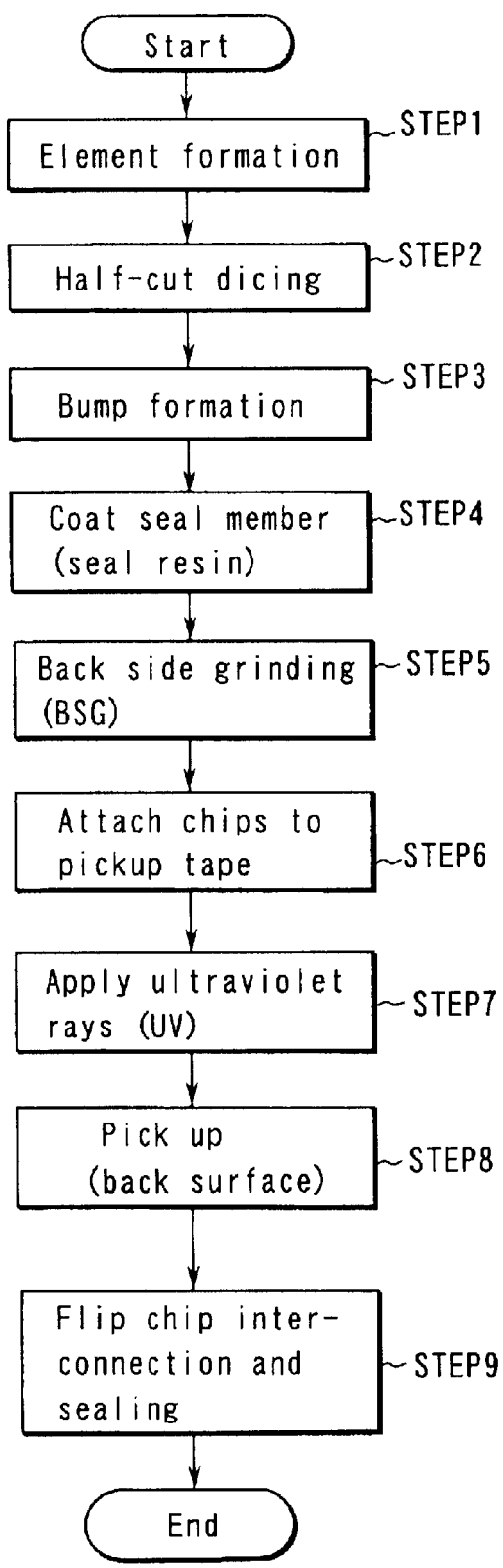
FIG. 48 is a flowchart for illustrating a semiconductor device manufacturing method according to the twenty-third embodiment of this invention.

FIGS. 47A to 47H and FIG. 48 illustrate a semiconductor device manufacturing method according to a twenty-third embodiment of this invention, FIGS. 47A to 47H being cross sectional views which sequentially show the manufacturing steps and FIG. 48 being a flowchart thereof.

First, various elements are formed on a semiconductor substrate (wafer) by a known process (STEP1).

Next, as shown in FIG. 47A, grooves 4 with depths which do not reach the back surface of the wafer are formed in the wafer 1 on the element forming surface side thereof along dicing lines or chip dividing lines by use of a diamond scriber, diamond blade, laser scriber or the like, that is, a so-called half-cut dicing process is performed (STEP2).

After this, as shown in FIG. 47B, bumps 2 are formed on the main surface portion of the wafer 1 on and in which the elements and grooves have been formed (STEP3). In this example, a case wherein stud bumps are formed is explained as an example and the bumps 2 which are electrically connected to the elements by use of capillaries 10 are formed.

Next, as shown in FIG. 47C, the element forming surface side of the wafer 1 is coated with a seal member 3A by, for example, spin-coating liquid resin such as epoxy-series resin or silica-containing resin to bury the bumps 2 therein (STEP4). It is preferable that the seal member 3A is melted at temperatures of approximately 100° C. to 130° C. Further, the seal member can also be formed by attaching sheet-form resin. After this, as shown in FIG. 47D, a back side grinding process (STEP5) of the wafer 1 is performed by use of a grinder 6 to make the wafer 1 thin, and at the same time, divide the wafer into discrete chips 1' (dicing before grinding).

After the end of grinding, as shown in FIG. 47E, the back surfaces of the discretely divided chips 1' are positioned with respect to and adhered to an ultraviolet (UV) curing pickup tape 9UV mounted on a flat ring 8 (STEP6).

After this, as shown in FIG. 47F, ultraviolet rays are applied from a light source 16 to the pickup tape 9UV to cure the same and lower the viscosity thereof (STEP7).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 47G, a vacuum is drawn on the inside of a backup holder 13 of the pickup device to attract and fix the pickup tape 9UV to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9UV disposed between the thrust pins and the chip so that the corner portions of the chip 1' will be separated from the pickup tape 9UV. Then, the chip 1' is picked up by attracting and separating the element forming surface side of the chip 1' by use of a collet (STEP8). At this time, the seal member 3A is pulled off and cut off at a portion corresponding to the groove 4.

After this, as shown in FIG. 47H, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP9).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Also, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the seal member 3A formed on the element forming surface of the wafer 1 is cut off along a portion corresponding to the groove 4 at the pickup time, the size of the seal member 3A becomes approximately equal to the chip size and the positional deviation between the chip 1' and the seal member 3A can be made small. As a result, it becomes possible to suppress the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

Further, since the viscosity of the pickup tape 9UV is lowered by applying ultraviolet rays thereto and curing the same, the pickup operation can be easily performed.

[Twenty-fourth Embodiment]

Figure 50:
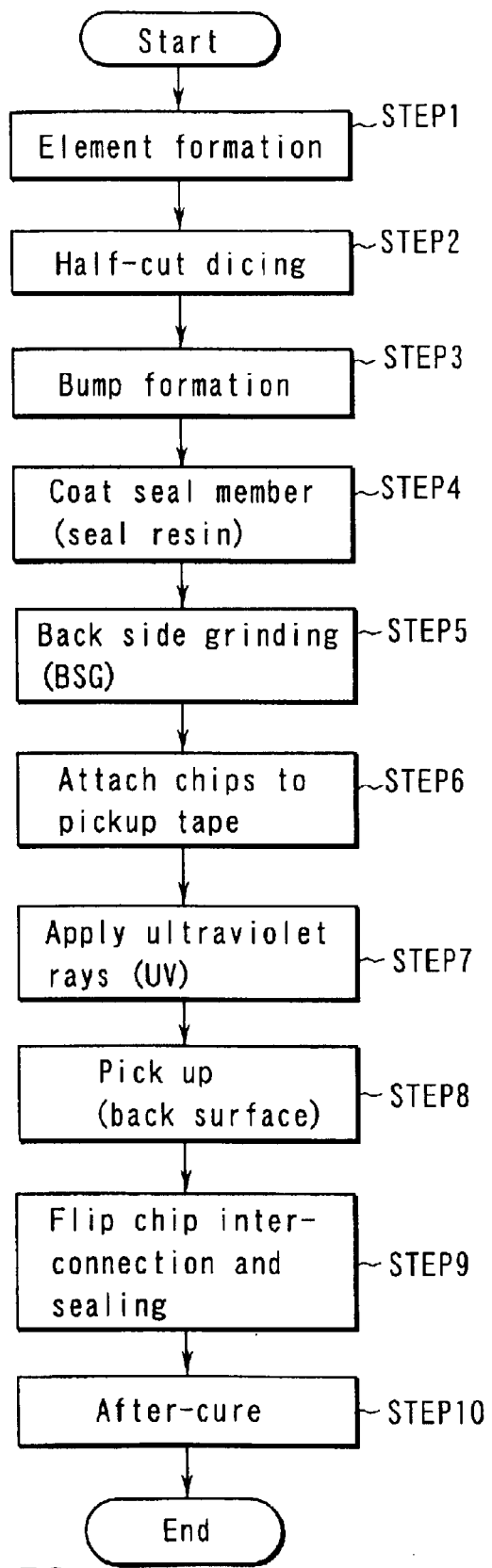
FIG. 50 is a flowchart for illustrating a semiconductor device manufacturing method according to the twenty-fourth embodiment of this invention.

FIGS. 49A to 49I and FIG. 50 illustrate a semiconductor device manufacturing method according to a twenty-fourth embodiment of this invention, FIGS. 49A to 49I being cross sectional views which sequentially show the manufacturing steps and FIG. 50 being a flowchart thereof.

Figure 49A:
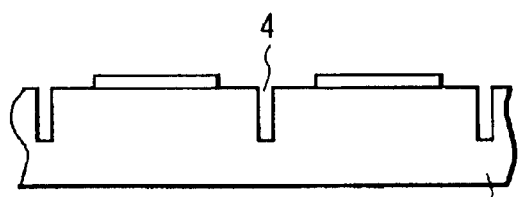
FIGS. 49A to 49I are cross sectional views sequentially showing the manufacturing steps, for illustrating a semiconductor device manufacturing method according to a twenty-fourth embodiment of this invention.
Figure 49B:
Figure 49C:
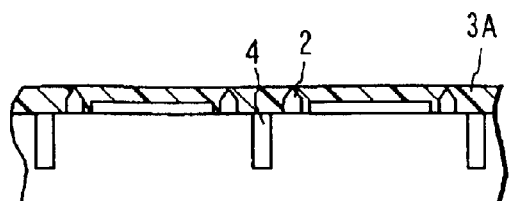
Figure 49D:
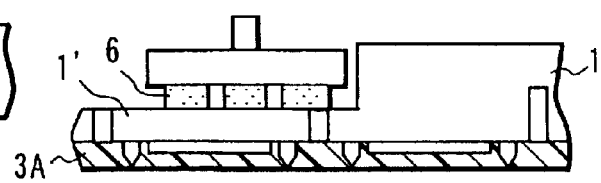
Figure 49E:
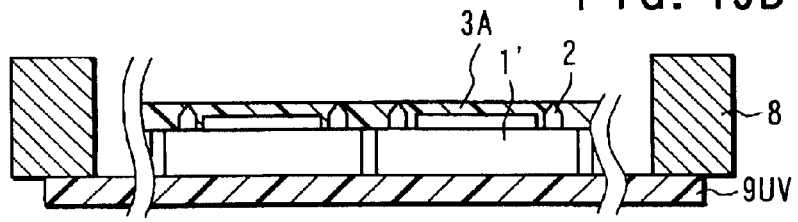
Figure 49F:
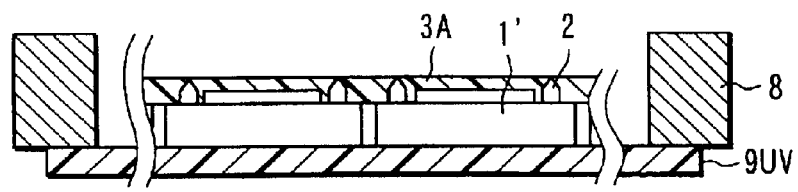
Figure 49G:
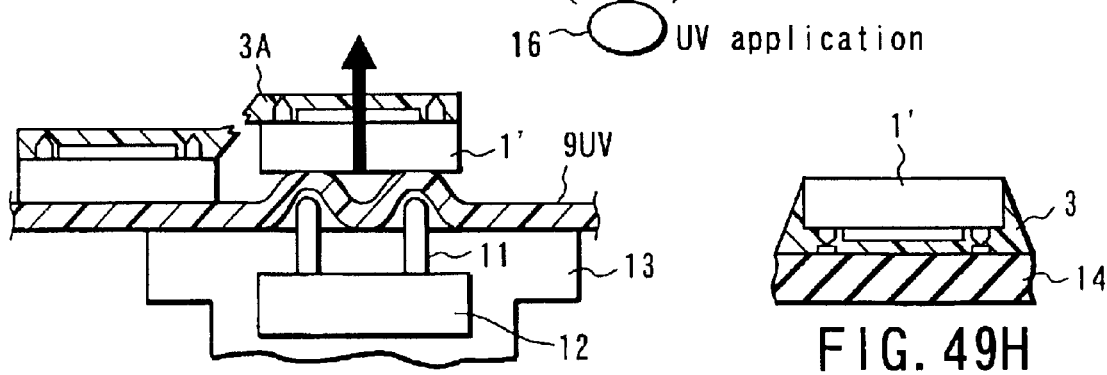
Figure 49H:
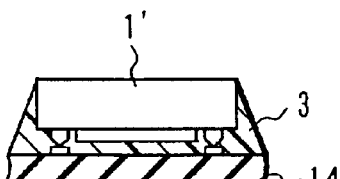
Figure 49I:
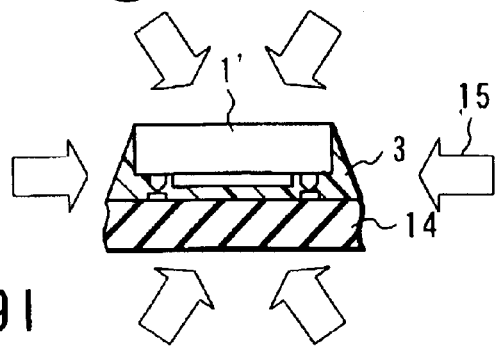

The twenty-fourth embodiment is similar to the twenty-third embodiment except that an after-cure step (indicated by an arrow 15) is performed to cure the seal resin 3 (STEP10) as shown in FIG. 49I after the operation of mounting the chip 1' on the base board 14 and the resin-sealing operation are simultaneously performed in the step (STEP9) shown in FIG. 49H.

Since the other steps are the same as those of the twenty-third embodiment, the same symbols are attached to like portions and the detailed explanation thereof is omitted.

With the above manufacturing method, substantially the same operation and effect as those of the twenty-third embodiment can be attained.

[Twenty-fifth Embodiment]

Figure 51A:
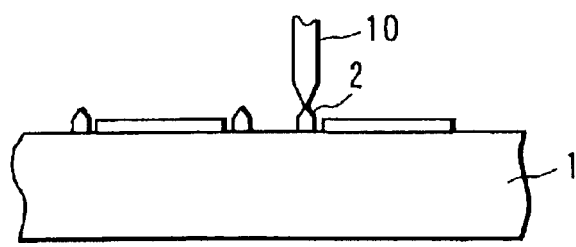
FIGS. 51A to 51G are cross sectional views sequentially showing the manufacturing steps, for illustrating a semiconductor device manufacturing method according to a twenty-fifth embodiment of this invention.
Figure 51B:
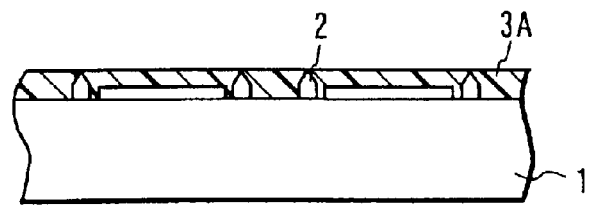
Figure 51C:
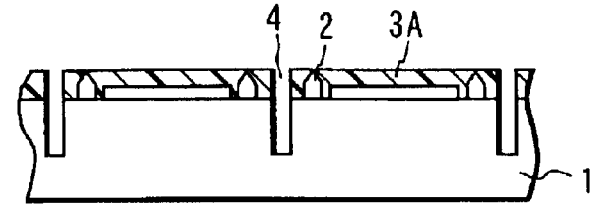
Figure 51D:
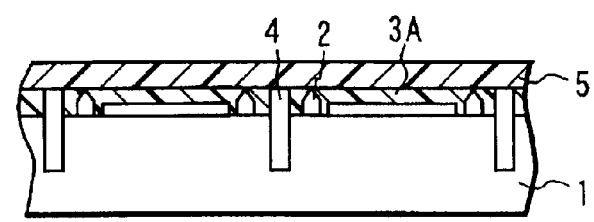
Figure 51E:
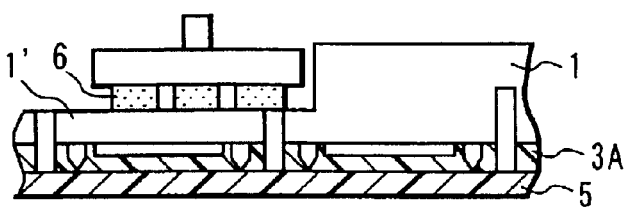
Figure 51F:
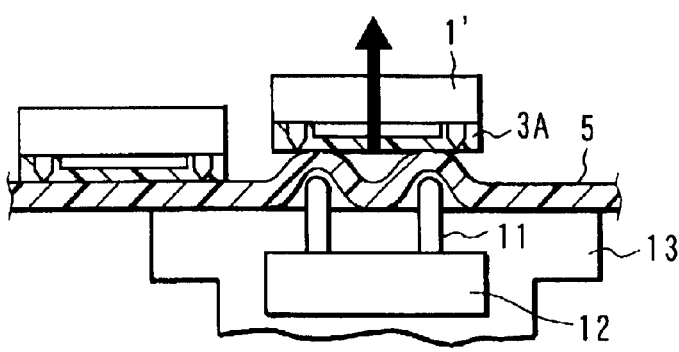
Figure 51G:
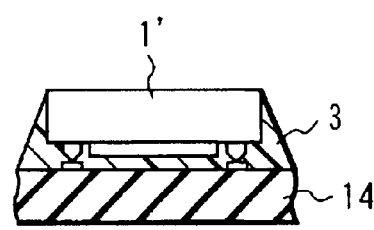
Figure 52:
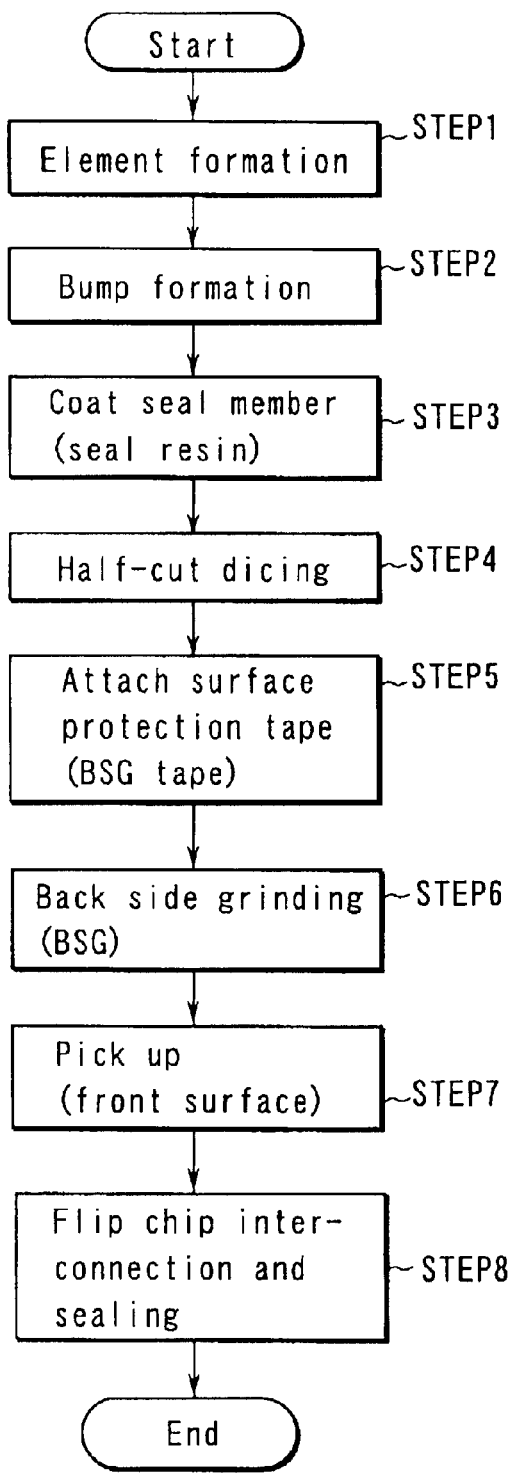
FIG. 52 is a flowchart for illustrating a semiconductor device manufacturing method according to the twenty-fifth embodiment of this invention.

FIGS. 51A to 51G and FIG. 52 illustrate a semiconductor device manufacturing method according to a twenty-fifth embodiment of this invention, FIGS. 51A to 51G being cross sectional views which sequentially show the manufacturing steps and FIG. 52 being a flowchart thereof.

First, various elements are formed on a semiconductor substrate (wafer) by a known process (STEP1).

Next, as shown in FIG. 51A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 51B, the element forming surface side of the wafer 1 is coated with a seal member 3A by, for example, spin-coating liquid resin such as epoxy-series resin or silica-containing resin to bury the bumps 2 therein (STEP3). It is preferable that the seal member 3A is melted at temperatures of approximately 100° C. to 130° C. Further, the seal member can also be formed by attaching sheet-form resin.

As shown in FIG. 51C, in this state, grooves 4 with depths which do not reach the back surface of the wafer 1 are formed in the seal member 3A and wafer 1 along dicing lines or chip dividing lines of the wafer 1 by use of a diamond scriber, diamond blade, laser scriber or the like, that is, a so-called half-wit dicing process is performed After this, as shown in FIG. 51D, a surface protection tape (BSG tape) 5 is attached to the seal member 3A (STEP5) and, as shown in FIG. 51E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 51F, a vacuum is drawn on the inside of a backup holder 13 of a pickup device to attract and fix the surface protection tape 5 to and on the upper surface of the backup holder 13. In this state, a pin holder 12 having thrust pins 11 mounted thereon is raised so as to cause the thrust pins 11 to project from the upper surface of the backup holder 13. As a result, the seal member 3A side of the chip 1' is pushed up in a direction indicated by an arrow with the surface protection tape 5 disposed between the thrust pins and the chip so that the corner portions of the chip 1' will be separated from the surface protection tape 5. Then, the chip 1' is picked up by attracting and separating the back surface side of the chip 1' by use of a suction tool which is called a collet (STEP7). At this time, the seal member 3A is pulled off and cut off at a portion corresponding to the groove 4.

After this, as shown in FIG. 51G, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP8).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Also, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the seal resin (seal member) 3 is formed on the wafer 1 and the half-cut dicing operation is performed with the seal resin and wafer integrally formed and the wafer 1 and seal member 3A are simultaneously cut to form the grooves 4, there occurs no positional deviation between the chip 1' and the seal member 3A. As a result, the size of the seal member 3A becomes approximately equal to the chip size so as to prevent the seal member 3A from creeping on the back surface of the chip at the time of flip chip interconnection. Therefore, a Teflon sheet or the like which is required in the conventional manufacturing method becomes unnecessary and the manufacturing cost can be lowered.

Since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Further, since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

In addition, since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Twenty-sixth Embodiment]

Figure 54:
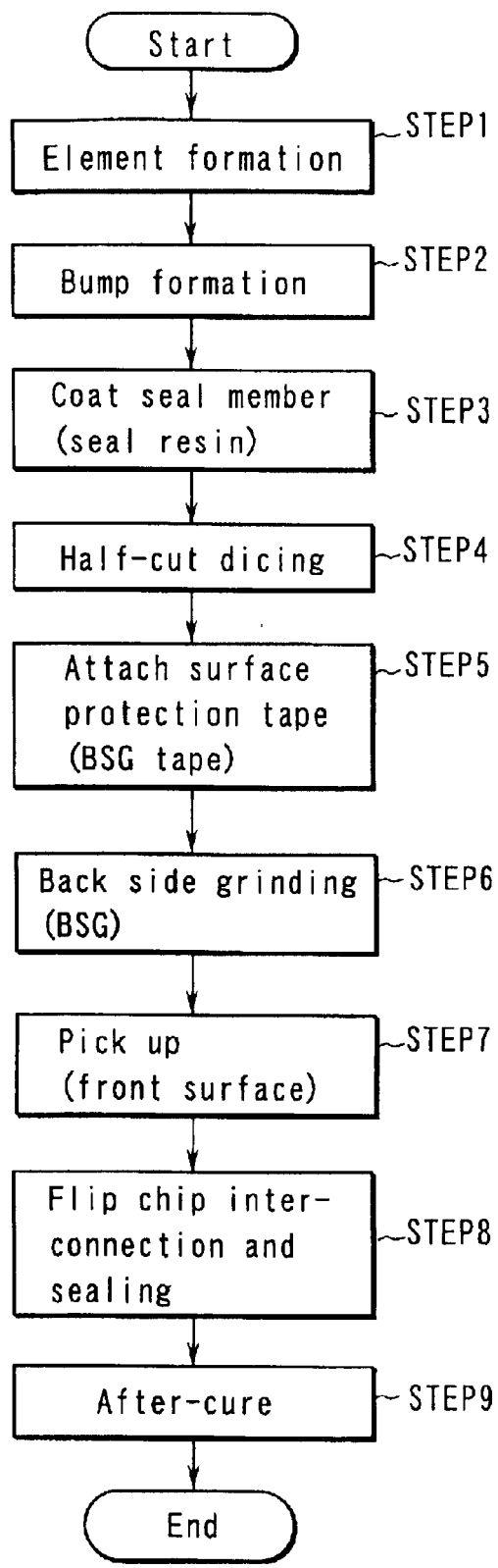
FIG. 54 is a flowchart for illustrating a semiconductor device manufacturing method according to the twenty-sixth embodiment of this invention.

FIGS. 53A to 53H and FIG. 54 illustrate a semiconductor device manufacturing method according to a twenty-sixth embodiment of this invention, FIGS. 53A to 53H being cross sectional views which sequentially show the manufacturing steps and FIG. 54 being a flowchart thereof.

The twenty-sixth embodiment is similar to the twenty-fifth embodiment except that an after-cure step (indicated by an arrow 15) is performed to cure the seal resin 3 (STEP9) as shown in FIG. 53H after the operation of mounting the chip 1' on the base board 14 and the resin-sealing operation are simultaneously performed in the step (STEP8) shown in FIG. 53G.

Since the other steps are the same as those of the twenty-fifth embodiment, the same symbols are attached to like portions and the detailed explanation thereof is omitted.

With the above manufacturing method, substantially the same operation and effect as those of the twenty-fifth embodiment can be attained.

[Twenty-seventh Embodiment]

Figure 55A:
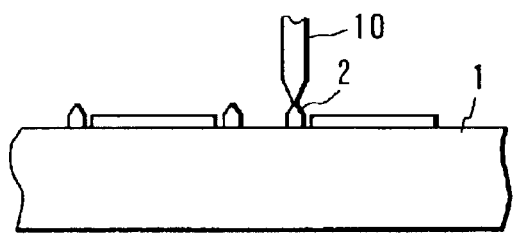
FIGS. 55A to 55H are cross sectional views sequentially showing the manufacturing steps, for illustrating a semiconductor device manufacturing method according to a twenty-seventh embodiment of this invention.
Figure 55D:
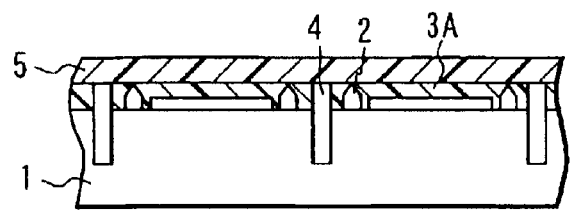
Figure 55B:
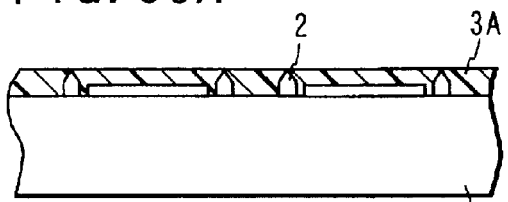
Figure 55E:
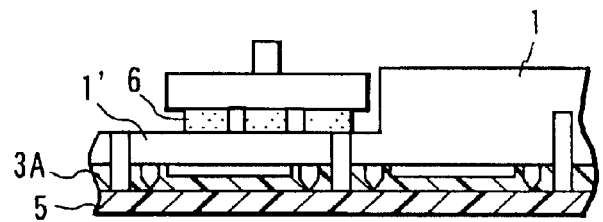
Figure 55C:
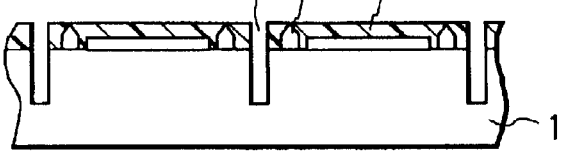
Figure 55F:
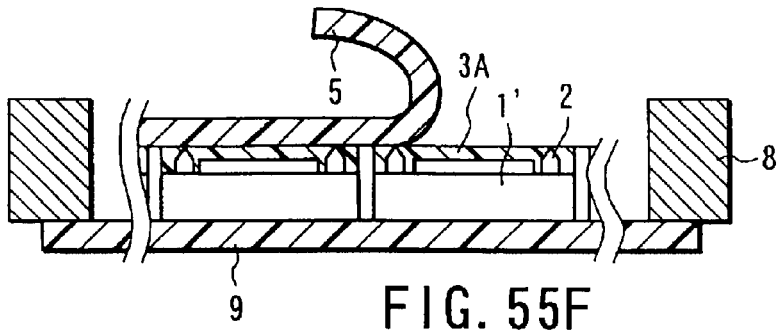
Figure 55G:
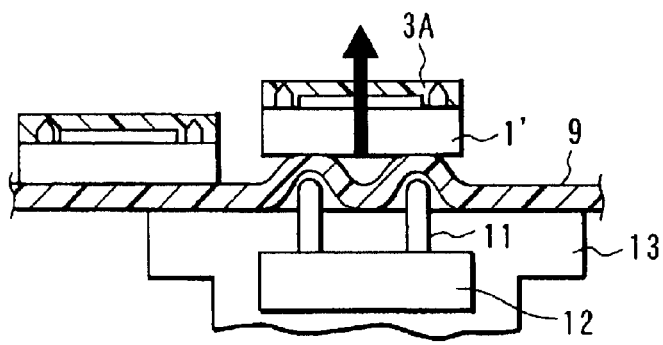
Figure 55H:
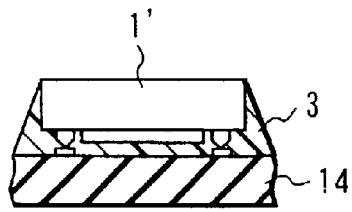
Figure 56:
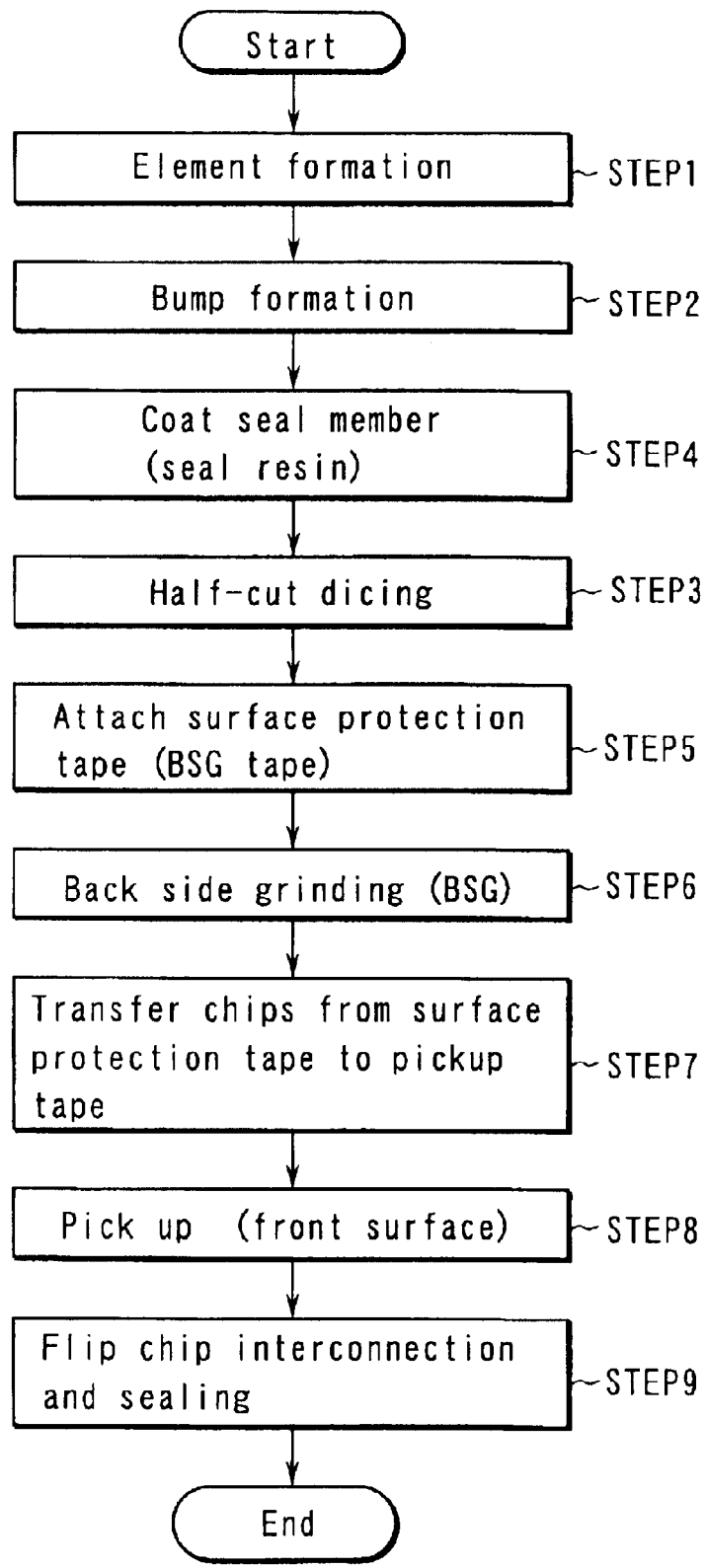
FIG. 56 is a flowchart for illustrating a semiconductor device manufacturing method according to the twenty-seventh embodiment of this invention.

FIGS. 55A to 55H and FIG. 56 illustrate a semiconductor device manufacturing method according to a twenty-seventh embodiment of this invention, FIGS. 55A to 55H being cross sectional views which sequentially show the manufacturing steps and FIG. 56 being a flowchart thereof.

First, various elements are formed on a semiconductor substrate (wafer) by a known process (STEP1).

Next, as shown in FIG. 55A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 55B, the element forming surface side of the wafer 1 is coated with a seal member 3A by, for example, spin-coating liquid resin such as epoxy-series resin or silica-containing resin to bury the bumps 2 therein (STEP3). It is preferable that the seal member 3A is melted at temperatures of approximately 100° C. to 130° C. Further, the seal member can also be formed by attaching sheet-form resin.

In this state, as shown in FIG. 55C, the seal member 3A is cut and grooves 4 with depths which do not reach the back surface of the wafer 1 are formed along dicing lines or chip dividing lines of the wafer 1 by use of a diamond scriber, diamond blade, laser scriber or the like, that is, a so-called half-cut dicing process is performed (STEP4).

After this, as shown in FIG. 55D, a surface protection tape (BSG tape) 5 is attached to the seal member 3A (STEP5) and, as shown in FIG. 55E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 55F, the discretely divided chips 1' are positioned with respect to and adhered to a pickup tape 9 mounted on a flat ring 8 and then the surface protection tape 5 is separated. As a result, the chips 1' are transferred from the surface protection tape 5 to the pickup tape 9 (STEP7).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 55G, a vacuum is drawn on the inside of a backup holder 13 of the pickup device to attract and fix the pickup tape 9 to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9 disposed between the thrust pins and the chip so that the corner portions of the chip 1' will be separated from the pickup tape 9. Then, the chip 1' is picked up by attracting and separating the element forming surface side of the chip 1' by use of a collet (STEP8). At this time, the seal member 3A is pulled off and cut off at a portion corresponding to the groove 4.

After this, as shown in FIG. 55H, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP9).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Also, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the seal resin (seal member) 3 is formed on the wafer 1 and the half-cut dicing process is performed with the seal member and the wafer integrally formed to simultaneously cut the wafer 1 and seal member 3A so as to form the grooves, then there occurs no positional deviation between the chip 1' and the seal member 3A. As a result, the size of the seal member 3A becomes approximately equal to the chip size so as to prevent the seal member 3A from creeping on the back surface of the chip at the time of flip chip interconnection. Therefore, a Teflon sheet or the like which is required in the conventional manufacturing method becomes unnecessary and the manufacturing cost can be lowered.

Further, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Twenty-eighth Embodiment]

Figure 58:
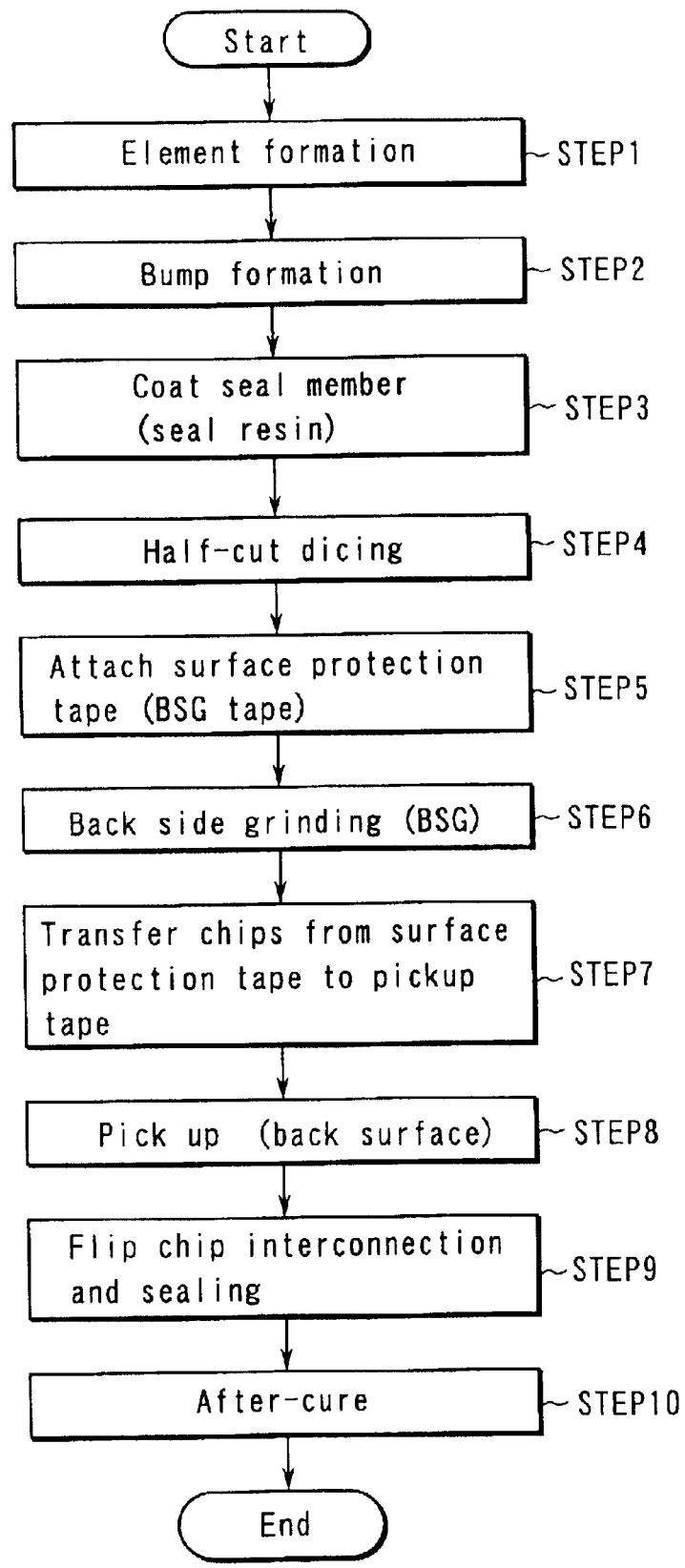
FIG. 58 is a flowchart for illustrating a semiconductor device manufacturing method according to the twenty-eighth embodiment of this invention.

FIGS. 57A to 57I and FIG. 58 illustrate a semiconductor device manufacturing method according to a twenty-eighth embodiment of this invention, FIGS. 57A to 57I being cross sectional views which sequentially show the manufacturing steps and FIG. 58 being a flowchart thereof.

The twenty-eighth embodiment is similar to the twenty-seventh embodiment except that an after-cure step (indicated by an arrow 15) is performed to cure the seal resin 3 (STEP10) as shown in FIG. 57I after the operation of mounting the chip 1' on the base board 14 and the resin-sealing operation are simultaneously performed in the step (STEP9) shown in FIG. 57H.

Since the other steps are the same as those of the twenty-seventh embodiment, the same symbols are attached to like portions and the detailed explanation thereof is omitted.

With the above manufacturing method, substantially the same operation and effect as those of the twenty-seventh embodiment can be attained.

[Twenty-ninth Embodiment]

Figure 60:
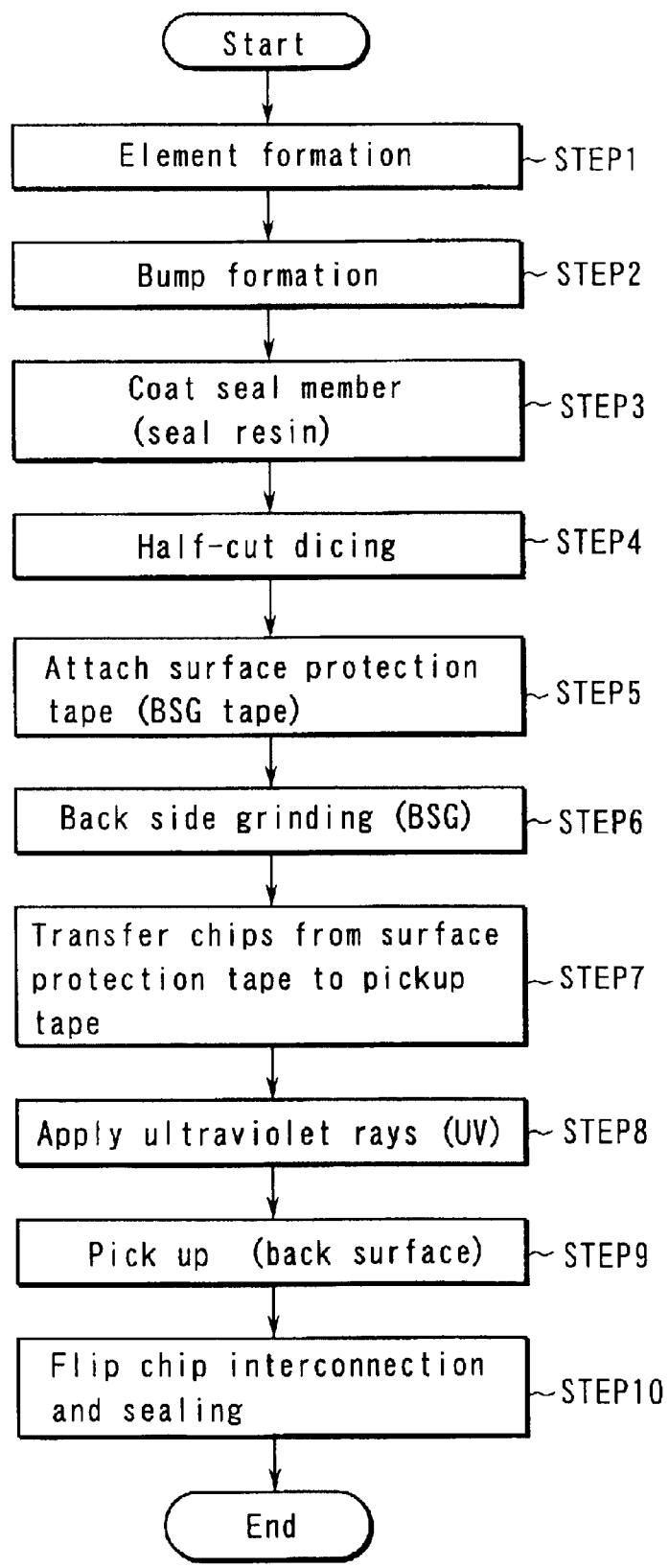
FIG. 60 is a flowchart for illustrating a semiconductor device manufacturing method according to the twenty-ninth embodiment of this invention.

FIGS. 59A to 59I and FIG. 60 illustrate a semiconductor device manufacturing method according to a twenty-ninth embodiment of this invention, FIGS. 59A to 59I being cross sectional views which sequentially show the manufacturing steps and FIG. 60 being a flowchart thereof.

First, various elements are formed on a semiconductor substrate (wafer) by a known process (STEP1).

Next, as shown in FIG. 59A, bumps 2 are formed on the main surface of a wafer 1 on which the elements have been formed (STEP2). In this example, a case wherein stud bumps are formed is explained as an example and the bumps 2 which are electrically connected to the elements by use of capillaries 10 are formed.

After this, as shown in FIG. 59B, the element forming surface side of the wafer 1 is coated with a seal member 3A by, for example, spin-coating liquid resin such as epoxy-series resin or silica-containing resin to bury the bumps 2 therein (STEP3). It is preferable that the seal member 3A is melted at temperatures of approximately 100° C. to 130° C.

Further, the seal member can also be formed by attaching sheet-form resin.

In this state, as shown in FIG. 59C, the seal member 3A is cut and grooves 4 with depths which do not reach the back surface of the wafer 1 are formed on the element forming surface side of the wafer 1 along dicing lines or chip dividing lines by use of a diamond scriber, diamond blade, laser scriber or the like, that is, a so-called half-cut dicing process is performed (STEP4).

After this, as shown in FIG. 59D, a surface protection tape (BSG tape) 5 is attached to the seal member 3A (STEP5) and, as shown in FIG. 59E, a back side grinding process (STEP6) of the wafer 1 is performed by use of a grinder 6 to make the wafer 1 thin, and at the same time, divide the wafer into discrete chips 1' (dicing before grinding).

After the end of grinding, as shown in FIG. 59F, the back surfaces of the discretely divided chips 1' are positioned with respect to and adhered to an ultraviolet (UV) curing pickup tape 9UV mounted on a flat ring 8 and then the surface protection tape 5 is separated. As a result, the chips 1' are transferred from the surface protection tape 5 to the pickup tape 9UV (STEP7).

After this, as shown in FIG. 59G, ultraviolet rays are applied to the pickup tape 9UV to cure the same and lower the viscosity thereof (STEP8).

Next, the flat ring 8 is mounted on a fixed table of a pickup device and the fixed table is moved in an XY direction so as to set a pickup tool to correspond to one of the chips 1' to be picked up. After this, the surface of each chip 1' is monitored to detect the position of each chip 1' and detect a mark used to determine pass/fail, for example.

Then, as shown in FIG. 59H, a vacuum is drawn on the inside of a backup holder 13 of the pickup device to attract and fix the pickup tape 9UV to and on the upper surface of the backup holder 13. In this state, a pin holder 12 having thrust pins 11 mounted thereon is raised so as to cause the thrust pins 11 to project from the upper surface of the backup holder 13. As a result, the back surface side of the chip 1' is pushed up in a direction indicated by an arrow with the pickup tape 9UV disposed between the thrust pins and the chip so that the corner portions of the chip 1' will be separated from the pickup tape 9UV. Then, the chip 1' is picked up by attracting and separating the element forming surface side of the chip 1' by use of a collet (STEP9). At this time, the seal member 3A is pulled off and cut off at a portion corresponding to the groove 4.

After this, as shown in FIG. 59I, the picked-up chip 1' and base board (wiring board) 14 are positioned with respect to each other and put into a reflow furnace to melt the bumps 2. As a result, the bumps 2 of the chip 1' and pads or bumps formed on the base board 14 are bonded together by flip chip interconnection to mount the chip on the base board and the seal member 3A is melted to seal a gap area between the chip 1' and the base board 14 with the seal resin 3. Thus, the resin-sealing and mounting operations by flip chip interconnection are performed at the same time (STEP10).

With the above manufacturing method, since the main surface of the wafer 1 is coated with the seal member 3A after formation of the bumps 2, portions other than the bumps 2 are buried in the seal member and apparent projections of the bumps 2 are eliminated. Therefore, occurrence of breakage of the wafer 1 at the time of back side grinding can be suppressed and a lowering in the manufacturing yield can be suppressed. If the seal member 3A is formed by spin-coating liquid resin, a difference in level due to projections of the bumps 2 can be compensated for irrespective of the height of the bumps and high bumps such as ball bumps or stud bumps can be used. Also, if sheet-form resin is attached, a difference in level can be compensated for by use of two members by attaching the surface protection tape 5 after resin used as the seal member is attached, thereby making it possible to cope with a case wherein bumps higher than the conventional bumps are formed.

Further, since the seal member 3A is formed on the wafer 1 and the half-cut dicing process is performed with the seal member and the wafer integrally formed to simultaneously cut the wafer 1 and seal member 3A so as to form the grooves 4, then there occurs no positional deviation between the chip 1' and the seal member 3A. As a result, the size of the seal member 3A becomes approximately equal to the chip size so as to prevent the seal member 3A from creeping on the back surface of the chip at the time of flip chip interconnection. Therefore, a Teflon sheet or the like which is required in the conventional manufacturing method becomes unnecessary and the manufacturing cost can be lowered.

In addition, since the pickup operation is performed with the chip 1' and the seal member 3A integrally combined, the seal member 3A acts as a reinforcing member for the chip 1'. Therefore, it becomes possible to significantly suppress occurrence of breakage of the chip 1' which may be caused when the thin chip 1' is picked up.

Since the mounting and sealing operations can be simultaneously performed by melting the seal member 3A when the picked-up chip 1' is mounted on the base board 14 by flip chip interconnection, the manufacturing process can be simplified and the manufacturing cost can be lowered.

Further, since the viscosity of the pickup tape 9UV is lowered by applying ultraviolet rays thereto and curing the same, the pickup operation can be easily performed.

Since the bumps 2 are formed in the wafer state, the manufacturing process can be simplified and the manufacturing cost can be lowered in comparison with a manufacturing method in which the bumps 2 are formed after the wafer 1 is divided into discrete chips 1'.

[Thirtieth Embodiment]

Figure 61A:
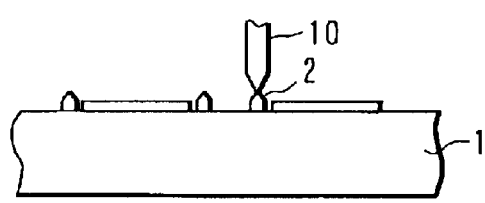
FIGS. 61A to 61J are cross sectional views sequentially showing the manufacturing steps, for illustrating a semiconductor device manufacturing method according to a thirtieth embodiment of this invention.
Figure 61D:
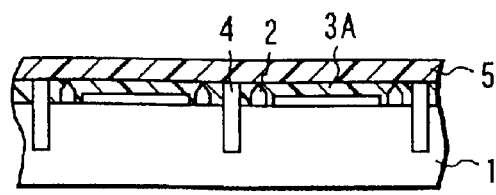
Figure 61B:
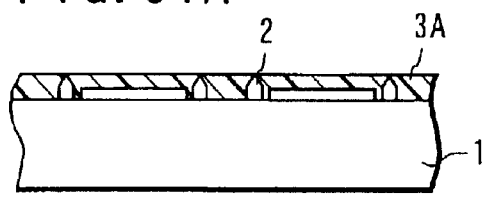
Figure 61E:
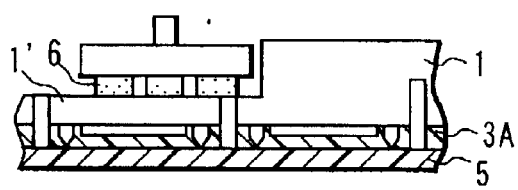
Figure 61C:
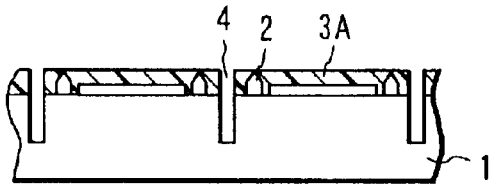
Figure 61F:
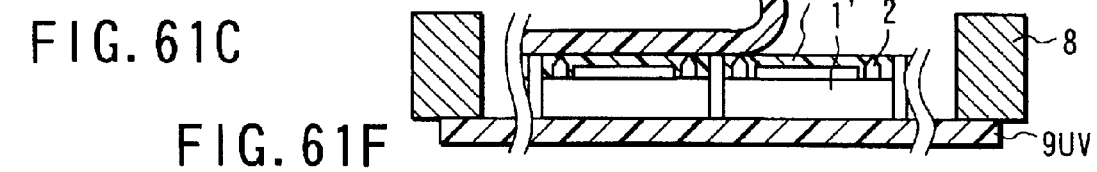
Figure 61G:
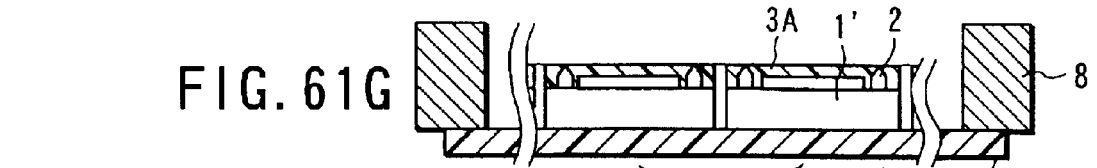
Figure 61H:
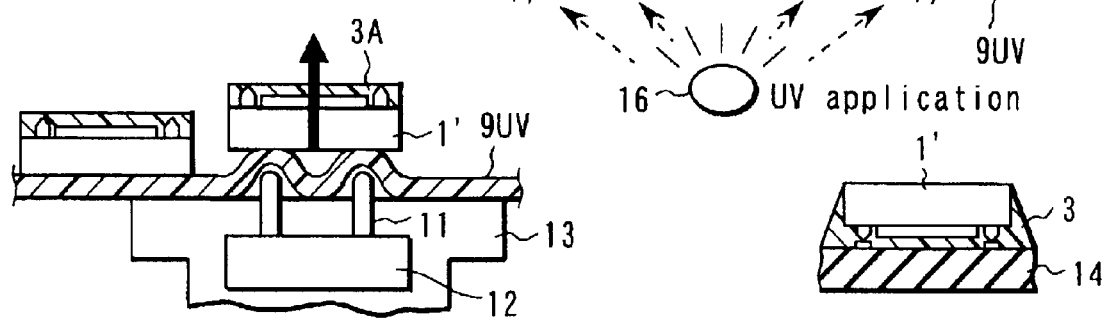
Figure 61I:
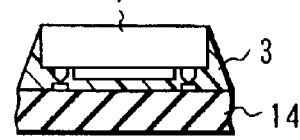
Figure 61J:
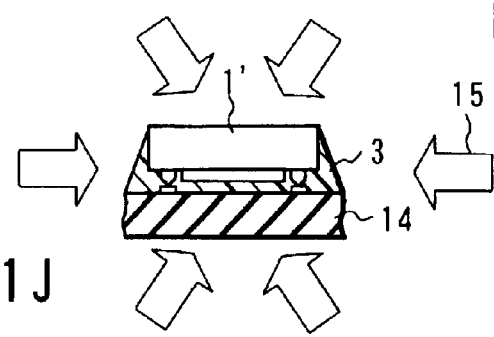
Figure 62:
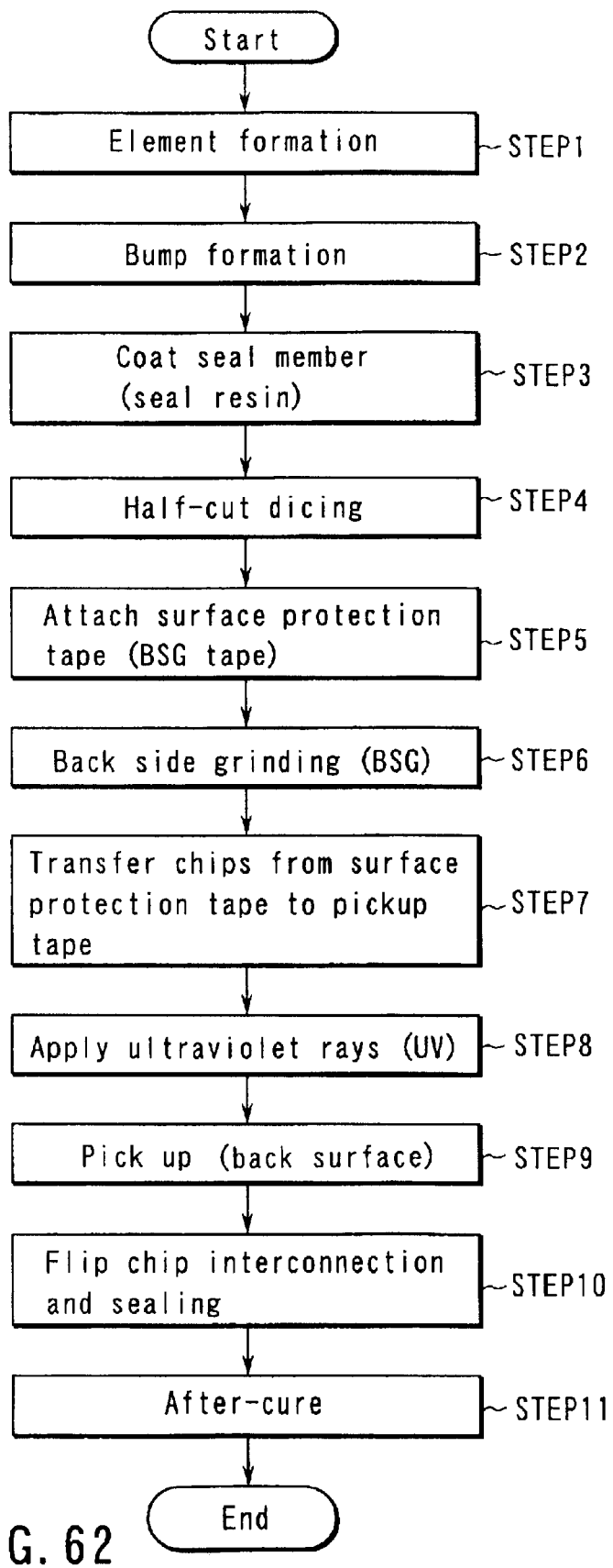
FIG. 62 is a flowchart for illustrating a semiconductor device manufacturing method according to the thirtieth embodiment of this invention.

FIGS. 61A to 61J and FIG. 62 illustrate a semiconductor device manufacturing method according to a thirtieth embodiment of this invention, FIGS. 61A to 61J being cross sectional views which sequentially show the manufacturing steps and FIG. 62 being a flowchart thereof.

The thirtieth embodiment is similar to the twenty-ninth embodiment except that an after-cure step (indicated by an arrow 15) is performed to cure the seal resin 3 (STEP11) as shown in FIG. 61J after the operation of mounting the chip 1' on the base board 14 and the resin-sealing operation are simultaneously performed in the step (STEP10) shown in FIG. 61I.

Since the other steps are the same as those of the twenty-ninth embodiment, the same symbols are attached to like portions and the detailed explanation thereof is omitted.

With the above manufacturing method, substantially the same operation and effect as those of the twenty-ninth embodiment can be attained.

This invention has been made by use of the first to thirtieth embodiments, but this invention is not limited to the above embodiments and can be variously modified without departing from the scope thereof at the time of embodying this invention.

Various modifications of this invention are explained below.

[Modification 1]

It is possible to use an ultraviolet curing tape as the surface protection tape 5 in each of the above embodiments and lower the viscosity of the surface protection tape 5 by applying ultraviolet rays thereto after the back side grinding step of the wafer.

[Modification 2]

In the back side grinding (BSG) step in each of the above embodiments, a method called an in-feed grinding process in which a chuck table used to fix the wafer 1 and a grinding wheel are rotated and the back surface of the wafer 1 is ground while the grinder is being lowered, a method called a through-feed or creep feed process in which the wafer 1 is ground while the wafer 1 and the grinder 6 are being rotated or the like can be used. At this time, if the back surface of the wafer 1 is ground until it reaches the grooves 4, the wafer is divided into discrete chips 1'. Further, if the grinding (and polishing) process is continuously performed even after the wafer is divided into discrete chips 1' and the wafer is ground and polished by at least 5 μm, the following effect can be attained. That is, even if chipping occurs in a portion in which the side wall surface of the groove 4 formed by half-cut dicing intersects with the surface formed by grinding and polishing, the corresponding portion can be removed by the above grinding and polishing process. If the grinding and polishing amount is increased, a larger chipping portion can be removed, but the grinding and polishing amount may be set as required, for example, according to the thickness of the wafer 1 and the thickness of the chip 1' at the time of completion. Thus, the thickness of the chip 1' at the time of completion can be made as thin as 30 to 50 μm, for example.

Further, when the back surface of the wafer 1 is ground until the grooves 4 are reached and the wafer is divided into discrete chips 1', a grinding wheel with one type of grinding particle diameter can be used. However, it is preferable that the grinding process is performed in two or more steps by using grinding wheels of at least two types of grinding particle diameters as will be explained below when a reduction in the grinding time and prevention of occurrence of chipping are both taken into consideration. That is, if the grinding and polishing process is first performed by use of a grinding wheel with a large grinding particle diameter of approximately #360 (the main grinding particle diameter is 40 to 60 μm) and then the grinding and polishing process is performed by use of a grinding wheel with a small grinding particle diameter of approximately #2000 (the main grinding particle diameter is 4 to 6 μm) to divide the wafer into discrete chips 1', time for dividing the wafer 1 into discrete chips 1' can be reduced. Further, since the grinding wheel with the small grinding particle diameter is used when the chip is finally divided, occurrence of chipping can be suppressed.

[Modification 3]

Ultrasonic waves can be applied at the time of flip chip interconnection of the chip 1' on the base board 14 in each of the above embodiments. As a result, they can be more fixedly bonded together.

[Modification 4]

In the step of mounting the chip 1' on the base board 14 in each of the above embodiments, a metal solid-phase diffusion bonding process, metal liquid-phase diffusion bonding process or contact bonding process can be used. As the metal solid-phase diffusion bonding process, for example, an ultrasonic thermo compression bonding process using Au/Au, Au/Cu for the bumps can be used. The ultrasonic thermocompression bonding process can attain high-speed and low-temperature bonding and can be used for a device which requires underfilless.

Further, as the metal liquid-phase diffusion bonding process, C4 connection (Controlled Collapse Chip Connection) using solder/solder for the bumps can be used. The C4 connection is highly reliable in bonding and can attain the surface mount technology (SMT) of the same process.

In addition, as the contact bonding process, a simultaneous sealing-connecting process using Au/Sn—Ag, Au/Sn, Au/Bi or a pressure bonding process using Cu/Sn—Bi can be used. The pressure bonding process is a low-temperature process, can be used for mounting on a glass base board and can attain a narrow pitch.

As described above, according to one aspect of this invention, a semiconductor device manufacturing method which can suppress a lowering in the manufacturing yield due to breakage of the wafer can be provided.

Further, a semiconductor device manufacturing method which can make the wafer thin even for chips using high bumps such as solder bumps can be provided.

In addition, a semiconductor device manufacturing method which can make small the positional deviation between the attaching position of the seal resin on the base board and the attaching position of the chip on the base board (with the seal resin) and enhance the mounting precision can be provided.

A semiconductor device manufacturing method which can make unnecessary a Teflon sheet used to coat the back surface of the chip at the time of flip chip interconnection and lower the manufacturing cost can be provided.

Further, a semiconductor device manufacturing method in which the manufacturing process can be simplified and the manufacturing cost can be lowered can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming stud bumps electrically connected to elements on a main surface of a wafer on which the elements are formed, forming grooves with depths which do not reach the back surface of the wafer in the wafer on the main surface side thereof along dicing lines or chip dividing lines of the wafer, coating a stud bump forming surface side of the wafer with a seal member, performing a back side grinding process for the wafer to make the wafer thin, and at the same time, divide the wafer into individual chips, picking up one of the chips which are discretely divided by said performing the back side grinding process, and heating to melt the stud bumps of the picked-up chip to bond and mount the chip to and on a base board, and at the same time, melting the seal member to seal a gap between the picked-up chip and the base board.

2. The semiconductor device manufacturing method according to claim 1, wherein the seal member is formed by a spin coating method using liquid-form resin.

3. The semiconductor device manufacturing method according to claim 1, wherein the seal member is formed by attaching sheet-form resin.

4. The semiconductor device manufacturing method according to claim 1, further comprising attaching a surface protection tape to the seal member which coats the bump forming surface of the wafer before said performing the back side grinding process for the wafer.

5. The semiconductor device manufacturing method according to claim 1, further comprising attaching an ultraviolet curing surface protection tape to the seal member which coats the bump forming surface of the wafer before said performing the back side grinding process for the wafer, and applying ultraviolet rays to the surface protection tape to lower the viscosity thereof after said performing the back side grinding process for the wafer.

6. The semiconductor device manufacturing method according to claim 1, further comprising attaching a pickup tape to a back surface of each of the discretely divided chips before said picking up.

7. The semiconductor device manufacturing method according to claim 1, further comprising attaching an ultraviolet curing pickup tape to a back surface of each of the discretely divided chips before said picking up, and applying ultraviolet rays to the pickup tape to lower the viscosity thereof.

8. The semiconductor device manufacturing method according to claim 1, wherein said bonding and mounting the bumps of the picked-up chip to and on the base board, and at the same time, melting the seal member for sealing is performed by flip chip interconnection.

9. The semiconductor device manufacturing method according to claim 8, wherein said bonding the bumps to the base board in said flip chip interconnection is performed wile ultrasonic waves are being applied thereto.

10. The semiconductor device manufacturing method according to claim 1, further comprising performing an after-curing process after said bonding and mounting the bumps of the picked-up chip to and on the base board, and at the same time, melting the seal member for sealing.

11. A semiconductor device manufacturing method comprising:
forming grooves with depths which do not reach a back surface of a wafer on which elements are formed in the wafer on a main surface side thereof along dicing lines or chip dividing lines of the wafer,
forming stud bumps electrically connected to the elements on a main surface of the wafer,
coating a stud bump forming surface side of the wafer with a seal member,
performing a back side grinding process for the wafer to make the wafer thin, and at the same time, divide the wafer into individual chips,
picking up one of the chips which are discretely divided by said performing the back side grinding process, and
heating to melt the stud bumps of the picked-up chip to bond and mount the chip to and on a base board, and at the same time, melting the seal member to seal a gap between the picked-up chip and the base board.

12. The semiconductor device manufacturing method according to claim 11, wherein the seal member is formed by a spin coating method using liquid-form resin.

13. The semiconductor device manufacturing method according to claim 11, wherein the seal member is formed by attaching sheet-form resin.

14. The semiconductor device manufacturing method according to claim 11, further comprising attaching a surface protection tape to the seal member which coats the bump forming surface of the wafer before said performing the back side grinding process for the wafer.

15. The semiconductor device manufacturing method according to claim 11, further comprising attaching an ultraviolet curing surface protection tape to the seal member which coats the bump forming surface of the wafer before said performing the back side grinding process for the wafer, and applying ultraviolet rays to the surface protection tape to lower the viscosity thereof after said performing the back side grinding process for the wafer.

16. The semiconductor device manufacturing method according to claim 11, further comprising attaching a pickup tape to a back surface of each of the discretely divided chips before said picking up.

17. The semiconductor device manufacturing method according to claim 11, further comprising attaching an ultraviolet curing pickup tape to a back surface of each of the discretely divided chips before said picking up, and applying ultraviolet rays to the pickup tape to lower the viscosity thereof.

18. The semiconductor device manufacturing method according to claim 11, wherein said bonding and mounting the bumps of the picked-up chip to and on the base board, and at the same time, melting the seal member for sealing is performed by flip chip interconnection.

19. The semiconductor device manufacturing method according to claim 18, wherein said bonding the bumps to the base board in said flip chip interconnection is performed wile ultrasonic waves are being applied thereto.

20. The semiconductor device manufacturing method according to claim 11, further comprising performing an after-curing process after said bonding and mounting the bumps of the picked-up chip to and on the base board, and at the same time, melting the seal member for sealing.

21. A semiconductor device manufacturing method comprising:
forming stud bumps electrically connected to elements on a main surface of a wafer on which the elements are formed,
coating a stud bump forming surface side of the wafer with a seal member,
cutting the seal member and forming grooves with depths which do not reach the back surface of the wafer along dicing lines or chip dividing lines of the wafer,
performing a back side grinding process for the wafer to make the wafer thin, and at the same time, divide the wafer into individual chips,
picking up one of the chips which are discretely divided by said performing the back side grinding process, and
heating to melt the stud bumps of the picked-up chip to bond and mount the chip to and on a base board, and at the same time, melting the seal member to seal a gap between the picked-up chip and the base board.

22. The semiconductor device manufacturing method according to claim 21, wherein the seal member is formed by a spin coating method using liquid-form resin.

23. The semiconductor device manufacturing method according to claim 21, wherein the seal member is formed by attaching sheet-form resin.

24. The semiconductor device manufacturing method according to claim 21, further comprising attaching a surface protection tape to the seal member which coats the bump forming surface of the wafer before said performing the back side grinding process for the wafer.

25. The semiconductor device manufacturing method according to claim 21, further comprising attaching an ultraviolet curing surface protection tape to the seal member which coats the bump forming surface of the wafer before said performing the back side grinding process for the wafer, and applying ultraviolet rays to the surface protection tape to lower the viscosity thereof after said performing the back side grinding process for the wafer.

26. The semiconductor device manufacturing method according to claim 21, further comprising attaching a pickup tape to a back surface of each of the discretely divided chips before said picking up.

27. The semiconductor device manufacturing method according to claim 21, further comprising attaching an ultraviolet curing pickup tape to a back surface of each of the discretely divided chips before said picking up, and applying ultraviolet rays to the pickup tape to lower the viscosity thereof.

28. The semiconductor device manufacturing method according to claim 21, wherein said bonding and mounting the bumps of the picked-up chip to and on the base board, and at the same time, melting the seal member for sealing is performed by flip chip interconnection.

29. The semiconductor device manufacturing method according to claim 28, wherein said bonding the bumps to the base board in said flip chip interconnection is performed wile ultrasonic waves are being applied thereto.

30. The semiconductor device manufacturing method according to claim 21, further comprising performing an after-curing process after said bonding and mounting the bumps of the picked-up chip to and on the base board, and at the same time, melting the seal member for sealing.

* * * * *

UNITED STATES PATENT AND TRADEMARK OFFICE
CERTIFICATE OF CORRECTION

PATENT NO. : 6,777,313 B2  
DATED : August 17, 2004  
INVENTOR(S) : Takyu et al.

Page 1 of 1

It is certified that error appears in the above-identified patent and that said Letters Patent is hereby corrected as shown below:

Column 39,  
Line 36, change "wile" to -- while --.

Column 40,  
Line 32, change "wile" to -- while --.

Column 42,  
Line 11, change "wile" to -- while --.

Signed and Sealed this

Fifth Day of April, 2005

JON W. DUDAS  
*Director of the United States Patent and Trademark Office*